US012813258B2

(12) United States Patent
Lee et al.

(10) Patent No.: US 12,813,258 B2
(45) Date of Patent: Nov. 24, 2026

(54) SEMICONDUCTOR DEVICE INCLUDING DATA STORAGE STRUCTURES

(71) Applicant: SAMSUNG ELECTRONICS CO., LTD., Suwon-si (KR)

(72) Inventors: Kiseok Lee, Suwon-si (KR); Hanjin Lim, Suwon-si (KR); Jinwoo Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 257 days.

(21) Appl. No.: 18/673,201

(22) Filed: May 23, 2024

(65) Prior Publication Data

US 2024/0404947 A1 Dec. 5, 2024

(30) Foreign Application Priority Data

Jun. 1, 2023 (KR) ........................ 10-2023-0071068

(51) Int. Cl.

| | |
|---|---|
| ***H10W 20/41*** | (2026.01) |
| ***H10B 12/00*** | (2023.01) |
| ***H10W 20/43*** | (2026.01) |

(52) U.S. Cl.

CPC ........ *H10W 20/435* (2026.01); *H10B 12/312* (2023.02); *H10B 12/482* (2023.02); *H10B 12/485* (2023.02); *H10B 12/488* (2023.02); *H10B 12/50* (2023.02); *H10W 20/43* (2026.01)

(58) Field of Classification Search

CPC ................ H10W 20/435; H10W 20/43; H10B 12/312; H10B 12/482; H10B 12/485; H10B 12/488; H10B 12/50

See application file for complete search history.

(56) References Cited

U.S. PATENT DOCUMENTS

| | | | |
|---|---|---|---|
| 11,335,687 | B2 | 5/2022 | Lee |
| 11,417,659 | B2 | 8/2022 | Son |
| 2022/0013524 | A1 | 1/2022 | Ryu et al. |
| 2022/0059151 | A1 | 2/2022 | Vimercati |

(Continued)

FOREIGN PATENT DOCUMENTS

KR 10-2022-0110983 A 8/2022

OTHER PUBLICATIONS

Office Action in Korean Appln. No. 10-2023-0071068, mailed on Sep. 10, 2026, 12 pages (with English translation).

*Primary Examiner* — Samuel A Gebremariam

(74) *Attorney, Agent, or Firm* — Fish & Richardson P.C.

(57) ABSTRACT

A semiconductor device includes: cell transistors stacked in a first direction perpendicular to an upper surface of a base, wherein each cell transistor includes a first source/drain region, a second source/drain region, and a gate electrode, a bit line extending in the first direction and electrically connected to the first source/drain regions; and data storage structures electrically connected to the second source/drain regions, wherein each gate electrode has a line shape extending in a second direction parallel to the upper surface, each data storage structure includes a first electrode, a second electrode, and a dielectric layer between the first and second electrodes, wherein the first electrodes are electrically connected to the second source/drain regions, wherein the second electrodes are stacked and spaced apart from each other in the first direction, and wherein each second electrode includes a line portion having a line shape extending in the second direction.

20 Claims, 69 Drawing Sheets

I-I'

'B'

(56) References Cited

U.S. PATENT DOCUMENTS

| | | | |
|---|---|---|---|
| 2022/0093626 | A1 | 3/2022 | Shin et al. |
| 2022/0139916 | A1 | 5/2022 | Kwak |
| 2022/0173106 | A1 | 6/2022 | Choi et al. |
| 2022/0223602 | A1 | 7/2022 | Saeedi Vahdat et al. |
| 2023/0397430 | A1 | 12/2023 | Lee et al. |

V-V'

V-V'

500c

I–I'

I–I'

SEMICONDUCTOR DEVICE INCLUDING DATA STORAGE STRUCTURES

CROSS-REFERENCE TO RELATED APPLICATION(S)

This application claims benefit of priority to Korean Patent Application No. 10-2023-0071068 filed on Jun. 1, 2023, in the Korean Intellectual Property Office, the disclosure of which is incorporated herein by reference in its entirety.

BACKGROUND

Semiconductor devices for storing high-capacity data are in demand in electronic systems requiring data storage. Accordingly, a method of increasing data storage capacity of a semiconductor device has been studied. For example, one method of increasing data storage capacity of a semiconductor device includes a semiconductor device including three-dimensionally arranged memory cells instead of two-dimensionally arranged memory cells.

SUMMARY

The present disclosure is directed to semiconductor devices including cell transistors and data storage structures arranged three-dimensionally to increase integration density, as well as to methods of manufacturing the semiconductor devices.

In general, in some innovative aspects, the subject matter described in this specification can be embodied in a semiconductor devices that include cell transistors stacked and spaced apart from each other in a first direction perpendicular to an upper surface of a base on the base, wherein each of the cell transistors includes a first source/drain region, a second source/drain region, and a gate electrode, a bit line extending in the first direction on the base and electrically connected to the first source/drain regions of the cell transistors; and data storage structures electrically connected to the second source/drain regions of the cell transistors on the base, wherein each of the gate electrodes of the cell transistors has a line shape extending in a second direction parallel to the upper surface of the base, wherein each of the data storage structures includes a first electrode, a second electrode, and a dielectric layer between the first electrode and the second electrode, wherein the first electrodes of the data storage structures are electrically connected to the second source/drain regions of the cell transistors, wherein the second electrodes of the data storage structures are stacked and spaced apart from each other in the first direction, and wherein each of the second electrodes of the data storage structures includes a line portion having a line shape extending in the second direction.

In general, in some other aspects, the subject matter of the present disclosure can be embodied in a semiconductor device that includes: word lines stacked and spaced apart from each other in a first direction, wherein each of the word lines extends in a second direction perpendicular to the first direction; active layers stacked and spaced apart from each other in the first direction, wherein each of the active layers includes a channel region vertically overlapping the word lines; a bit line extending in the first direction and connected to first sides of the active layers; and data storage structures stacked and spaced apart from each other in the first direction and connected to second sides of the active layers, wherein the active layers are disposed between the bit line and the data storage structures, wherein each of the data storage structures includes a first electrode, a second electrode spaced apart from the first electrode, and a dielectric layer between the first electrode and the second electrode, wherein the first electrodes of the data storage structures are connected to the second sides of the active layers, and wherein the second electrodes of the data storage structures are stacked and spaced apart from each other in the first direction.

In general, in some other aspects, the subject matter of the present disclosure can be embodied in a semiconductor device that includes: a peripheral circuit structure including a peripheral circuit; a first stack structure and a second stack structure vertically overlapping the peripheral circuit structure and parallel to each other; and insulating separation pattern between the first stack structure and the second stack structure, wherein each of the first and second stack structures includes word lines, active layers, bit lines, and data storage structures, wherein the word lines are stacked and spaced apart from each other in a first direction perpendicular to an upper surface of the peripheral circuit structure, wherein the active layers are stacked and spaced apart from each other in the first direction, and including channel regions overlapping vertically the word lines, wherein each of the bit lines extends in the first direction and is connected to first sides of the active layers, wherein the data storage structure includes first electrodes connected to second sides of the active layers, second electrodes spaced apart from the first electrodes, and a dielectric layer between the first electrodes and the second electrodes, wherein the second electrodes are stacked and spaced apart from each other in the first direction, and wherein the second electrodes of the first stack structure and the second electrodes of the second stack structure are in contact with the insulating separation pattern.

DETAILED DESCRIPTION

Figure 1:
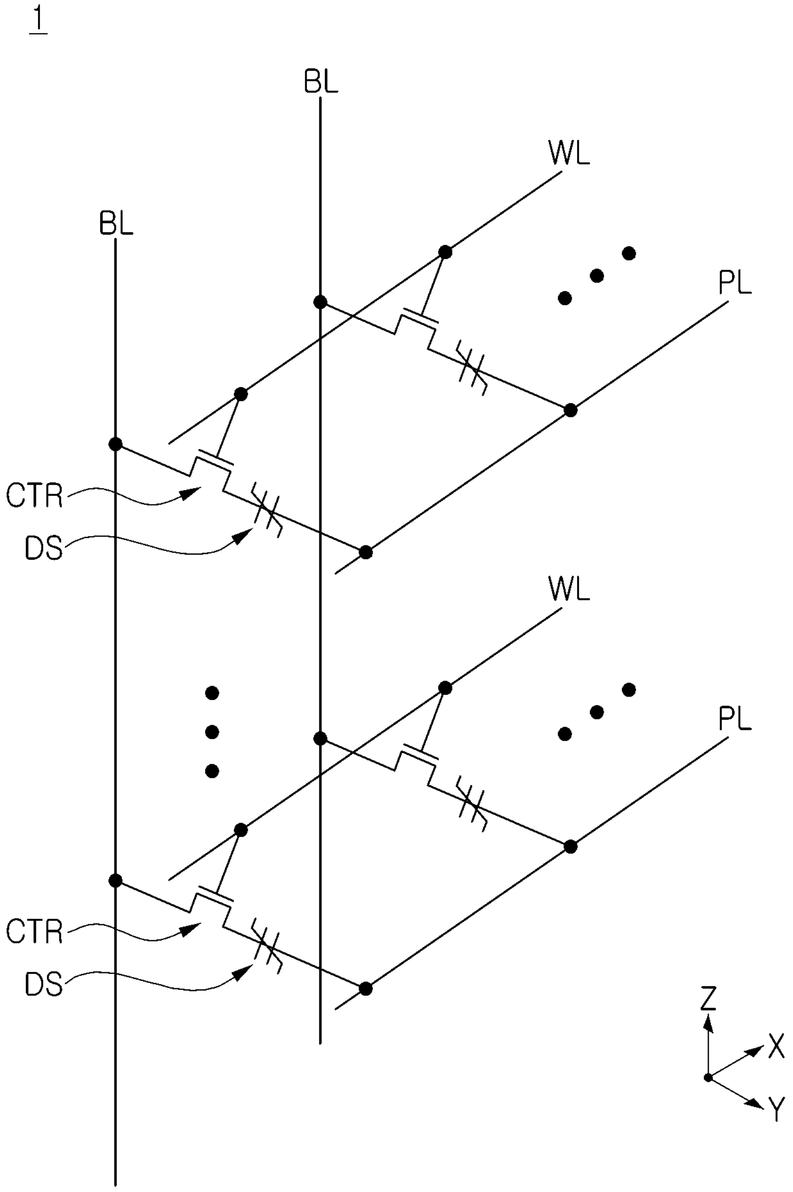
FIG. 1 is a circuit diagram illustrating an example of a semiconductor device.

First, referring to FIG. 1, an example of a semiconductor device 1 includes cell transistors CTR, data storage structures DS, bit lines BL, word lines WL and electrode lines PL.

The cell transistors CTR may be three-dimensionally arranged in the Z-direction and the X-direction. The cell transistors CTR may be configured as MOS transistors. Each of the cell transistors CTR may include a first source/drain region, a second source/drain region, and a gate electrode. In the implementations illustrated herein, the phrase "source/drain region" may be understood to mean a source region or a drain region of a transistor.

The data storage structures DS may be three-dimensionally arranged in the Z-direction and the X-direction.

The word lines WL may be stacked and spaced apart from each other in the Z-direction. Each of the word lines WL may extend in the X-direction. The word lines WL may form the gate electrodes of the cell transistors CTR.

The electrode lines PL may be stacked and spaced apart from each other in the Z-direction. Each of the electrode lines PL may extend in the X-direction. Each of the data storage structures DS may be configured as a capacitor structure including a first electrode, a second electrode, and a dielectric layer between the first electrode and the second electrode. The electrode lines PL may form the second electrodes of the data storage structures DS.

Among the cell transistors CTR and the data storage structures DS, the cell transistor CTR and the data storage structure DS adjacent to each other may be electrically connected to each other and may form a memory cell.

The cell transistor CTR and the data storage structure DS electrically connected to each other may be disposed between the bit line BL and the electrode line PL. The cell transistor CTR and the data storage structure DS electrically connected to each other may be disposed in order in a Y-direction from the bit line BL to the electrode line PL.

In some implementations, the Z-direction is referred to as a first direction or a vertical direction.

In some implementations, the X-direction is perpendicular to the Z-direction and may be referred to as a second direction or a first horizontal direction.

In some implementations, the Y-direction is perpendicular to the Z-direction and the X-direction and may be referred to as a third direction or a second horizontal direction.

An example of the semiconductor device 1 will be described with reference to FIGS. 2 to 9B.

Referring to FIGS. 1 and 2 to 9B, the example semiconductor device 1 includes a first stack structure ST1 and a second stack structure ST2 spaced apart from each other.

Each of the first and second stack structures ST1 and ST2 may include gate electrodes 48, active layers 36, bit lines BL, and data storage structures DS.

Each of the gate electrodes 48 may be stacked and spaced apart from each other in the Z-direction. Each of the gate electrodes 48 may extend in the X-direction.

The gate electrodes 48 may include a lower gate electrode 48L, an upper gate electrode 48U on the lower gate electrode 48L, and intermediate gate electrodes 48M between the lower gate electrode 48L and the upper gate electrode 48U.

A plurality of the gate electrodes 48 may be word lines WL. For example, a plurality of the intermediate gate electrodes 48M may be word lines WL. The upper gate electrode 48U may be an electrically isolated dummy gate electrode.

In some implementations, the gate electrodes 48 are referred to as word lines.

Each of the gate electrodes 48 may include doped polysilicon, metal, conductive metal nitride, metal-semiconductor compound, conductive metal oxide, conductive graphene, carbon nanotube, or a combination thereof. For example, each of the gate electrodes 48 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotube, or a combination thereof, but are not limited thereto. Each of the gate electrodes 48 may include a single layer or multiple layers formed of the aforementioned materials.

The active layers 36 may be stacked and spaced apart from each other in the Z-direction. Each of the active layers 36 may include a channel region CH vertically overlapping and adjacent to the gate electrodes 48.

Each of the active layers 36 may further include a first source/drain region SD1 and a second source/drain region SD2. In each of the active layers 36, the channel region CH may be disposed between the first source/drain region SD1 and the second source/drain region SD2. The first source/drain region SD1, the channel region CH, and the second source/drain region SD2 may be disposed along the Y-direction.

Each of the active layers 36 may have a bar shape extending in the Y-direction.

Each of the active layers 36 may have a first side and a second side opposing each other in the Y-direction. Here, the first side may be referred to as the first source/drain region SD1, and the second side may be referred to as the second source/drain region SD2.

The active layers 36 may include a material used as a channel region of a transistor, for example, a semiconductor material. For example, each of the active layers 36 may be formed of a semiconductor material such as silicon (Si) or silicon germanium (SiGe). For example, each of the active layers 36 may be formed of single crystal silicon or polysilicon. However, each of the active layers 36 is not limited to a semiconductor material such as silicon and may be formed of other semiconductor materials used as a channel region of a transistor. For example, each of the active layers 36 may include an oxide semiconductor layer or a two-dimensional material layer which may be used as a channel region of a transistor.

The oxide semiconductor layer may be indium gallium zinc oxide (IGZO). However, examples thereof are not limited thereto. The oxide semiconductor layer may include at least one of indium tungsten oxide (IWO), indium tin gallium oxide (ITGO), indium aluminum zinc oxide (IAZO), indium gallium oxide (IGO), indium tin zinc oxide (ITZO), zinc tin oxide (ZTO), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and indium gallium silicon oxide (InGaSiO).

The two-dimensional material layer may include semiconductor graphene, semiconductor carbon nanotubes, or a combination thereof.

Each of the bit lines BL may extend in the Z-direction, and the bit lines BL may be spaced apart from each other in the X-direction.

Each of the bit lines BL may include doped polysilicon, metal, conductive metal nitride, metal-semiconductor compound, conductive metal oxide, conductive graphene, carbon nanotube, or a combination thereof. For example, each of the bit lines BL is doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotube, or a combination thereof, but examples thereof are not limited thereto. Each of the bit lines BL may include a single layer or multiple layers of the aforementioned materials.

Each of the bit lines BL may include a vertical portion BLV extending in the Z-direction, and extension portions BLP extending from the vertical portion BLV and electrically connected to the first sides of the active layers 36, that is, the first source/drain regions SD1. The extension portions BLP may be in contact with the first source/drain regions SD1 of the active layers 36.

The data storage structures DS may be stacked and spaced apart from each other in the Z-direction. The data storage structures DS may be electrically connected to the second sides of the active layers 36, that is, the second source/drain regions SD2. The active layers 36 may be disposed between the bit lines BL and the data storage structures DS.

Each of the data storage structures DS may include a first electrode 75, a second electrode 79, and a dielectric layer 77 between the first electrode 75 and the second electrode 79.

The first electrodes 75 may be connected to the second sides of the active layers 36, that is, the second source/drain regions SD2. The first electrodes 75 may be in contact with the second source/drain regions SD2.

Each of the second electrodes 79 may include a line portion 79L extending in the X-direction. Each of the second electrodes 79 may further include a protrusion 79P extending from the line portion 79L toward the bit lines BL.

In each of the second electrodes 79, a thickness of the line portion 79L may be greater than that of the protrusion 79P. Here, the thickness may refer to the thickness in the Z-direction.

The line portions 79L may be the electrode lines PL described with reference to FIG. 1. Accordingly, the line portions 79L may also be referred to as electrode lines PL.

In the first electrode 75 and the second electrode 79 adjacent to each other among the first electrodes 75 and the second electrodes 79, the first electrode 75 may cover a side surface, a lower surface and an upper surface of the protrusion 79P of the second electrode 79.

Each of the first electrodes 75 may include doped polysilicon, doped germanium, doped silicon germanium, a conductive metal nitride, a metal-semiconductor compound, a conductive metal oxide, or combinations thereof. For example, each of the first electrodes 75 may include doped polysilicon, doped germanium, doped silicon germanium, Al, Cu, Ti, Ta, Ru, W, Mo, Pt, Ni, Co, TiN, CrN, HfN, TaN, WN, NbN, TiAl, TiAlN, TiSi, TiSiN, TaSi, TaSiN, RuTiN, NiSi, CoSi, IrOx, RuOx, or combinations thereof, but examples thereof are not limited thereto. Each of the first electrodes 75 may include a single layer or multiple layers formed of the materials described above.

Each of the second electrodes 79 may include doped polysilicon, doped germanium, doped silicon germanium, a conductive metal nitride, a metal-semiconductor compound, a conductive metal oxide, or combinations thereof. For example, each of the second electrodes 79 may include doped polysilicon, doped germanium, doped silicon germanium, Al, Cu, Ti, Ta, Ru, W, Mo, Pt, Ni, Co, TiN, CrN, HfN, TaN, WN, NbN, TiAl, TiAlN, TiSi, TiSiN, TaSi, TaSiN, RuTiN, NiSi, CoSi, IrOx, RuOx, or combinations thereof, but examples thereof are not limited thereto. Each of the second electrodes 79 may include a single layer or multiple layers formed of the materials described above.

The dielectric layer 77 of the data storage structure DS may include at least one of a paraelectric material (PE material), a ferroelectric material (FE material), or an anti-ferroelectric material (AFE material).

The PE material may include a high dielectric material having a dielectric constant greater than that of silicon oxide. The high dielectric material may include at least one of $BeO_2$, $MaO_2$, $CaO_2$, $SrO_2$, $Al_2O_3$, $Y_2O_3$, $Sc_2O_3$, $La_2O_3$, $HfO_2$, $ZrO_2$, $TiO_2$, $Ta_2O_5$, $Nb_2O_2$, $V_2O_2$, $SrTiO_2$, or $BaSrTiO_2$.

The FE material may include at least one of a perovskite material such as $BaTiO_x$, a Hf-based fluorite material, or a $Hf_xZr_{1-x}O_y$ material. The FE material may further include at least one doping element selected from among Al, Ba, Si, Y, Sc, and Sr. The FE material may further include a La-based rare earth element.

The AFE material may include at least one of $ZrO_2$, $Hf_xZr_{1-x}O_y$, $PbZrO_3$, or $NaNbO_3$. The AFE material may further include at least one doping element selected from among Al, Ba, Si, Y, Sc, and Sr. The AFE material may further include a La-based rare earth element.

In an example, the data storage structures DS may be configured as a capacitor structure for storing data in a volatile memory such as a DRAM.

In another example, the data storage structures DS may be configured as a capacitor structure for storing data in a non-volatile memory. For example, the data storage structures DS may be configured as a capacitor structure for storing data in ferroelectric memory (FeRAM). For example, in the data storage structures DS, at least a portion of the dielectric layer 77 may include the FE material. For example, the dielectric layer 77 may include the FE material, a combination of the FE material and the PE material, or a combination of the FE material and the AFE material.

The semiconductor device 1 may further include a base 3 having a memory cell array region MCA and a staircase region SA. The base 3 may include an insulating structure or a peripheral circuit structure including a peripheral circuit. The base 3 may also be referred to as a substrate.

The staircase region SA may be disposed on one side of the memory cell array region MCA, but examples thereof are not limited thereto. For example, the staircase region SA may be disposed on both sides of the memory cell array region MCA.

The gate electrodes 48, the active layers 36, the bit lines BL, and the data storage structures DS may be disposed on the base 3.

The Z-direction may be a direction perpendicular to an upper surface of the base 3.

The X-direction and the Y-direction perpendicular to each other may be directions parallel to the upper surface of the base 3.

The active layers 36 and the bit lines BL may be disposed on the memory cell array region MCA.

The gate electrodes 48 may be disposed on the memory cell array region MCA and may extend to the staircase region SA.

The gate electrodes 48 may have gate pad regions PADa arranged in a staircase shape on the staircase region SA. When the staircase region SA is disposed on both sides of the memory cell array region MCA, an odd-numbered gate electrode among the gate electrodes 48 may have gate pad regions PADa arranged in a staircase shape in staircase region SA arranged on one side of the memory cell array region MCA, and an even-numbered gate electrode among the gate electrodes 48 may have gate pad regions PADa arranged in a staircase shape in staircase region SA disposed on the other side of the memory cell array region MCA.

When the upper gate electrode 48U of the gate electrodes 48 is a dummy gate electrode, the dummy gate electrode may not have a gate pad region, and the lower and intermediate gate electrodes 48L and 48M may have the gate pad regions PADa.

A thickness of each of the gate pad regions PADa may be greater than a thickness of each of the gate electrodes 48 on the memory cell array region MCA. For example, among the gate electrodes 48, portions of the gate electrodes 48 vertically overlapping the active layers 36 may have a first thickness, and the gate pad regions PADa may have a second thickness greater than the first thickness.

The second electrodes 79 may have electrode pad regions PADb arranged in a staircase shape on the staircase region SA. When the staircase region SA is disposed on both sides of the memory cell array region MCA, an odd-numbered second electrode among the second electrodes 79 may have electrode pad regions PADb arranged in a staircase shape in staircase region SA disposed on one side of the memory cell array region MCA, and an even-numbered second electrode among the second electrodes 79 may have electrode pad regions PADb arranged in a staircase shape in staircase region SA disposed on the other side of the memory cell array region MCA.

A thickness of each of the electrode pad regions PADb on the staircase region SA may be greater than a thickness of each of the second electrodes 79 on the memory cell array region MCA.

On the memory cell array region MCA, each of the first and second stack structures ST1 and ST2 may further include cell interlayer insulating layers 33. On the staircase region SA, each of the first and second stack structures ST1 and ST2 may further include staircase interlayer insulating layers 6.

As for the cell interlayer insulating layers 33 and the staircase interlayer insulating layers 6, the terms "cell" and "staircase" may be used to distinguish the interlayer insulating layers 33 and 6 from each other and may be replaced with other terms. For example, the cell interlayer insulating layers 33 may be referred to as a first interlayer insulating layer, and the staircase interlayer insulating layers 6 may be referred to as a second interlayer insulating layer.

The cell interlayer insulating layers 33 may be stacked and spaced apart from each other in the Z-direction. The cell interlayer insulating layers 33 may be formed of an insulating material such as silicon oxide. An intermediate gate electrode 48M and a data storage structure DS may be disposed between the cell interlayer insulating layers 33 adjacent to each other in the Z-direction. Each of the cell interlayer insulating layers 33 may include an extension portion 33*e* extending to a region between the data storage structures DS from a portion disposed between the gate electrodes 48.

A lowermost layer of the gate electrodes 48 and the cell interlayer insulating layers 33 may be a first interlayer insulating layer. The upper gate electrode 48U may be disposed on an uppermost interlayer insulating layer among the cell interlayer insulating layers 33.

Among the data storage structures DS, an uppermost data storage structure disposed at least in part at the same level as the upper gate electrode 48U may be a dummy data storage structure.

The staircase interlayer insulating layers 6 may be stacked and spaced apart from each other in the Z-direction. The staircase interlayer insulating layers 6 may be formed of an insulating material such as silicon oxide. A structure including the gate electrodes 48 and the second electrodes 79 of the data storage structure DS and the staircase interlayer insulating layers 6 may be alternately stacked in the Z-direction.

An intermediate gate electrode 48M and a data storage structure DS may be disposed between the staircase interlayer insulating layers 6 adjacent to each other in the Z-direction. Each of the cell interlayer insulating layers 33 may include an extension portion 33*e* extending to a region between the data storage structures DS from a portion disposed between the gate electrodes 48.

Figure 4A:
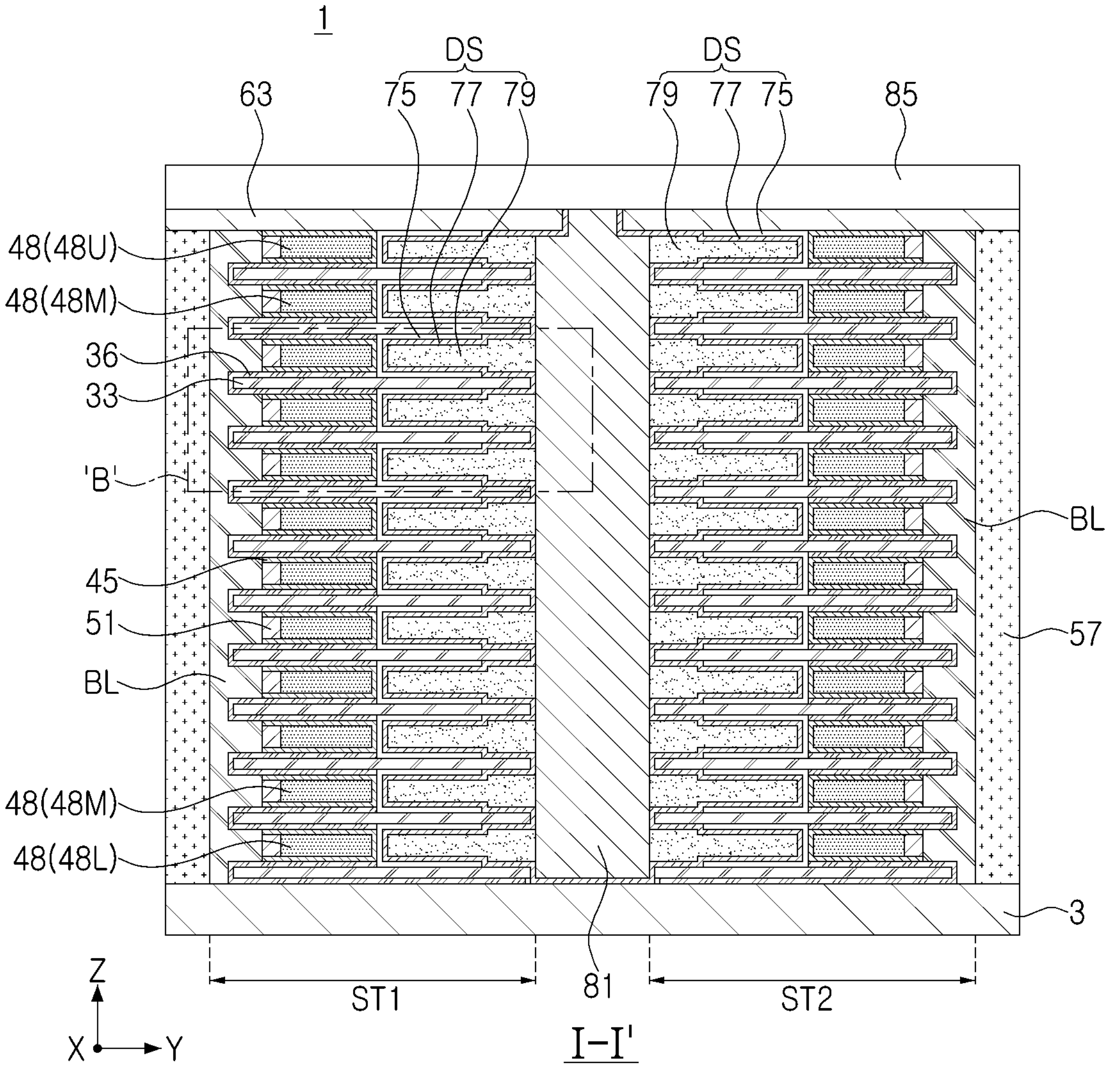
FIG. 4A is a cross-sectional diagram illustrating a region taken along line I-I' in FIG. 2.
Figure 4B:
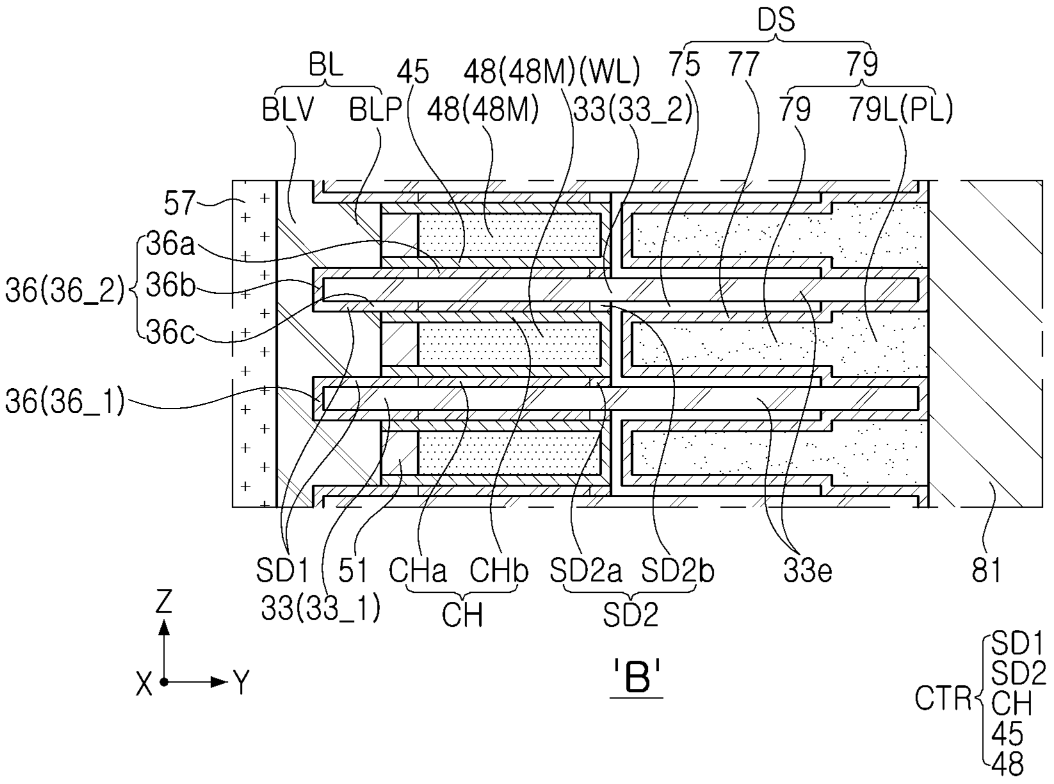
FIG. 4B is an enlarged diagram illustrating region "B" in FIG. 4A.

In the cross-sectional structure as in FIG. 4B, when viewed from a center of one intermediate gate electrode 48M, which may be the word line WL, the active layers 36 may include a first active layer 36_1 disposed below a lower surface of the word line WL and a second active layer 36_2 disposed on an upper surface of the word line WL. The first active layer 36_1 and the second active layer 36_2 may be spaced apart from each other in the Z-direction. The cell interlayer insulating layers 33 may include a first interlayer insulating layer 33_1 below a lower surface of the word line WL and a second interlayer insulating layer 33_2 on an upper surface of the word line WL. The first active layer 36_1 may cover lower and upper surfaces of the first interlayer insulating layer 33_1 and may extend to a region between the bit line BL and a side surface of the first interlayer insulating layer 33_1. The second active layer 36_2 may cover lower and upper surfaces of the second interlayer insulating layer 33_2 and may extend to a region between the bit line BL and a side surface of the second interlayer insulating layer 33_2. Each of the active layers 36 may include a first active portion 36*a*, a second active portion 36*c*, and a connection portion 36*b* extending from the first and second active portions 36_a_ and 36_c_ and connecting the first and second active portions 36_a_ and 36_c_ to each other. For example, in the second active layer 36_2, the first active portion 36_a_ may cover the upper surface of the second interlayer insulating layer 33_2, the second active portion 36_c_ may cover the lower surface of the second interlayer insulating layer 33_2, and the connection portion 36_b_ may extend from the first and second active portions 36_a_ and 36_c_, may connect the first and second active portions 36_a_ and 36_c_ to each other, and may be disposed between the bit line BL and the second interlayer insulating layer 33_2.

The channel region CHa of the first active layer 36_1 and the channel region CHb of the second active layer 36_2 may form a channel region CH. The first source/drain region SD1 of the first active layer 36_1 and the first source/drain region SD1 of the second active layer 36_2 may form a first source/drain region SD1. The second source/drain region SD2 of the first active layer 36_1 and the second source/drain region SD2 of the second active layer 36_2 may form a second source/drain region SD2.

In the bit lines BL, the extension portions BLP may vertically overlap the cell interlayer insulating layers 33, and the vertical portions BLV may extend from the extension portions BLP and may cover side surfaces of the cell interlayer insulating layers 33. The connection portions 36_b_ of the active layers 36 may be disposed between the vertical portions BLV and side surfaces of the cell interlayer insulating layers 33.

Each of the first and second stack structures ST1 and ST2 may further include gate dielectric layers 45. For example, the gate dielectric layers 45 may include a portion interposed between the active layers 36 and the gate electrodes 48. Each of the gate dielectric layers 45 may cover upper and lower surfaces of each of the gate electrodes 48 and may extend to a region between the gate electrodes 48 and the data storage structures DS. For example, one of the gate dielectric layers 45 may include a portion interposed between the word line WL and the first active layer 36_1, a portion interposed between the word line WL and the second active layer 36_2, and a portion interposed between the word line WL and the first electrode 75 of the data storage structure DS. The gate dielectric layers 45 may include at least one of silicon oxide and high-k dielectric.

Figure 5A:
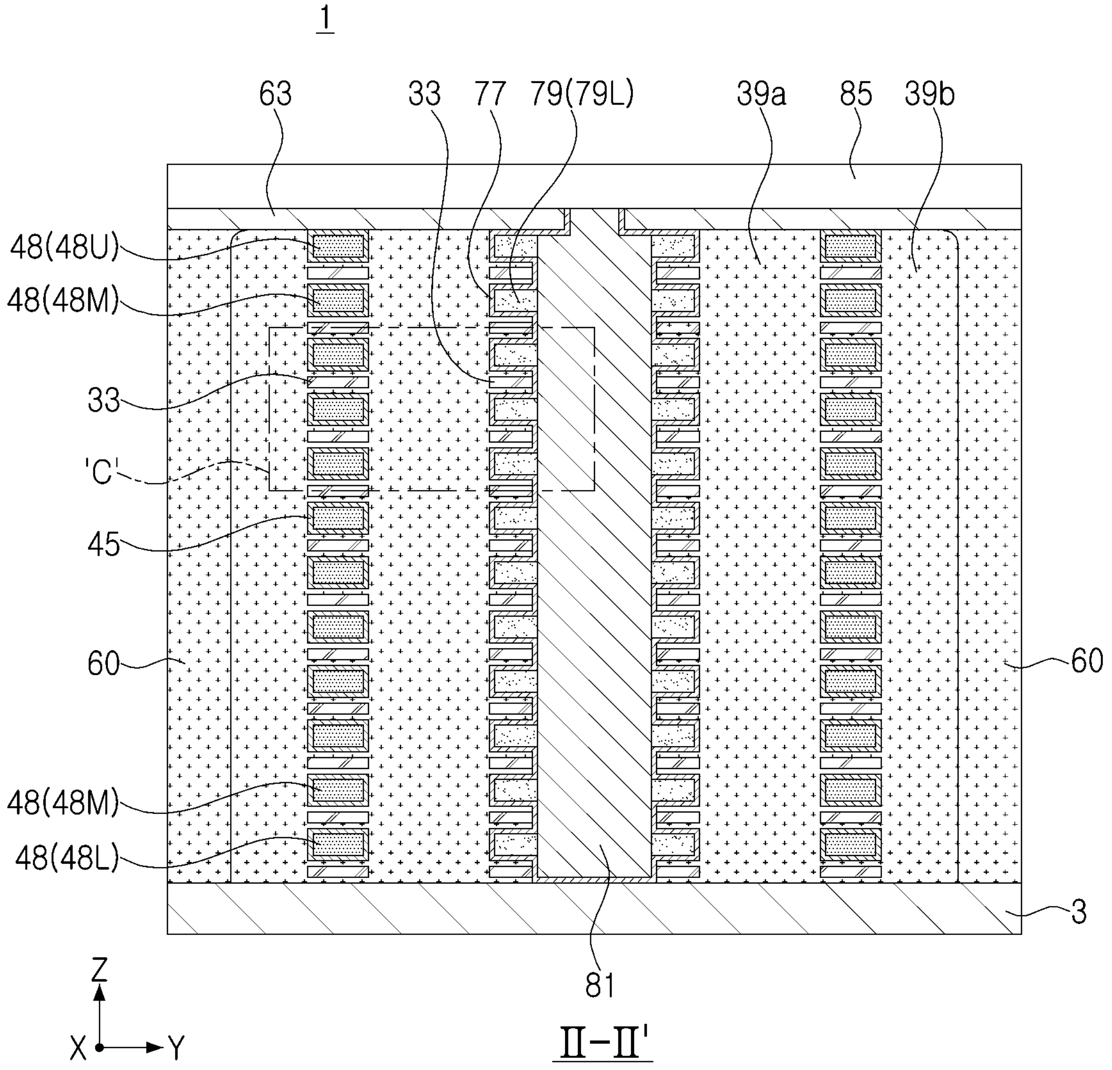
FIG. 5A is a cross-sectional diagram illustrating a region taken along the line II-II' in FIG. 2.
Figure 5B:
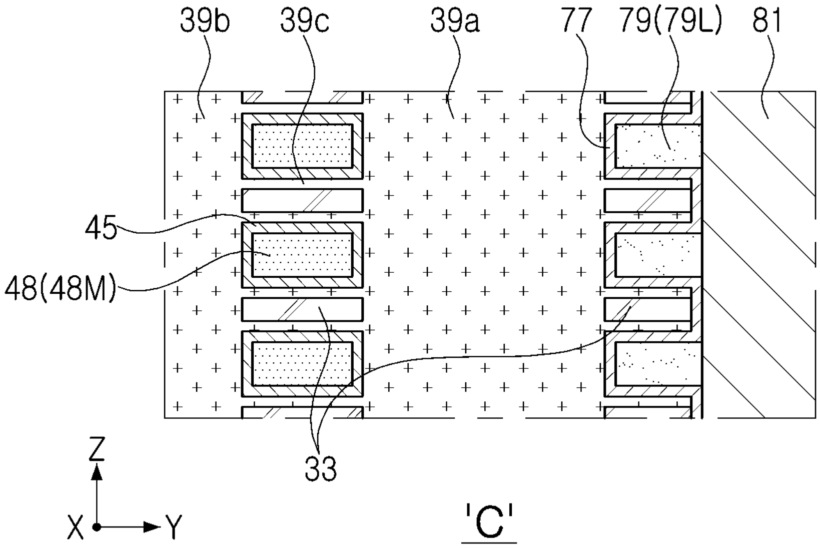
FIG. 5B is an enlarged diagram illustrating region "C" in FIG. 5A.
Figure 6A:
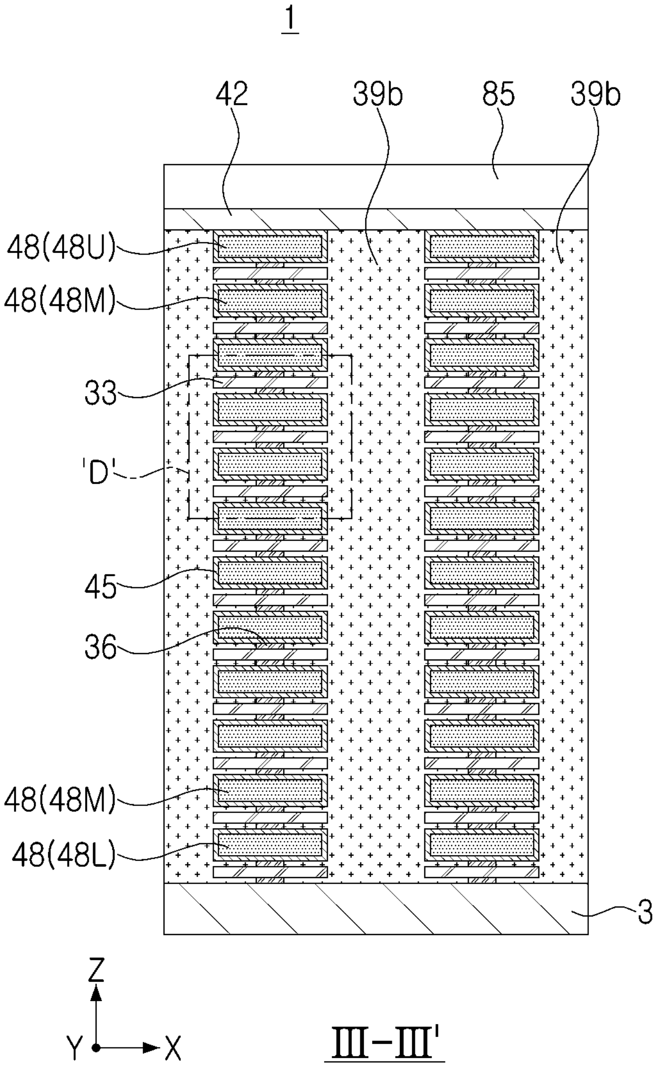
FIG. 6A is a cross-sectional diagram illustrating region taken along line III-III' in FIG. 2.
Figure 6B:
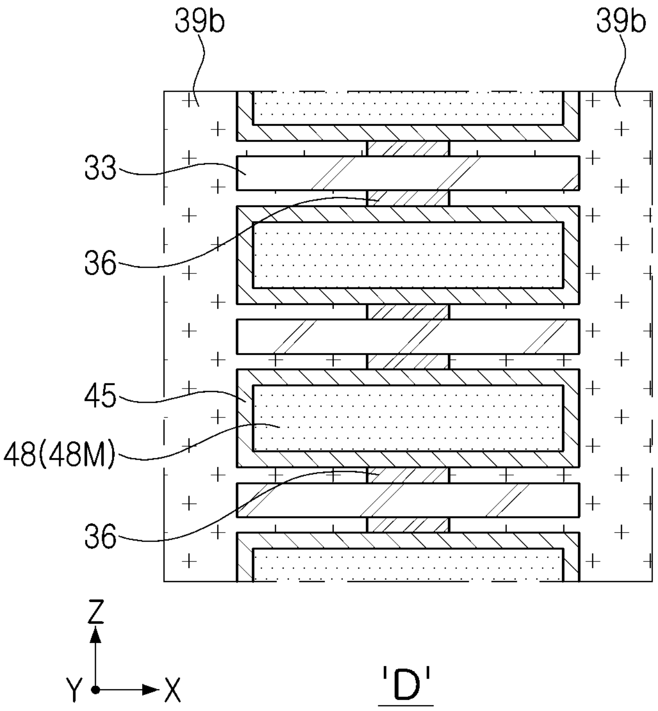
FIG. 6B is an enlarged diagram illustrating region "D" in FIG. 6A.
Figure 7A:
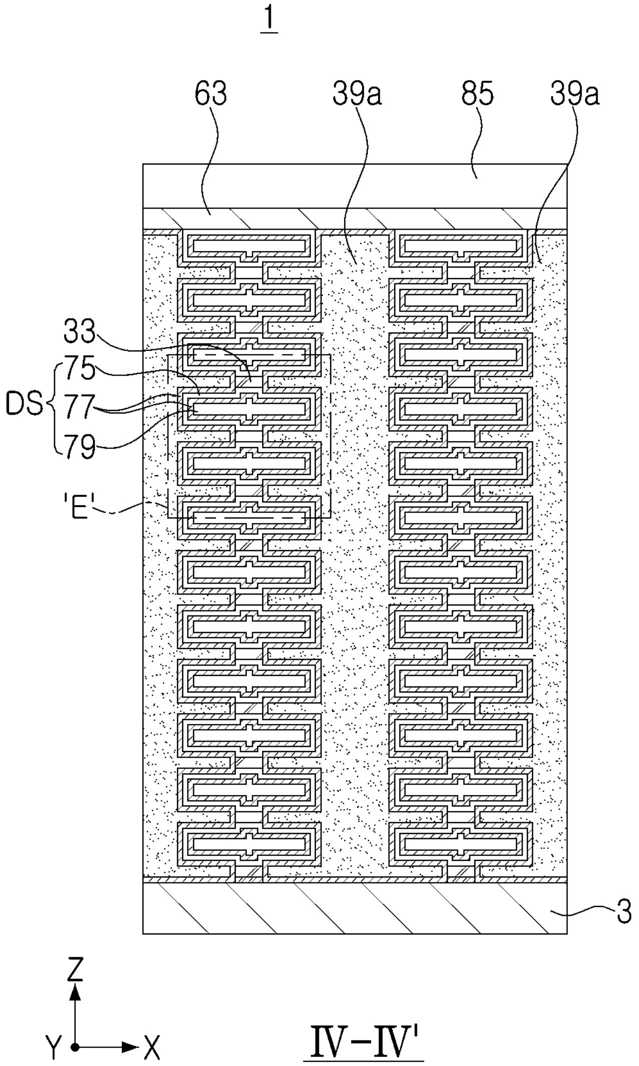
FIG. 7A is a cross-sectional diagram illustrating a region taken along line IV-IV' in FIG. 2.
Figure 7B:
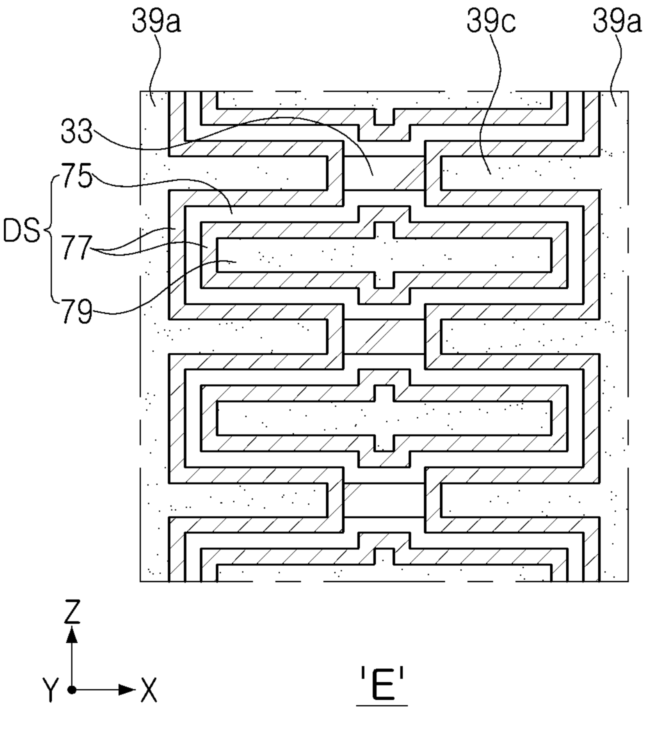
FIG. 7B is an enlarged diagram illustrating region "E" in FIG. 7A.
Figure 8A:
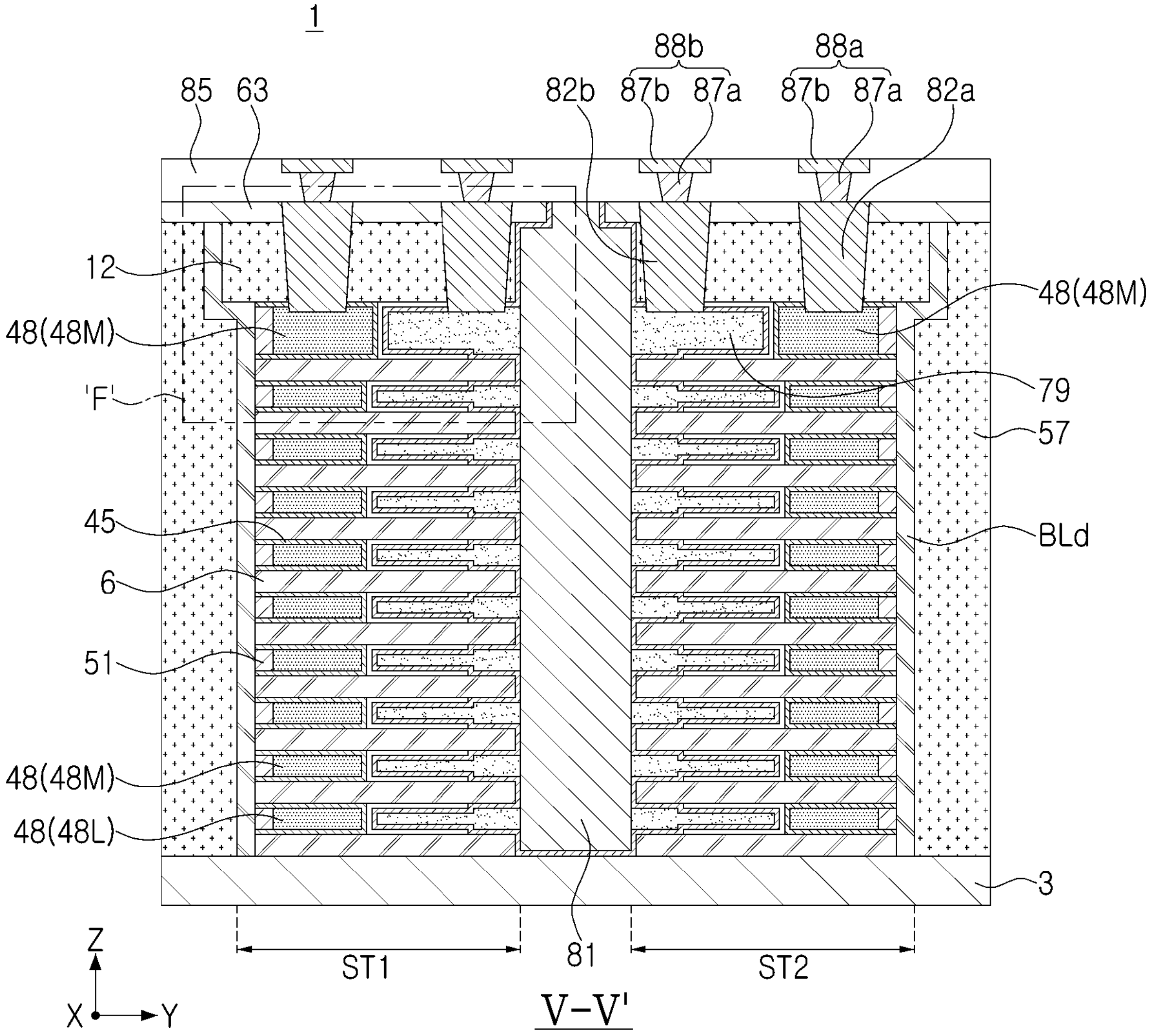
FIG. 8A is a cross-sectional diagram illustrating region taken along line V-V' in FIG. 2.
Figure 8B:
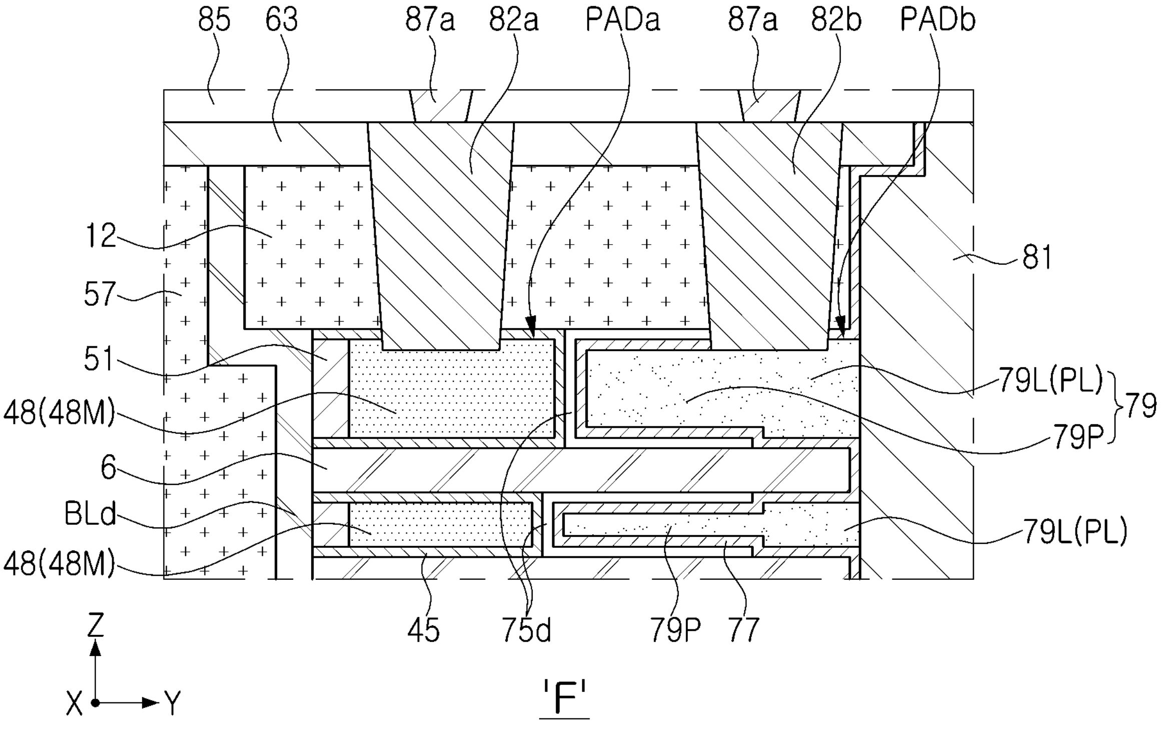
FIG. 8B is an enlarged diagram illustrating region "F" in FIG. 8A.
Figure 9A:
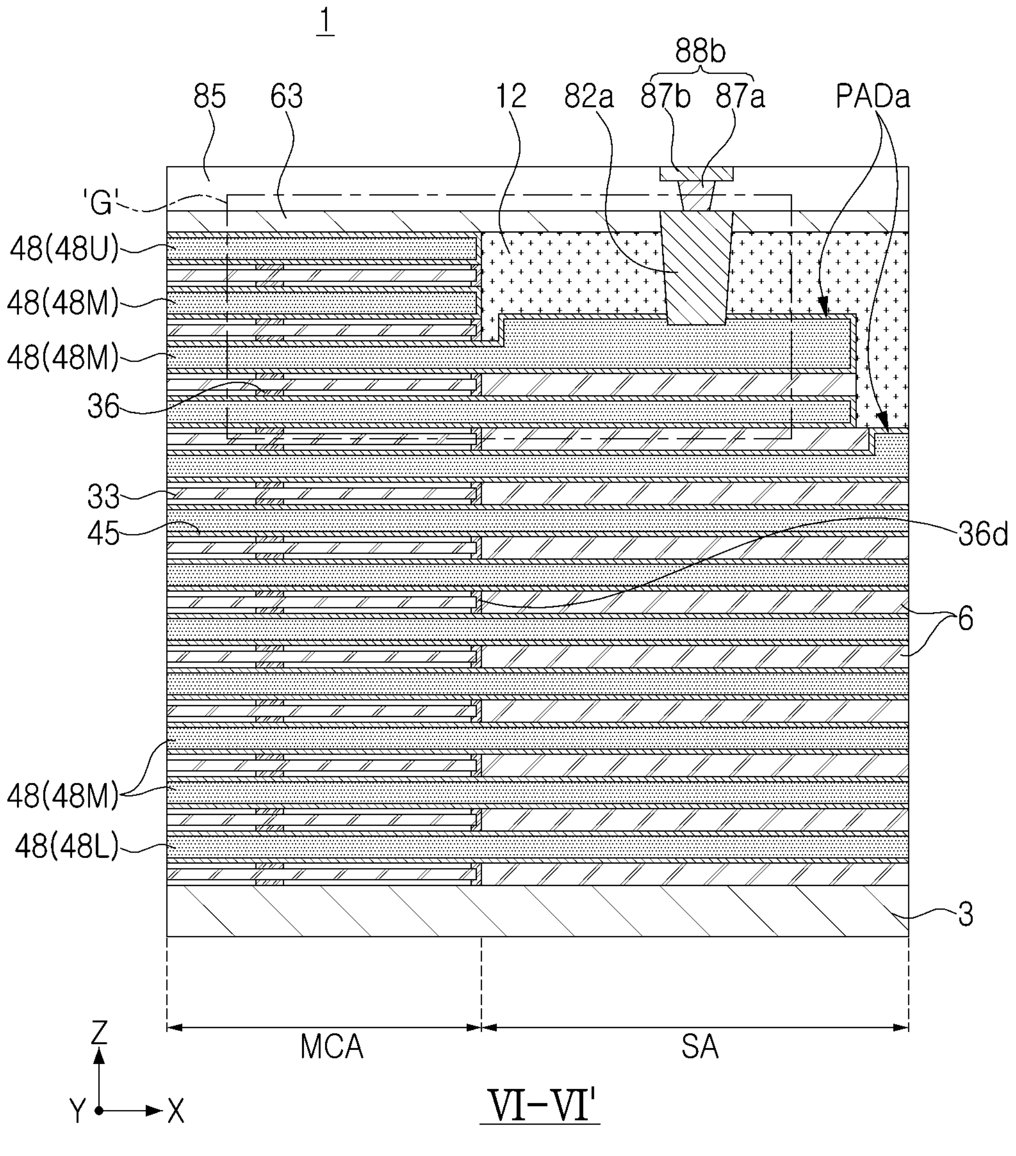
FIG. 9A is a cross-sectional diagram illustrating region taken along line VI-VI' in FIG. 2.
Figure 9B:
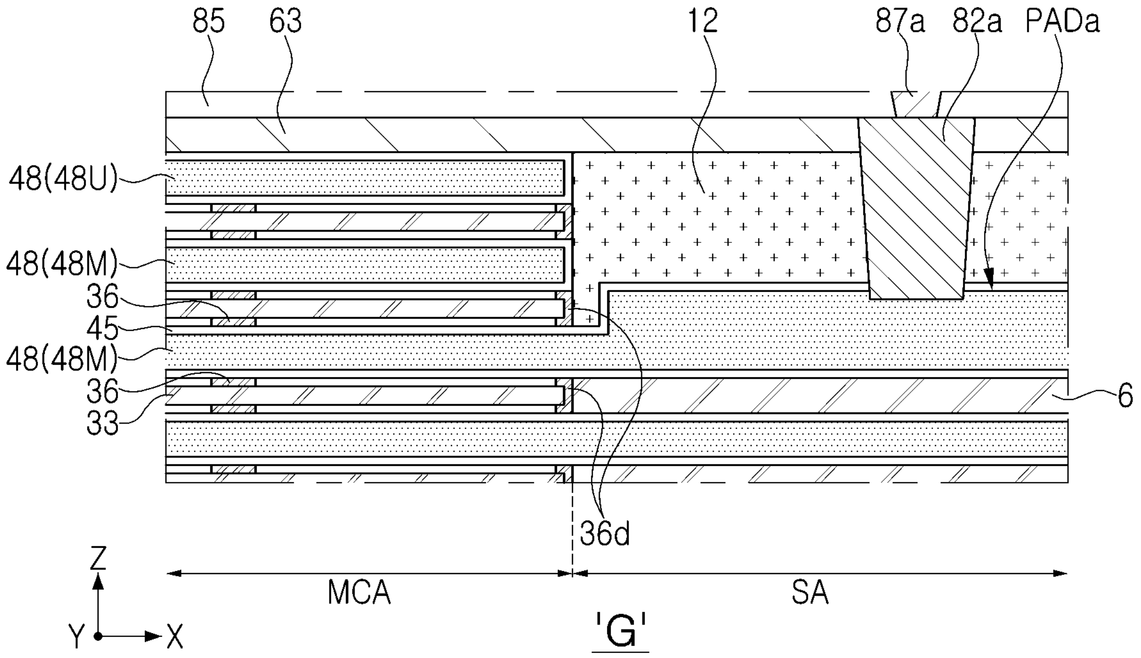
FIG. 9B is an enlarged diagram of the region marked "G" in FIG. 9A.

In the cross-sectional structure as illustrated in FIGS. 5B and 6B, the gate dielectric layers 45 may surround the gate electrodes 48 in the Y-direction.

The gate electrode 48, which may be word line WL, the first source/drain region SD1, the second source/drain region SD2, the channel region CH and the gate dielectric layer 45 may form a cell transistor CTR.

The cell transistor CTR may include the gate electrode 48, which may be one word line WL, the first source/drain region SD1, the channel region CHa and the second source/drain region SD2 included in the first active layer 36_1 disposed below the lower surface of the one gate electrode 48, and the first source/drain region SD1, the channel region CHb and the second source/drain region SD2 included in the one second active layer 36_2 disposed on the upper surface of the one gate electrode 48.

Each of the first and second stack structures ST1 and ST2 may further include insulating buffer patterns 51 between the bit lines BL and the gate electrodes 48. The insulating buffer patterns 51 may include an insulating material such as silicon nitride. The gate dielectric layers 45 may extend to cover upper and lower surfaces of the insulating buffer patterns 51.

On the staircase region SA, each of the first and second stack structures ST1 and ST2 may further include a first capping insulating layer 12 covering the gate pad regions PADa of the gate electrodes 48 and the electrode pad regions PADb of the second electrodes 79. The first capping insulating layer 12 may be formed of an insulating material such as silicon oxide.

In the region between the memory cell array region MCA and the staircase region SA, each of the first and second stack structures ST1 and ST2 may further include dummy active patterns (36_d_ in FIGS. 9A and 9B) in contact with side surfaces of the cell interlayer insulating layers 33. The dummy active patterns 36_d_ may be disposed between the cell interlayer insulating layers 33 and the staircase interlayer insulating layers 6 and between the cell interlayer insulating layers 33 and the first capping insulating layer 12. One of the dummy active patterns 36_d_ may be in contact with a side surface of the cell interlayer insulating layer 33 and may extend to cover upper and lower surfaces of the cell interlayer insulating layer 33. The dummy active patterns 36_d_ may be formed of the same material as that of the active layers 36.

Each of the first and second stack structures ST1 and ST2 may further include first pillars 17_a_ and second pillars 17_b_ disposed on the staircase region SA, and third pillars 39_a_ and fourth pillars 39_b_ disposed on the memory cell array region MCA. The first to fourth pillars 17_a_ and 17_b_, 39_a_, and 39_b_ may be formed of an insulating material such as silicon oxide. The first to fourth pillars 17_a_ and 17_b_, 39_a_, and 39_b_ may be referred to as insulating pillars.

The first to fourth pillars 17_a_ and 17_b_, 39_a_, and 39_b_ may be disposed on the base 3. Lower surfaces of the first to fourth pillars 17_a_ and 17_b_, 39_a_, and 39_b_ may be disposed on a level lower than a level of the lower gate electrode 48L, and upper surfaces of the first to fourth pillars 17_a_ and 17_b_, 39_a_, and 39_b_ may be disposed on a level higher than a level of the upper gate electrode 48U.

On the memory cell array region MCA, the third pillars 39_a_ may be arranged and spaced apart from each other in the X-direction and the Y-direction, and the fourth pillars 39_b_ may be arranged and spaced apart from each other in the X-direction and the Y-direction. The third pillars 39_a_ and the fourth pillars 39_b_ may be adjacent to each other with the gate electrodes 48 interposed therebetween in the Y-direction. In the X-direction, a pair of third pillars 39_a_ may be adjacent to each other, and a pair of third pillars 39_a_ may be disposed between the fourth pillars 39_b_. Extended layers 39_c_ may be extended from the third pillars 39_a_ and the fourth pillars 39_b_. The third pillars 39_a_ and the fourth pillars 39_b_ may be connected to each other by the extended layers 39_c_.

In the staircase region SA, the first pillars 17_a_ may be arranged and spaced apart from each other in the X-direction and the Y-direction, and the second pillars 17_b_ may be arranged and spaced apart from each other in the X-direction and the Y-direction. The first pillars 17_a_ and the second pillars 17_b_ may be adjacent to each other with the gate electrodes 48 interposed therebetween in the Y-direction. In the X-direction, a pair of first pillars 17_a_ may be adjacent to each other, and a pair of first pillars 17_a_ may be disposed between the second pillars 17_b_. The first and third pillars 17_a_ and 39_a_ may be arranged in the X-direction. The second and fourth pillars 17_b_ and 39_b_ may be arranged in the X-direction.

In a plan diagram, the gate electrodes 48 may have a narrow width between the first pillars 17_a_ and the second pillars 17_b_, and between the third pillars 39_a_ and the fourth pillars 39_b_.

In a plan diagram, the first pillars 17*a* and the third pillars 39*a* may be disposed between the data storage structures DS and the gate electrodes 48.

In each of the data storage structures DS, the line portion 79L of the second electrode 79 may extend from the memory cell array region MCA to the staircase region SA.

In each of the data storage structures DS, the protrusions 79P of the second electrode 79 may extend from the line portion 79L to the third pillars 39*a* on the memory cell array region MCA, and may extend from the line portion 79L to the first pillars 17*a* on the staircase region SA.

In each of the data storage structures DS, the first electrodes 75 may be disposed between the third pillars 39*a* on the memory cell array region MCA.

Each of the first and second stack structures ST1 and ST2 may further include dummy electrode patterns 75*d* disposed between the first pillars 17*a* adjacent to each other in the X-direction on the staircase region SA. The dummy electrode patterns 75*d* may be formed simultaneously with the first electrodes 75 and may be formed of the same material as that of the first electrodes 75.

On the staircase region SA, the dummy electrode patterns 75*d* may cover a side surface, a lower surface and an upper surface of the protrusion 79P of the second electrodes 79. The dielectric layer 77 may include a portion interposed between the dummy electrode patterns 75*d* and the second electrodes 79. The dummy electrode patterns 75*d* may be spaced apart from the second electrodes 79 by the dielectric layer 77. The gate dielectric layers 45 may cover side surfaces, lower surfaces and upper surfaces of the gate electrodes 48 disposed on the staircase region SA. Accordingly, the dummy electrode patterns 75*d* may be spaced apart from the gate electrodes 48 by the gate dielectric layers 45.

The semiconductor device 1 may further include an insulating separation pattern 81. The insulating separation pattern 81 may have a line shape extending in the X-direction. A lower surface of the insulating separation pattern 81 may be disposed on a level lower than a level of the lower gate electrode 48L, and an upper surface of the insulating separation pattern 81 may be disposed on a level higher than a level of the upper gate electrode 48U. The insulating separation pattern 81 may be an insulating separation pattern including an insulating material such as silicon nitride.

The first stack structure ST1 and the second stack structure ST2 may be spaced apart from each other in the Y-direction with the insulating separation pattern 81 therebetween. Accordingly, the first stack structure ST1 and the second stack structure ST2 may be spaced apart from each other by the insulating separation pattern 81. When viewed from the insulating separation pattern 81 as a center, the first stack structure ST1 and the second stack structure ST2 may have a mirror symmetric structure. The second electrodes 79 of the first stack structure ST1 and the second electrodes 79 of the second stack structure ST2 may be in contact with the insulating separation pattern 81.

The second electrodes 79 of the first stack structure ST1 and the second electrodes 79 of the second stack structure ST2 may be disposed between the gate electrodes 48 of the first stack structure ST1 and the gate electrodes 48 of the second stack structure ST2.

The semiconductor device 1 may further include first insulating patterns 57 and second insulating patterns 60 alternately arranged in the X-direction. The first insulating patterns 57 may be in contact with the bit lines BL on the memory cell array region MCA and may be in contact with the dummy bit lines BLd on the staircase region SA. The second insulating patterns 60 may be in contact with the fourth pillars 39*b* on the memory cell array region MCA and may be in contact with the second pillars 17*b* on the staircase region SA. The first and second insulating patterns 57 and 60 may include an insulating material such as silicon oxide.

The semiconductor device 1 may further include a second capping insulating layer 63 disposed on the first and second stack structures ST1 and ST2, the first and second insulating patterns 57 and 60, and the first to fourth pillars 17*a* and 17*b*, 39*a*, and 39*b*. The second capping insulating layer 63 may include an insulating material such as silicon oxide or silicon nitride. The second capping insulating layer 63 may be an insulating material doped with an element such as C, N, O, or B. The second capping insulating layer 63 may include a material different from that of the first capping insulating layer 12.

The semiconductor device 1 may further include gate contact plugs 82*a* and electrode contact plugs 82*b*.

The gate contact plugs 82*a* may penetrate through the second capping insulating layer 63 and the first capping insulating layer 12 on the staircase region SA and may be in contact with and electrically connected to the gate pad regions PADa. The electrode contact plugs 82*b* may penetrate through the second capping insulating layer 63 and the first capping insulating layer 12 on the staircase region SA and may be in contact with and electrically connected to the electrode pad regions PADb.

The semiconductor device 1 may further include an upper insulating structure 85 on the second capping insulating layer 63 and the insulating separation pattern 81 and wiring structures 88*a* and 88*b* buried in the upper insulating structure 85. Each of the wiring structures 88*a* and 88*b* may include a via 87*a* and a wiring 87*b*. The wiring structures 88*a* and 88*b* may include wiring structures 88*a* electrically connected to the gate contact plugs 82*a* and wiring structures 88*b* electrically connected to the electrode contact plugs 82*b*.

In some implementations, the cell transistors CTR are stacked and spaced apart from each other in the Z-direction, and the data storage structures DS may be stacked and spaced apart from each other in the Z-direction. Accordingly, integration density of the semiconductor device 1 may be improved.

In some implementations, since the second electrodes 79 of the data storage structures DS are stacked and spaced apart from each other in the Z-direction, the second electrodes 79 may be independently controlled. For example, a separate voltage may be applied to the second electrodes 79 of the data storage structures DS. Accordingly, the data storage structures DS may be configured as non-volatile memory.

Hereinafter, various modified examples of the above-described examples will be described. Various modified examples of the components of the above-described example described below will be described with respect to modified components, replaced components, or added components. Also, the components modified or replaced described below are described with reference to the following drawings, but the components modified or replaced may be combined with each other or with the components described above, and may configure a semiconductor devices.

Figure 10:
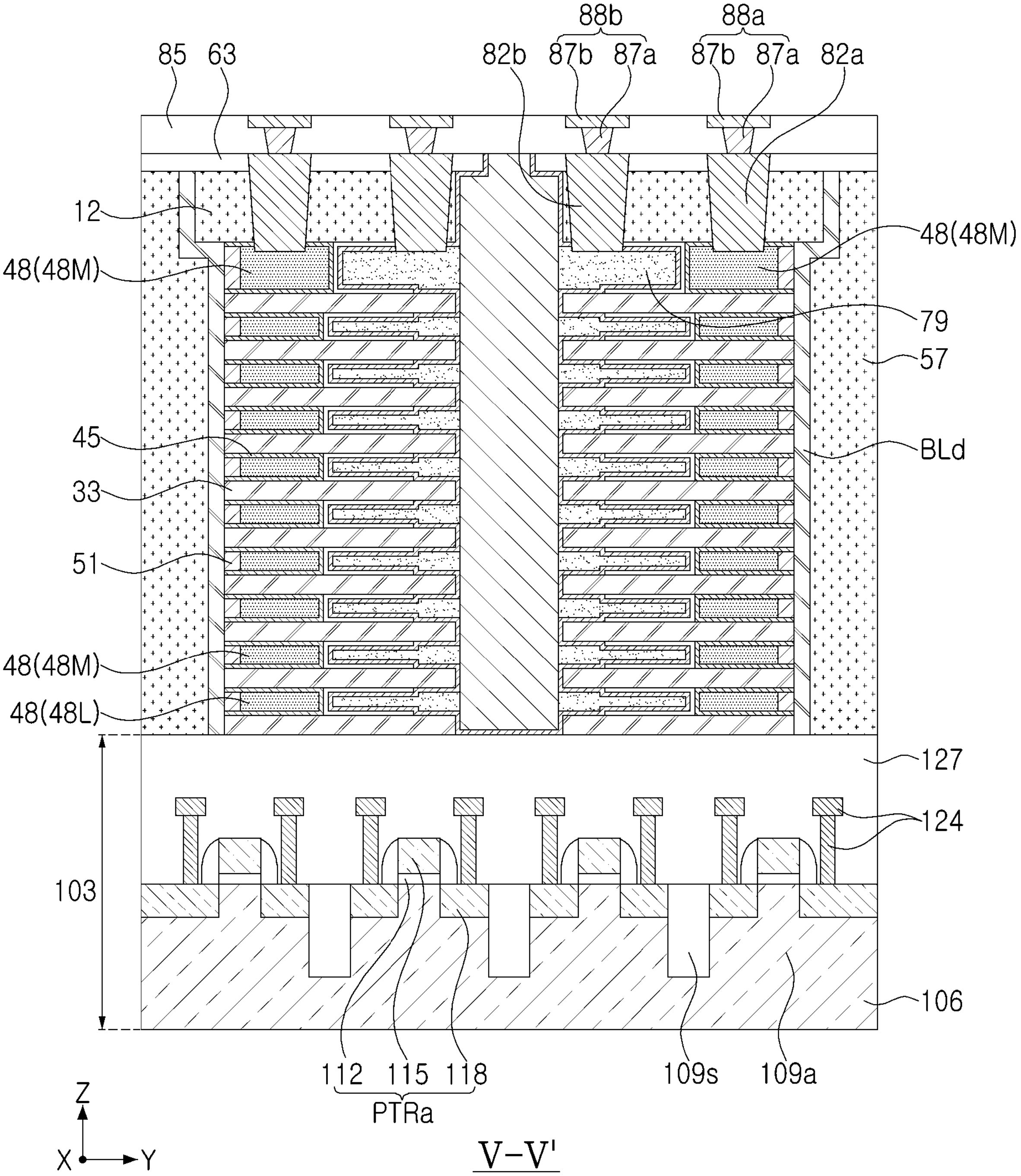
FIG. 10 is a cross-sectional diagram illustrating an example of a semiconductor device.

First, a modified example of a semiconductor device will be described with reference to FIG. 10. FIG. 10 is a cross-sectional diagram illustrating a modified example of a semiconductor device.

Referring to FIG. 10, the base (3 in FIGS. 1 to 9B) described above with reference to FIGS. 1 to 9B may be replaced with a peripheral circuit structure 103. Accordingly, the peripheral circuit structure 103 may vertically overlap the first and second stack structures ST1 and ST2.

The peripheral circuit structure 103 may include a semiconductor substrate 106 and a device isolation region 109*s* defining a peripheral active region 109*a* on the semiconductor substrate 106.

The peripheral circuit structure 103 may further include a peripheral circuit (PTRa, 124) including peripheral transistors PTRa and a circuit wiring 124.

Each of the peripheral transistors PTRa may include a peripheral gate dielectric layer 112 and a peripheral gate electrode 115 stacked in order on the peripheral active region 109*a*, and a peripheral source/drain regions 118 disposed in the peripheral active region 109*a* of both sides of the peripheral gate electrode 115. The circuit wiring 124 may be electrically connected to the peripheral transistors PTRa.

The peripheral circuit structure 103 may further include a peripheral insulating structure 127 covering the peripheral circuit (PTRa, 124) on the semiconductor substrate 106.

Figure 11:
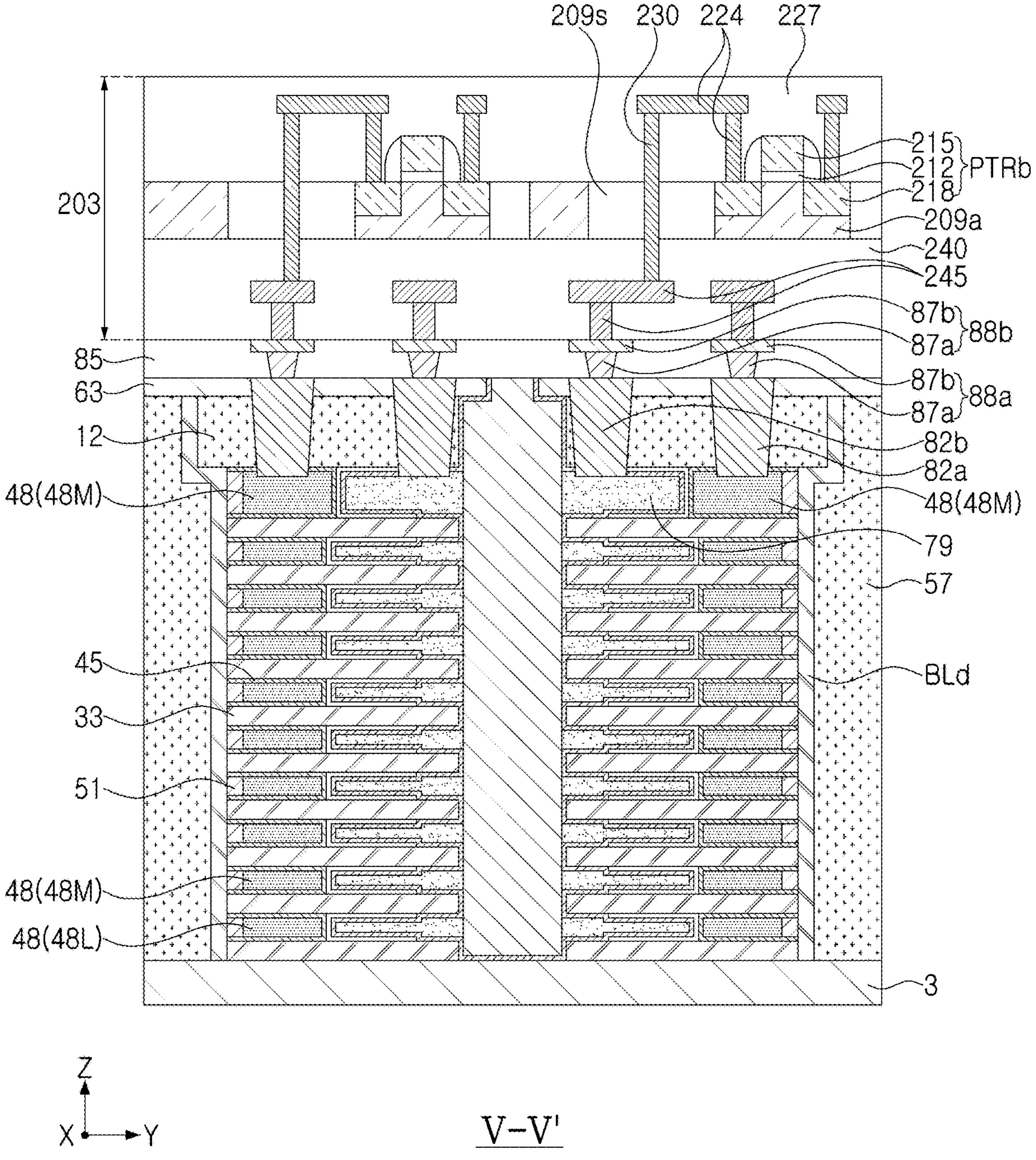
FIG. 11 is a cross-sectional diagram illustrating an example of a semiconductor device.

A modified example of a semiconductor device will be described with reference to FIG. 11. FIG. 11 is a cross-sectional diagram illustrating a modified example of a semiconductor device.

Referring to FIG. 11, a peripheral circuit structure 203 is disposed on the upper insulating structure 85 described above with reference to FIGS. 1 to 9B.

The peripheral circuit structure 203 may include a peripheral active region 209*a* and a device isolation region 209*s* on a side surface of the peripheral active region 209*a*.

The peripheral circuit structure 203 may further include a peripheral circuit (PTRb, 224) including peripheral transistors PTRb and circuit wiring 224.

Each of the peripheral transistors PTRb may include a peripheral gate dielectric layer 212 and a peripheral gate electrode 215 stacked in order on the peripheral active region 209*a*, and a peripheral source/drain regions 218 disposed in the peripheral active region 209*a* on both sides of the peripheral gate electrode 215. The circuit wiring 224 may be electrically connected to the peripheral transistors PTRb.

The peripheral circuit structure 203 may further include a peripheral insulating structure 227 covering the device isolation region 209*s* and the peripheral circuits (PTRb, 224).

The peripheral circuit structure 203 may further include a lower insulating structure 240 disposed below the peripheral active region 209*a* and the device isolation region 209*s*, a lower wiring structure 245 embedded in the lower insulating structure 240 and electrically connected to the wiring structures 88*a* and 88*b*, and connection contact plugs 230 penetrating through the device isolation region 209*s*, extending in the Z-direction and electrically connecting the lower wiring structure 245 to the circuit wiring 224.

Figure 12:
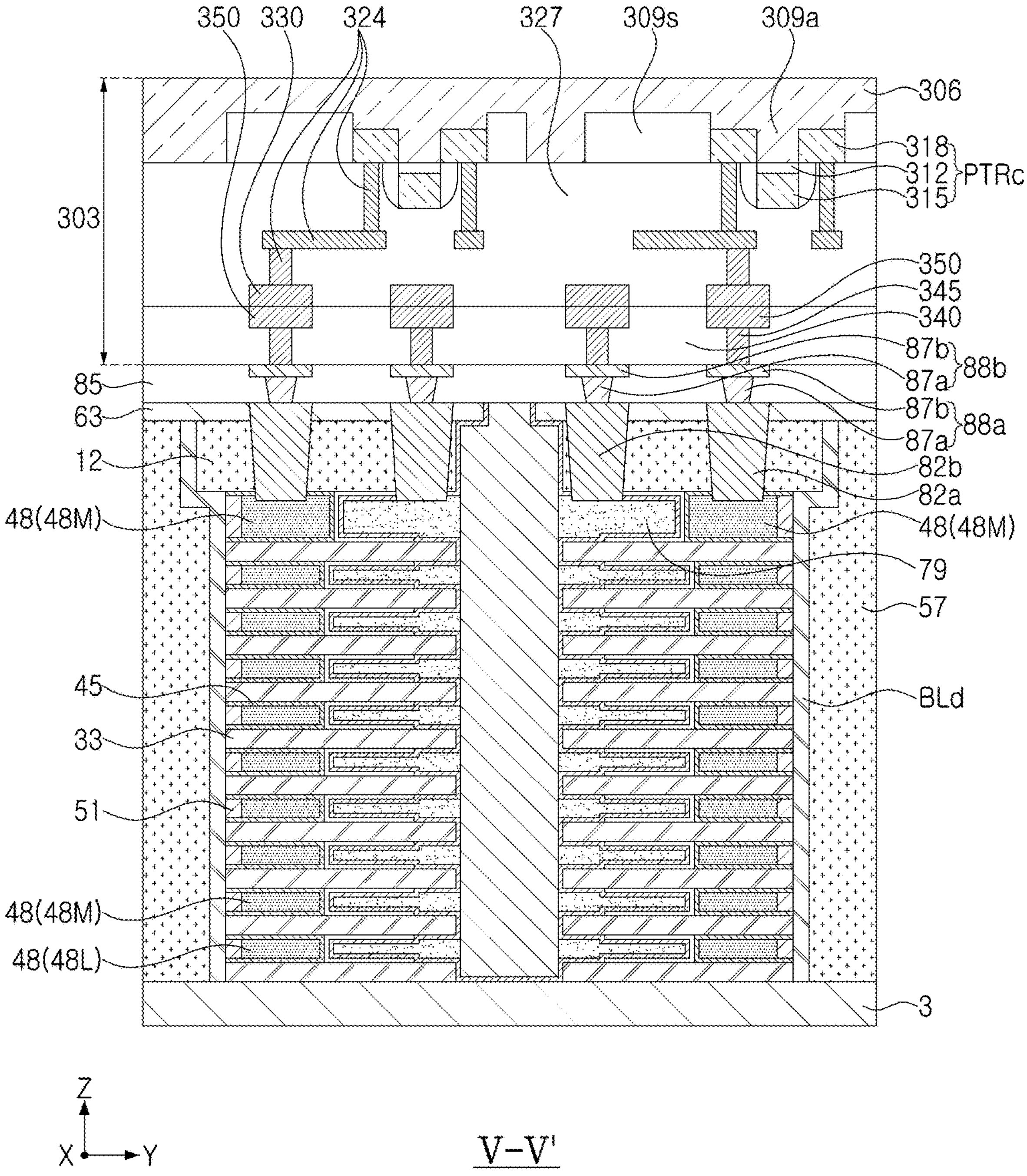
FIG. 12 is a cross-sectional diagram illustrating an example of a semiconductor device.

A modified example of a semiconductor device will be described with reference to FIG. 12. FIG. 12 is a cross-sectional diagram illustrating a modified example of a semiconductor device.

Referring to FIG. 12, a peripheral circuit structure 303 is disposed on the upper insulating structure 85 described above with reference to FIGS. 1 to 9B.

The peripheral circuit structure 303 may include a semiconductor substrate 306 and a device isolation region 309*s* defining a peripheral active region 309*a* below the semiconductor substrate 306.

The peripheral circuit structure 303 may further include a peripheral circuit (PTRc, 324) including peripheral transistors PTRc and a circuit wiring 324.

Each of the peripheral transistors PTRc may include a peripheral gate dielectric layer 312 and a peripheral gate electrode 315 stacked in order below the peripheral active region 309*a*, and peripheral source/drain regions 318 disposed in the peripheral active region 309*a* on both sides of the peripheral gate electrode 315. The circuit wiring 324 may be electrically connected to the peripheral transistors PTRc.

The peripheral circuit structure 303 may further include a peripheral insulating structure 327 covering the peripheral circuit (PTRc, 324) below the semiconductor substrate 306, and upper bonding pads 330 disposed in the peripheral insulating structure 327, electrically connected to the circuit wiring 324, and having a lower surface coplanar with a lower surface of the peripheral insulating structure 327.

The peripheral circuit structure 303 may include an intermediate insulating structure 340 between the upper insulating structure 85 and the peripheral insulating structure 327, connection structures 345 electrically connected to the wiring structures 88*a* and 88*b* within the intermediate insulating structure 340, and lower bonding pads 350 electrically connected to the connection structures 345, having an upper surface coplanar with the upper surface of the intermediate insulating structure 340 and bonded to the upper bonding pads 330 by metal to metal bonding, described above with reference to FIGS. 1 to 9B. The lower bonding pads 350 and the upper bonding pads 330 may include a metal material such as copper.

Figure 2:
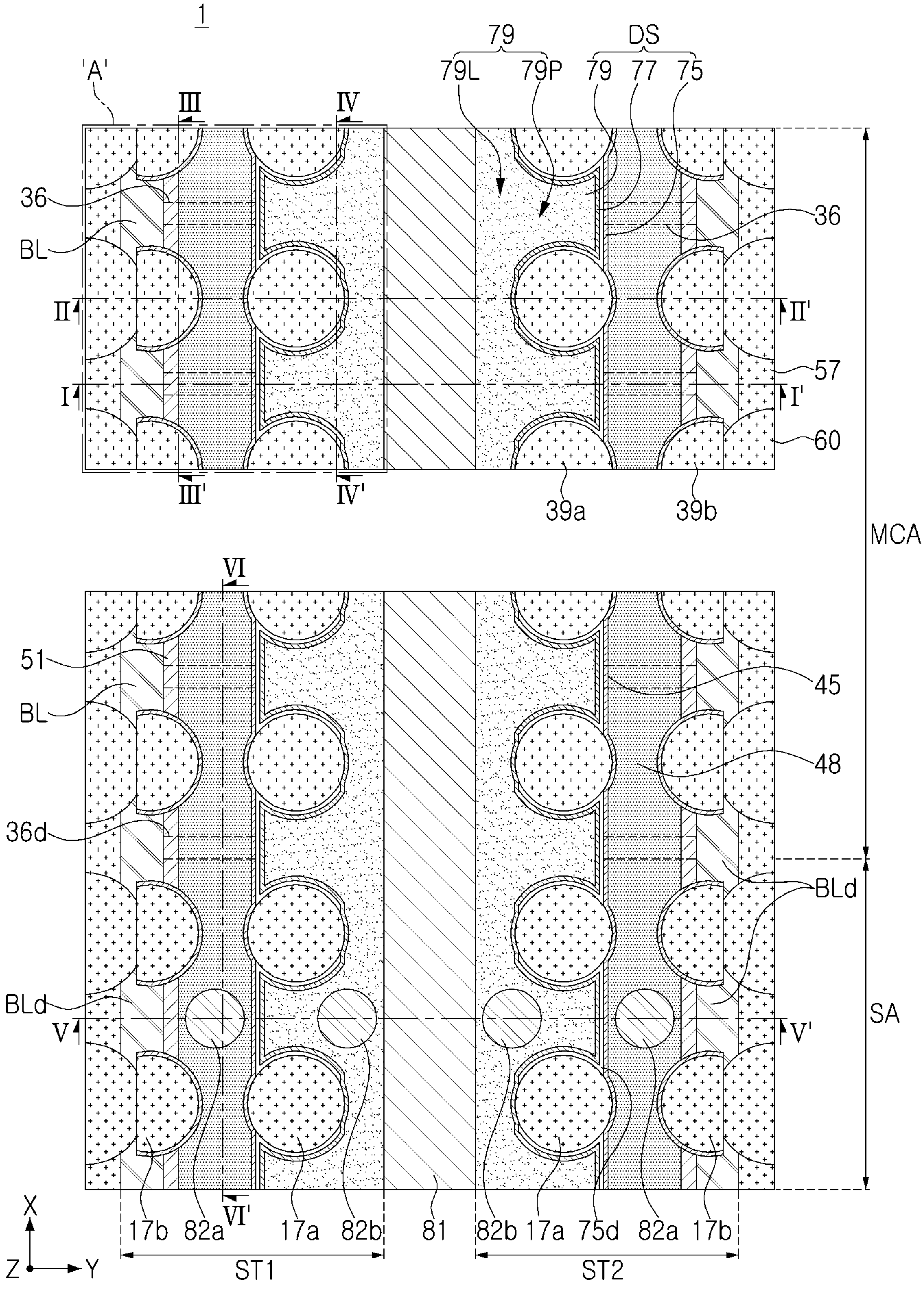
FIG. 2 is a plan diagram illustrating an example of a semiconductor device.
Figure 3:
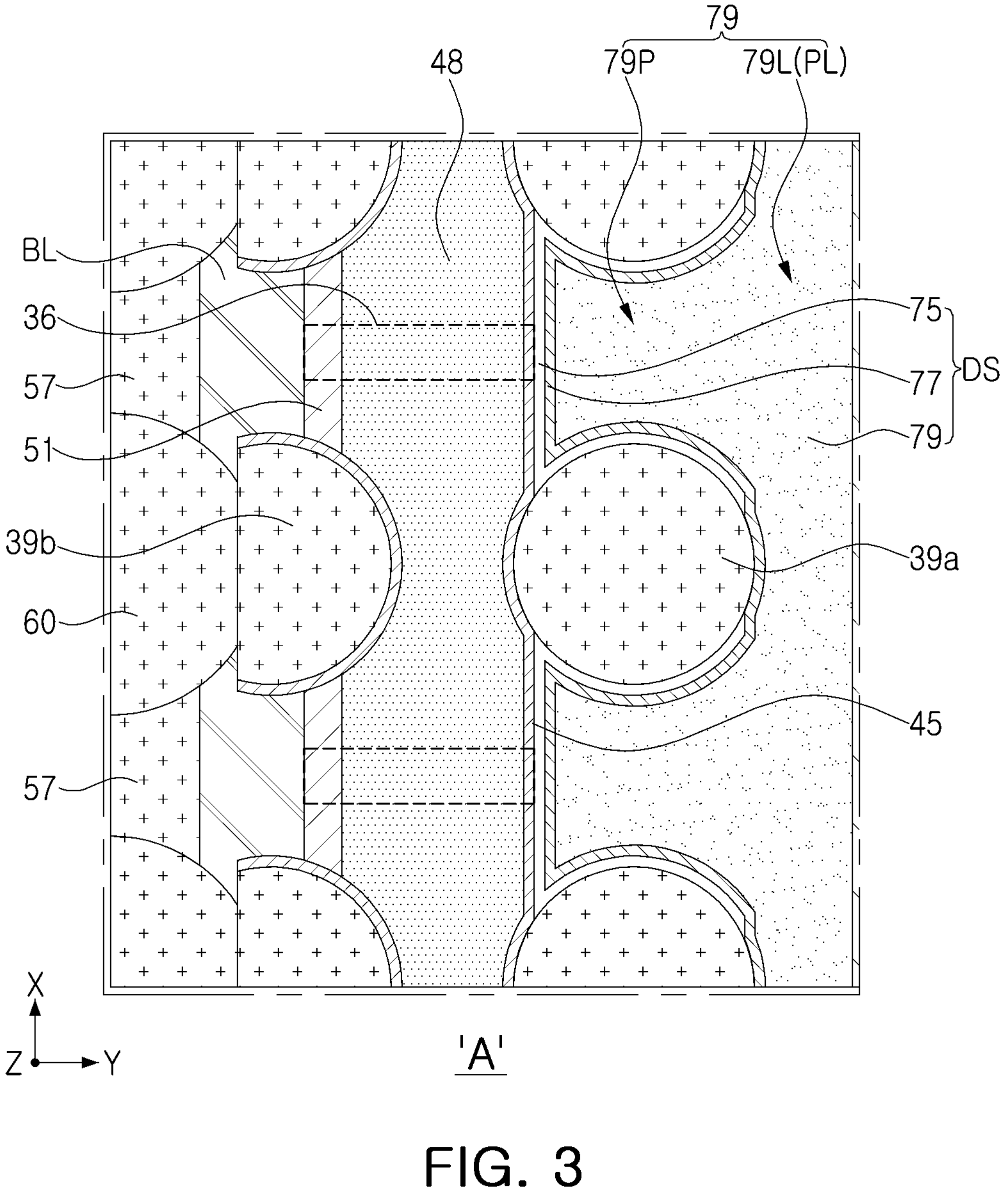
FIG. 3 is an enlarged diagram illustrating region "A" in FIG. 2.
Figure 13A:
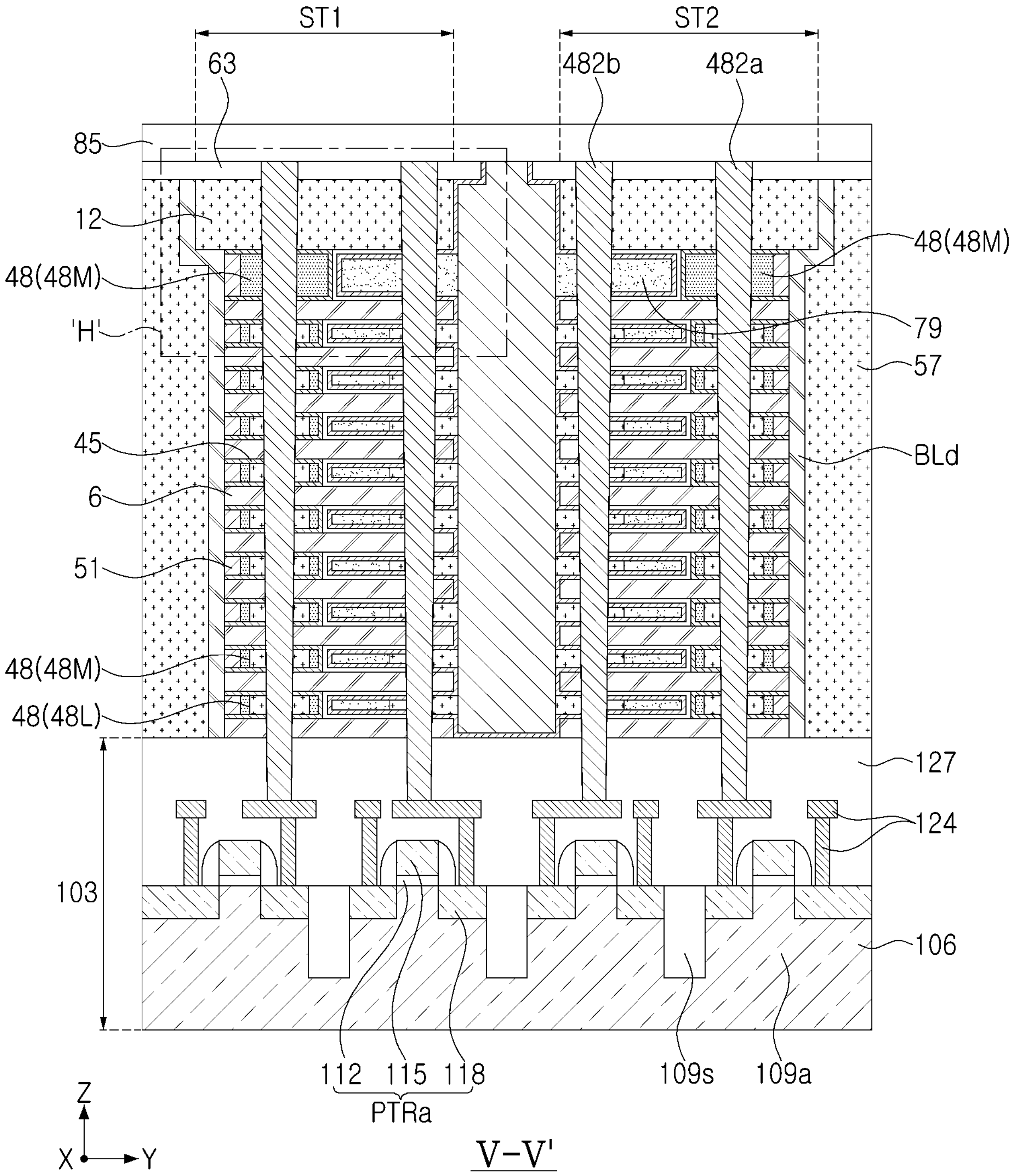
FIGS. 13A and 13B are diagrams illustrating an example of a semiconductor device.

A modified example of a semiconductor device will be described with reference to FIGS. 13A and 13B. FIG. 13A is a cross-sectional diagram illustrating a region taken along line V-V' in FIG. 2, illustrating a modified example of a semiconductor device, and FIG. 13B is an enlarged diagram illustrating region "H" in FIG. 13A.

Figure 13B:
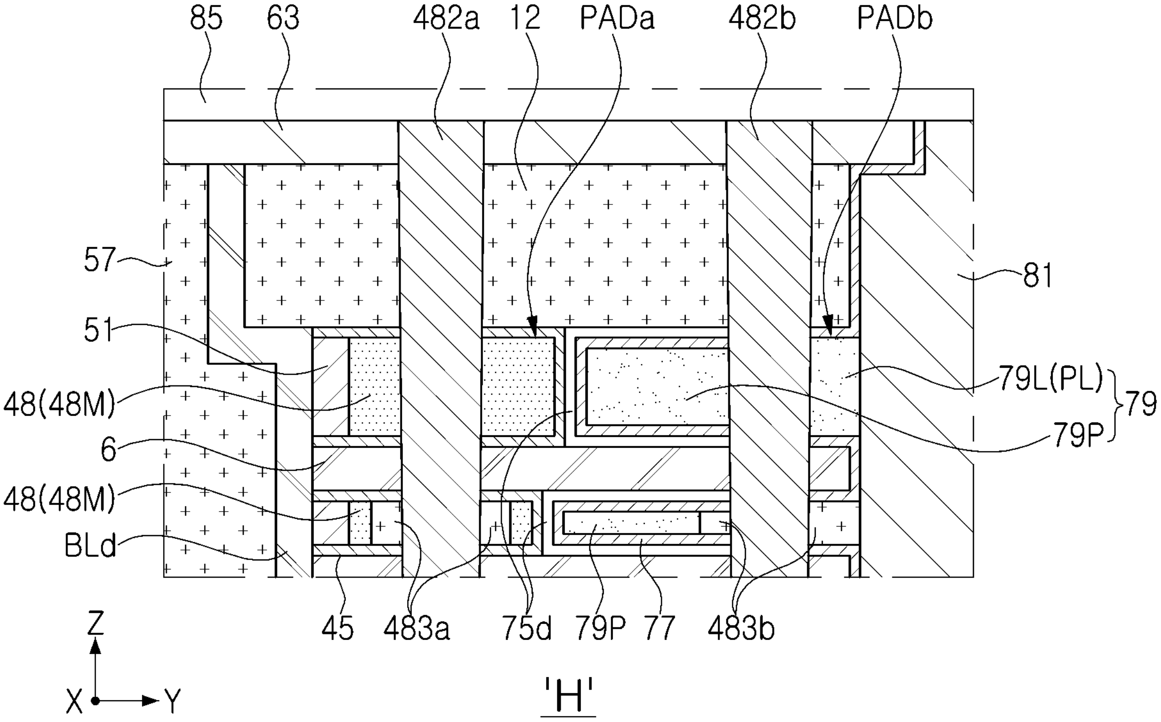

Referring to FIGS. 13A and 13B, the base 3 described above with reference to FIGS. 1 to 9B is replaced with the peripheral circuit structure 103 as described with reference to FIG. 10. The gate contact plugs 82*a* described above with reference to FIGS. 8A and 8B may be modified to gate contact plugs 482*a* penetrating through the gate pad regions PADa, extending downwardly and electrically connected to the circuit wiring 124 of the peripheral circuit (PTRa, 124) as illustrated in FIGS. 13A and 13B. The electrode contact plugs 82*b* described above with reference to FIGS. 8A and 8B may be modified to electrode contact plugs 482*b* penetrating through the electrode pad regions PADb, extending downwardly and electrically connected to the circuit wiring 124 of the peripheral circuit (PTRa, 124) as illustrated in FIGS. 13A and 13B.

The gate contact plugs 482*a* may be in contact with and electrically connected to the gate pad regions PADa. The electrode contact plugs 482*b* may be in contact with and electrically connect to the electrode pad regions PADb.

Each of the first and second stack structures ST1 and ST2 may further include first buffer insulating layers 483*a* separating the gate electrodes 48 and the gate contact plugs 482*a* disposed on a level lower than a level of the gate pad regions PADa from each other. The first buffer insulating layers 483*a* may be disposed between the gate electrodes 48 and the gate contact plugs 482*a* disposed on a level lower than a level of the gate pad regions PADa.

Each of the first and second stack structures ST1 and ST2 may further include second buffer insulating layers 483*b* for separating the second electrodes 79 and the electrode contact plugs 482_b_ disposed on a level lower than a level of the electrode pad regions PADb from each other.

The second buffer insulating layers 483_b_ may be disposed between the second electrodes 79 and the electrode contact plugs 482_b_ disposed on a level lower than a level of the electrode pad regions PADb.

Accordingly, the gate contact plugs 482_a_ may penetrate through the first and second stack structures ST1 and ST2 and may be electrically connected to the gate pad regions PADa, and the electrode contact plugs 482_b_ may penetrate through the first and second stack structures ST1 and ST2 and may be electrically connected to the electrode pad regions PADb.

Figure 14:
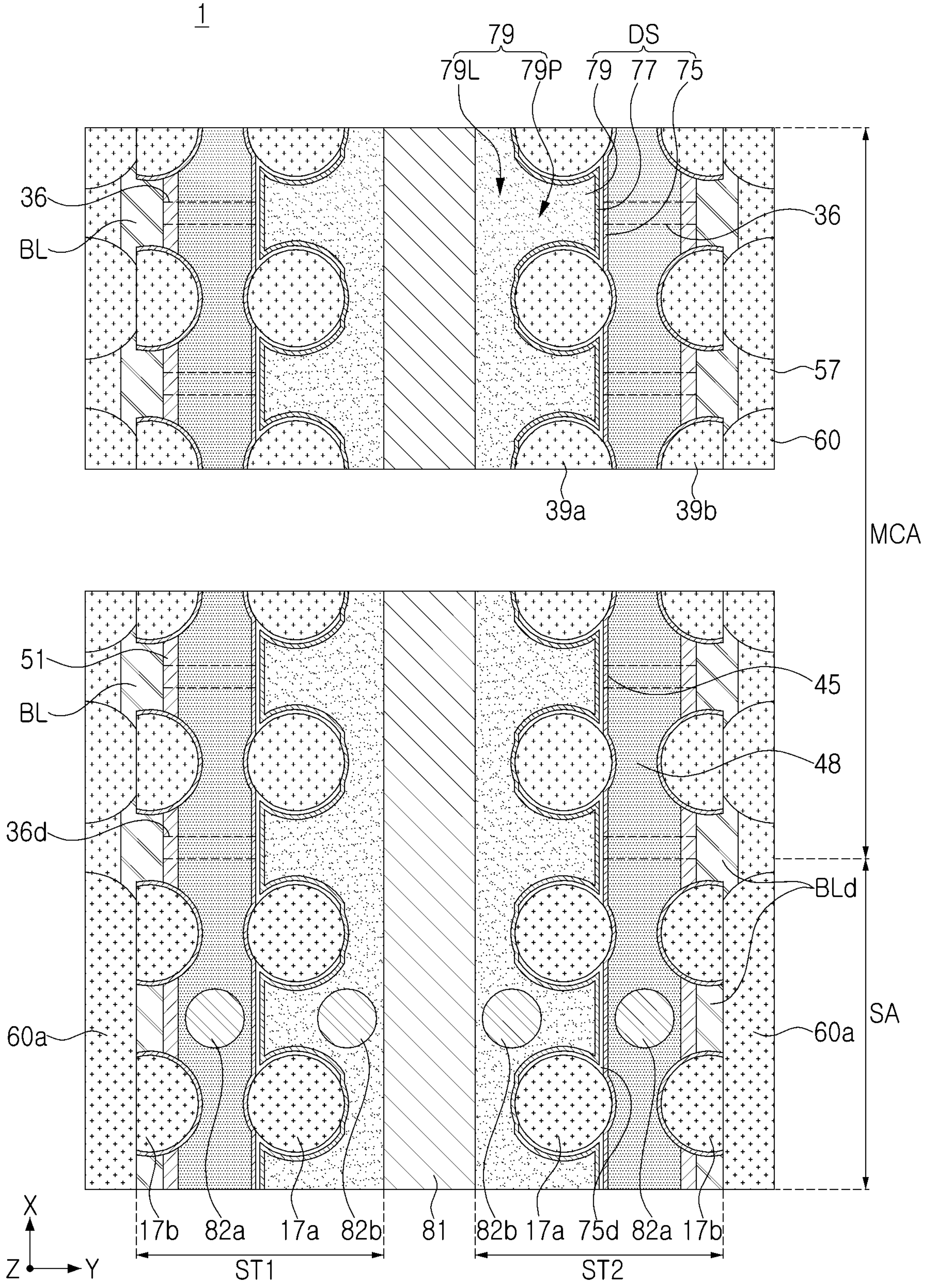
FIG. 14 is a plan diagram illustrating an example of a semiconductor device.

A modified example of a semiconductor device will be described with reference to FIG. 14. FIG. 14 is a plan diagram illustrating a modified portion in FIG. 2, illustrating a modified example of a semiconductor device.

Referring to FIG. 14, the second insulating patterns 60 disposed on the staircase region SA in FIG. 2 is modified to a third insulating pattern 60_a_ having a line shape extending in the X-direction. Accordingly, the second insulating patterns 60 disposed on the memory cell array region MCA may be alternately arranged with the first insulating patterns 57 in the X-direction. On the staircase region SA, the third insulating pattern 60_a_ may have a line shape extending in the X-direction.

Figure 15A:
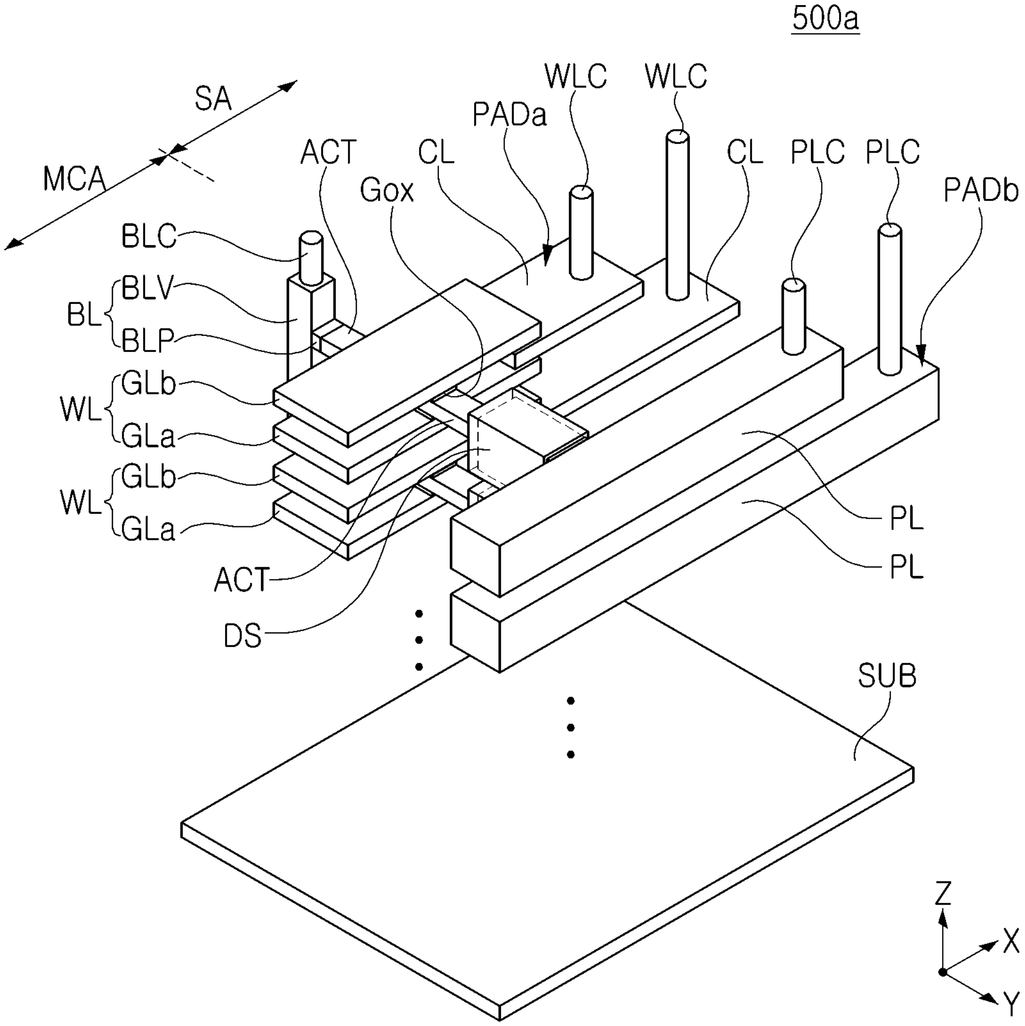
FIGS. 15A and 15B are diagrams illustrating an example of a semiconductor device.

A modified example of a semiconductor device will be described with reference to FIGS. 15A and 15B. FIG. 15A is a perspective diagram illustrating a modified example of a semiconductor device, and FIG. 15B is a cross-sectional diagram illustrating an example in which a portion of a memory cell array region is cut-out in a Y-direction, illustrating a modified example of a semiconductor device.

Figure 15B:
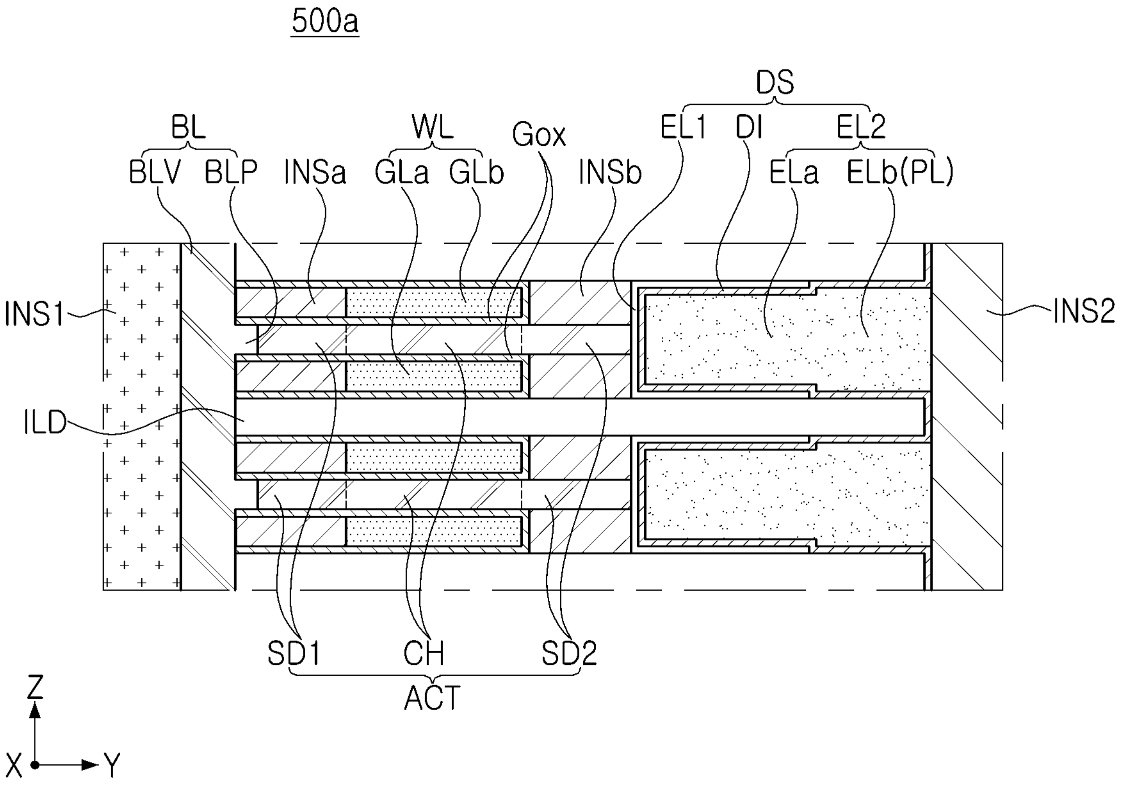

Referring to FIGS. 15A and 15B, the semiconductor device 500_a_ includes a base SUB, first conductive lines WL, CL, data storage structures DS, second conductive lines PL, bit lines BL, active layers ACT, gate dielectric layers Gox, and contact plugs BLC, WLC, and PLC.

The base SUB may have a memory cell array region MCA and a staircase region SA. The base SUB may be a peripheral circuit structure including a peripheral circuit. For example, the base SUB may be the peripheral circuit structure 103 as described with reference to FIG. 10.

The first conductive lines WL and CL, the data storage structures DS, the second conductive lines PL, the bit lines BL, the active layers ACT, the gate dielectric layers Gox, and the contact plugs BLC, WLC, and PLC may be disposed on the base SUB.

The active layers ACT may be disposed on the memory cell array region MCA, and may be stacked in the Z-direction on the base SUB. Each of the active layers ACT may have a bar shape extending in the Y-direction.

The active layers ACT may be formed of the same material as that of the active layers 36 described with reference to FIGS. 1 to 9B. Each of the active layers ACT may include a first source/drain region (SD1 in FIG. 15B), a channel region (CH in FIG. 15B) and a second source/drain region (SD2 in FIG. 15B) arranged in order in the Y-direction similarly to the active layers 36 described with reference to FIGS. 1 to 9B.

The first conductive lines WL and CL may be stacked in the Z-direction on the base SUB. Each of the first conductive lines WL and CL may extend in the X-direction.

Each of the first conductive lines WL and CL may include a word line WL disposed on the memory cell array region MCA and a connection conductive line CL connected to the word line WL and disposed on the staircase region SA.

Each of the word lines WL may include a lower gate electrode GLa and an upper gate electrode GLb on the lower gate electrode GLa. In the word line WL and the active layer ACT adjacent to each other, the channel region CH of the active layer may be disposed between the lower gate electrode GLa and the upper gate electrode GLb.

The semiconductor device 500_a_ may include first insulating layers INSa between first side surfaces of the lower and upper gate electrodes GLa and GLb and the bit line BL, and second insulating layers INSb between the second side surfaces of the lower and upper gate electrodes GLa and GLb and the data storage structures DS.

In the lower and upper gate electrodes GLa and GLb, the first side surfaces may oppose the bit line BL, and the second side surfaces may oppose the data storage structures DS.

The gate dielectric layers Gox cover the upper and lower surfaces of each of the lower and upper gate electrodes GLa and GLb and may extend to a region between the second side surfaces of the lower and upper gate electrodes GLa and GLb and the data storage structures DS. Accordingly, the gate dielectric layers Gox may include portions interposed between the lower and upper gate electrodes GLa and GLb and the channel regions CH.

The semiconductor device 500_a_ may further include an interlayer insulating layer ILD disposed between the word lines WL and the data storage structures DS adjacent to each other in the Z-direction.

The semiconductor device 500_a_ may include an insulating layer INS1 covering an external side of the bit line BL and an insulating layer INS2 covering an external side of the second electrodes EL2.

In one of the first conductive line, the connection conductive line CL connected to the word line WL may be in contact with and connected to the lower gate electrode GLa and the upper gate electrode GLb between the memory cell array region MCA and the staircase region SA.

A region between the memory cell array region MCA and the staircase region SA may be an overlapping region in which the connection conductive line CL and the word line WL may vertically overlap each other.

In a region between the memory cell array region MCA and the staircase region SA, that is, an overlapping region, a lower surface of the connection conductive line CL may be in contact with an upper surface of the lower gate electrode GLa, and an upper surface of the connection conductive line CL may be in contact with a lower surface of the upper gate electrode GLb.

On the staircase region SA, the connection conductive lines CL may include gate pad regions PADa arranged in a staircase shape. Accordingly, the gate pad regions PADa of the first conductive lines WL and CL may have a thickness greater than those of the lower gate electrode GLa and the upper gate electrode GLb.

The second conductive lines PL may be stacked in the Z-direction on the base SUB. Each of the second conductive lines PL may extend from the memory cell array region MCA to the staircase region SA. Each of the second conductive lines PL may have a line shape extending in the X-direction. The second conductive lines PL may include electrode pad regions PADb arranged in a staircase shape in the staircase region SA. The second conductive lines PL may correspond to the second electrodes 79 described above with reference to FIGS. 1 to 9B.

In some implementations, the second conductive lines PL may be referred to as electrode lines or second electrodes.

The data storage structures DS may correspond to the data storage structures DS described with reference to FIGS. 1 to 9B. For example, each of the data storage structures DS may include a first electrode EL1, a second electrode EL2, and a dielectric layer DI between the first electrode EL1 and the second electrode EL2.

The first electrode EL1 may correspond to the first electrode 75 described with reference to FIGS. 1 to 9B, the dielectric layer DI may correspond to the dielectric layer 87 described with reference to FIGS. 1 to 9B, and the second electrode EL2 may correspond to the second electrode 89 described with reference to FIGS. 1 to 9B. For example, the second electrode EL2 may include a line portion ELb extending in the X-direction and a protrusion ELA extending in the Y-direction from the line portion ELb toward the bit line BL.

In each of the data storage structures DS, the first electrode EL1 may cover a side surface, a lower surface and an upper surface of the protrusion ELa.

In each of the data storage structures DS, the line portion ELb may be a second conductive line PL.

The bit line BL may include a vertical portion BLV extending in the Z-direction and an extension portions BLP extending from the vertical portion BLV and electrically connected to the first source/drain regions SD1 of the active layers ACT.

The contact plugs BLC, WLC, and PLC may include bit line contact plugs BLC, gate contact plugs WLC, and electrode contact plugs PLC.

The bit line contact plug BLC may be electrically connected to the bit line BL on the bit line BL. The gate contact plugs WLC may be electrically connected to the gate pad regions PADa on the gate pad regions PADa. The electrode contact plugs PLC may be electrically connected to the electrode pad regions PADb on the electrode pad regions PADb.

Figure 16:
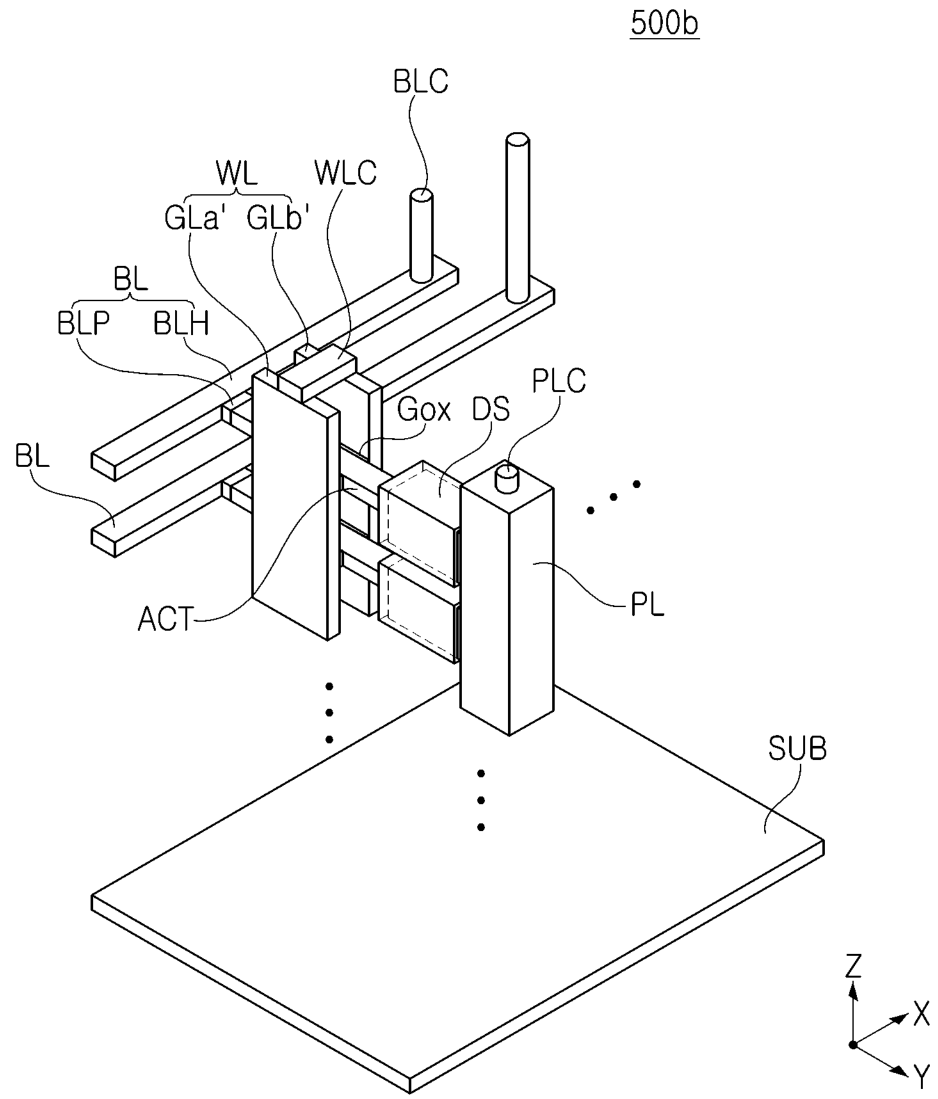
FIG. 16 is a perspective diagram illustrating an example of a semiconductor device.

A modified example of a semiconductor device will be described with reference to FIG. 16. FIG. 16 is a perspective diagram illustrating a modified example of a semiconductor device.

Referring to FIG. 16, in some implementations, the semiconductor device **500*b*** includes a base SUB, first conductive lines WL, data storage structures DS, second conductive lines PL, bit lines BL, active layers ACT, gate dielectric layers Gox, and contact plugs BLC, WLC, and PLC. The base SUB may have a memory cell array region MCA and a staircase region SA. The first conductive lines WL, the data storage structures DS, the second conductive lines PL, the bit lines BL, the active layers ACT, the gate dielectric layers Gox, and the contact plugs BLC, WLC, and PLC may be disposed on the base SUB.

The active layers ACT may be disposed on the memory cell array region MCA, and may be stacked in the Z-direction on the base SUB. Each of the active layers ACT may have a bar shape extending in the Y-direction.

The active layers ACT may be formed of the same material as that of the active layers 36 described with reference to FIGS. 1 to 9B. Each of the active layers ACT may include a first source/drain region, a channel region and a second source/drain region arranged in order in the Y-direction similarly to the active layers 36 described with reference to FIGS. 1 to 9B.

The first conductive lines WL may be arranged in the X-direction on the base SUB. Each of the first conductive lines WL may extend in the Z-direction. Each of the first conductive lines WL may include a first gate electrode GLa' and a second gate electrode GLb' spaced apart from the first gate electrode GLa' in the X-direction. In the first conductive word line WL and the active layer ACT adjacent to each other, the channel region of the active layer may be disposed between the first gate electrode GLa' and the second gate electrode GLb'.

The gate dielectric layers Gox may include portions interposed between the first and second gate electrodes GLa' and GLb' and the active layers ACT.

The second conductive lines PL may be arranged in the X-direction on the base SUB. Each of the second conductive lines PL may extend in the Z-direction.

The data storage structures DS may correspond to the data storage structures DS described with reference to FIGS. 1 to 9B. For example, each of the data storage structures DS may include a first electrode electrically connected to the second source/drain region in the active layer ACT, a second electrode spaced apart from the first electrode, and a dielectric between the first electrode and the second electrode. The second conductive lines PL may form the second electrodes of the data storage structures DS.

The first conductive lines WL may be word lines, and the second conductive lines PL may be electrode lines forming second electrodes of the data storage structures DS.

The bit lines BL may be stacked in the Z-direction on the base SUB. Each of the bit lines BL may extend in the X-direction.

The contact plugs BLC, WLC, and PLC may include bit line contact plugs BLC, gate contact plugs WLC, and electrode contact plugs PLC.

The bit line contact plug BLC may be electrically connected to the bit lines BL on bit line pad regions of the bit lines BL, arranged in a staircase shape.

One of the gate contact plugs WLC may be electrically connected to upper surfaces of the first and second gate electrodes GLa' and GLb' of one of the first conductive lines WL.

The electrode contact plugs PLC may be electrically connected to upper surfaces of the second conductive lines PL.

Figure 17:
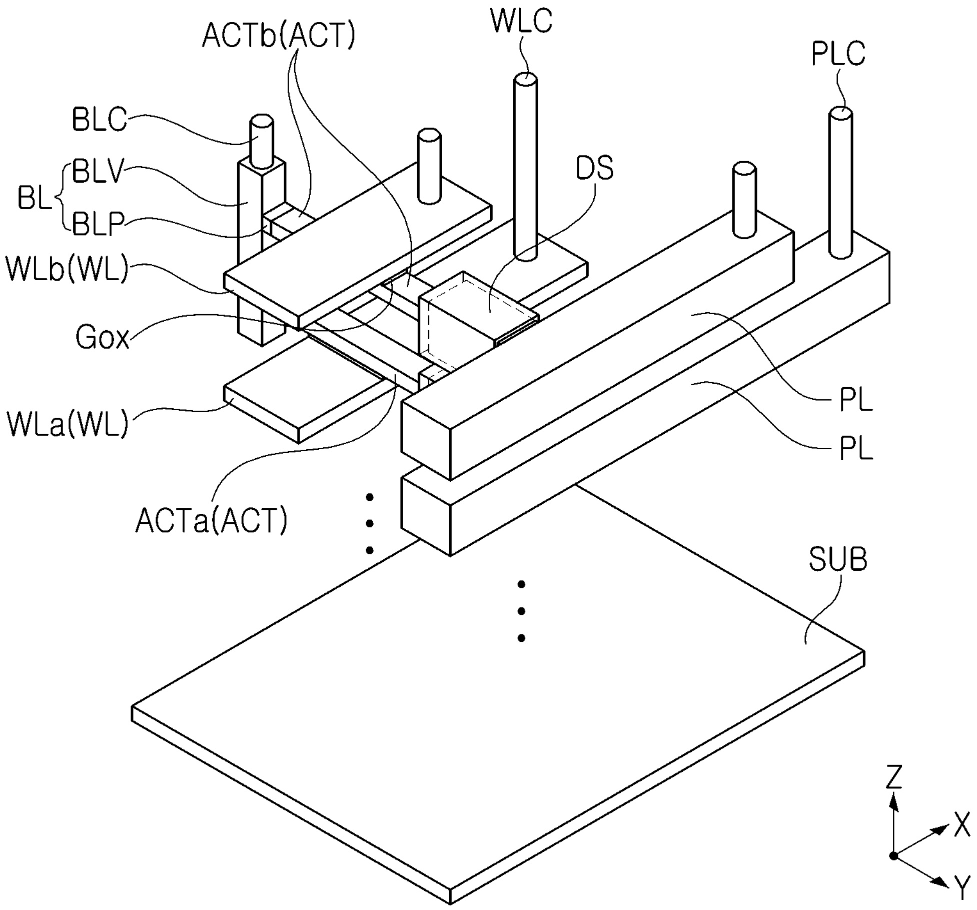
FIG. 17 is a perspective diagram illustrating an example of a semiconductor device.

A modified example of a semiconductor device will be described with reference to FIG. 17. FIG. 17 is a perspective diagram illustrating a modified example of a semiconductor device.

Referring to FIG. 17, a semiconductor device includes a base SUB, first conductive lines WL, data storage structures DS, second conductive lines PL, bit lines BL, active layers ACT, gate dielectric layers Gox, and contact plugs BLC, WLC, and PLC.

The base SUB may have a memory cell array region MCA and a staircase region SA. The base SUB may be a peripheral circuit structure including a peripheral circuit. For example, the base SUB may be the peripheral circuit structure 103 as described with reference to FIG. 10.

The first conductive lines WL, the data storage structures DS, the second conductive lines PL, the bit lines BL, the active layers ACT, the gate dielectric layers Gox, and the contact plugs BLC, WLC, and PLC may be disposed on the base SUB.

The active layers ACT may be disposed on the memory cell array region MCA, and may be stacked in the Z-direction on the base SUB. Each of the active layers ACT may have a bar shape extending in the Y-direction.

The active layers ACT may be formed of the same material as that of the active layers 36 described with reference to FIGS. 1 to 9B. Each of the active layers ACT may include a first source/drain region (SD1 in FIG. 15B), a channel region (CH in FIG. 15B) and a second source/drain region (SD2 in FIG. 15B).

The first conductive lines WL may be stacked in the Z-direction on the base SUB. Each of the first conductive lines WL may extend in the X-direction. The first conductive lines WL may be word lines.

A pair of active layers ACT adjacent to each other in the Z-direction may be disposed between a pair of first conductive lines WL adjacent to each other in the Z-direction among the first conductive lines WL. For example, the first conductive lines WL may include lower conductive line WLa and upper conductive line WLb adjacent to each other in the Z-direction, and the active layers ACT may include a lower active layer ACTa and an upper active layer ACTb adjacent to each other in the Z-direction. The lower active layer ACTa and the upper active layer ACTb may be disposed between the lower conductive line WLa and the upper conductive line WLb.

The gate dielectric layers Gox may be disposed between the first conductive lines WL and the active layers ACT.

The first conductive lines WL may include gate pad regions arranged in a staircase shape.

The second conductive lines PL may be stacked in the Z-direction on the base SUB. Each of the second conductive lines PL may have a line shape extending in the X-direction. The second conductive lines PL may include electrode pad regions arranged in a staircase shape.

In some implementations, the second conductive lines PL may be referred to as electrode lines or second electrodes.

The data storage structures DS may correspond to the data storage structures DS described with reference to FIGS. 1 to 9B. For example, each of the data storage structures DS may include a first electrode (EL1 in FIG. 15B), a second electrode (EL2 in FIG. 15B), and the dielectric layer (DI in FIG. 15B) between the first electrode (EL1 in FIG. 15B) and the second electrode (EL2 in FIG. 15B).

The second conductive lines PL may form the second electrodes of the data storage structures DS.

The bit line BL may include a vertical portion BLV extending in the Z-direction and an extension portions BLP extending from the vertical portion BLV and electrically connected to the first source/drain regions (SD1 in FIG. 15B) of the active layers ACT.

The contact plugs BLC, WLC, and PLC may include bit line contact plugs BLC, gate contact plugs WLC, and electrode contact plugs PLC.

The bit line contact plug BLC may be electrically connected to the bit line BL on the bit line BL. The gate contact plugs WLC may be electrically connected to gate pad regions of the first conductive lines WL. The electrode contact plugs PLC may be electrically connected to electrode pad regions of the second conductive lines PL.

Figure 18:
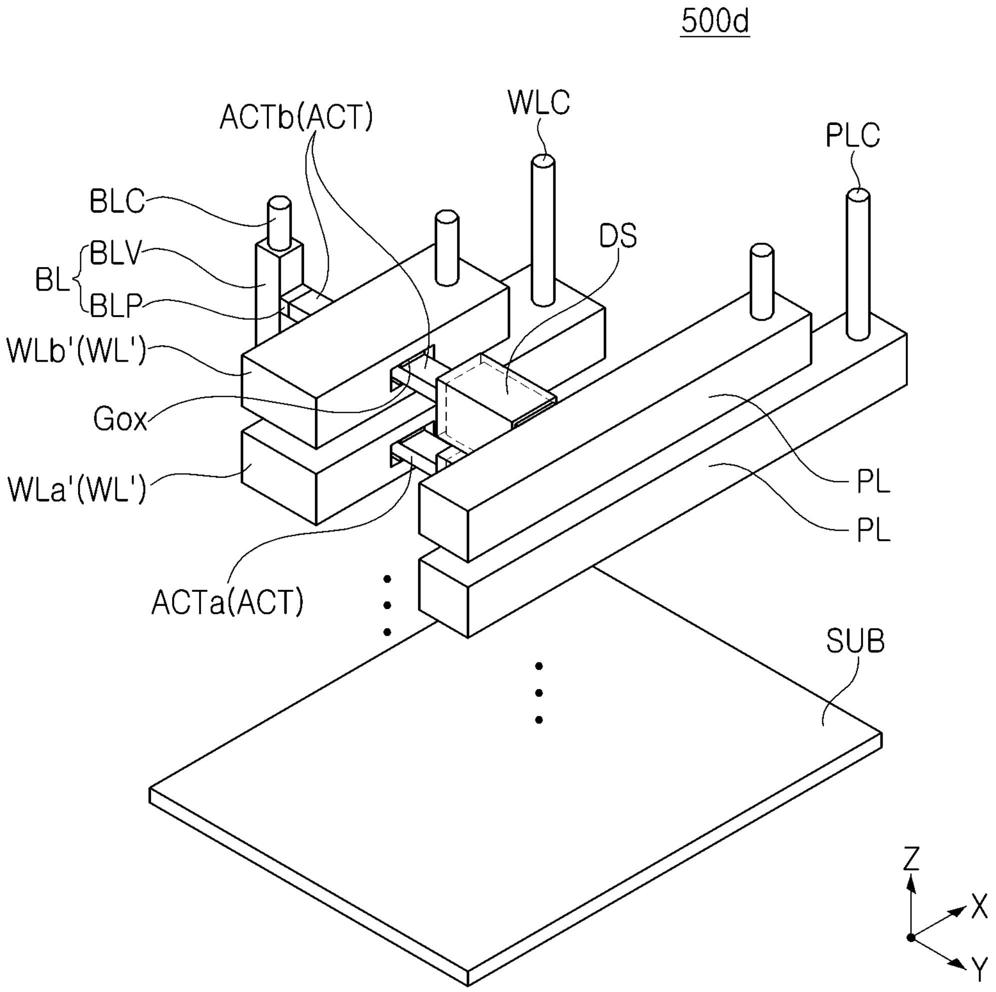
FIG. 18 is a perspective diagram illustrating an example of a semiconductor device.

A modified example of a semiconductor device will be described with reference to FIG. 18. FIG. 18 is a perspective diagram illustrating a modified example of a semiconductor device.

Referring to FIG. 18, the lower conductive line WLa described with reference to FIG. 17 is modified to be a lower conductive line WLa' surrounding a lower surface, an upper surface and a side surface of the lower active layer ACTa and extending in the X-direction. The upper conductive line WLb described with reference to FIG. 17 is modified to an upper conductive line WLb' extending in the X-direction and surrounding a lower surface, an upper surface and a side surface of the upper active layer ACTb.

Accordingly, the first conductive lines WL may be word lines surrounding a lower surface, an upper surface and a side surface of the active layers ACT and extending in the X-direction.

Figure 19:
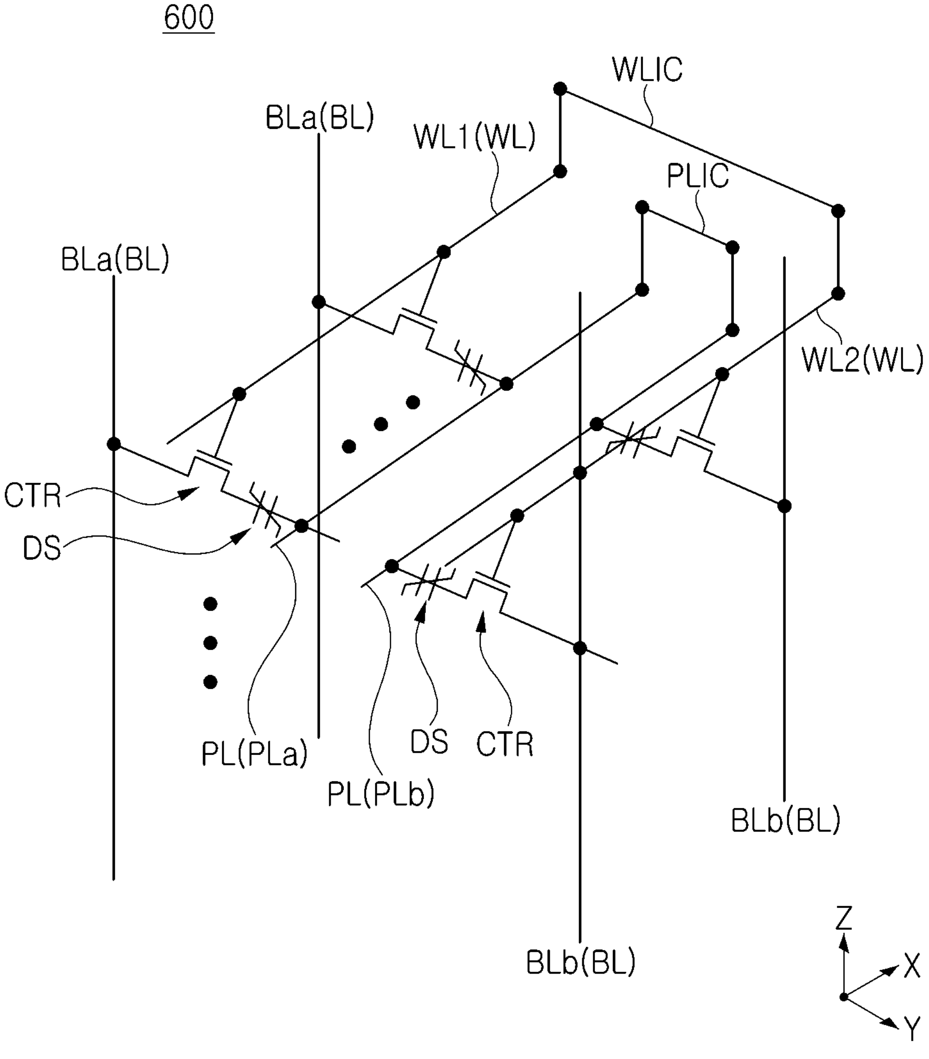
FIGS. 19 to 21 are diagrams illustrating an example of a semiconductor device.

A modified example of a semiconductor device will be described with reference to FIGS. 19, 20, and 21. FIG. 19 is a circuit diagram illustrating a modified example of a semiconductor device, FIG. 20 is a plan diagram illustrating a modified example of a semiconductor device, and FIG. 21 is a cross-sectional diagram illustrating a region taken along line V-V' in FIG. 20.

Figure 20:
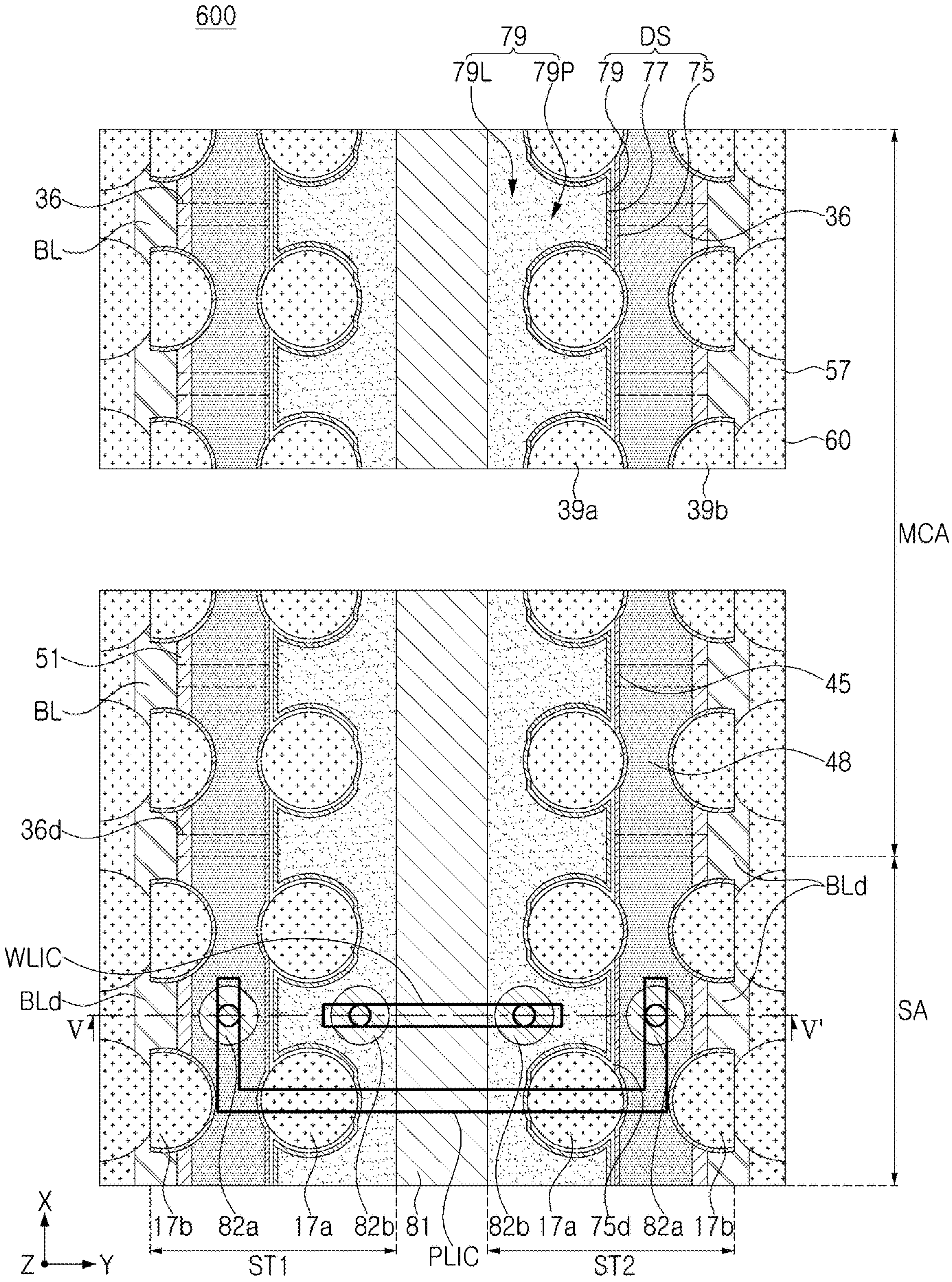
Figure 21:
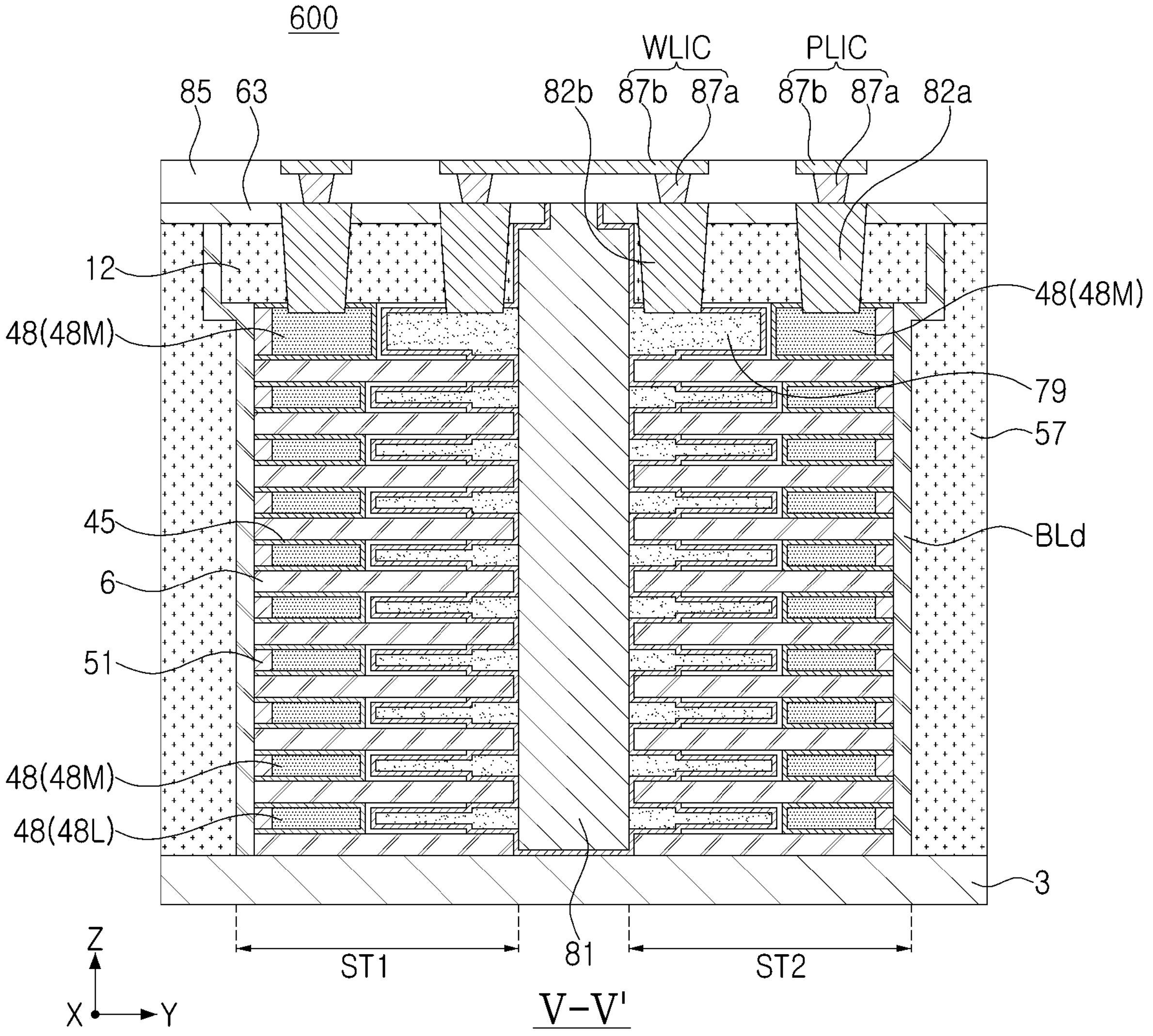

Referring to FIGS. 19, 20, and 21, a semiconductor device 600 includes wiring structures WLIC and PLIC modified in the semiconductor device 1 as described with reference to FIGS. 1 to 9B.

In the first stack structure ST1 described with reference to FIGS. 1 to 9B, the gate electrodes 48 may include first word lines WL1, the bit lines BL may be referred to as first bit lines BLa, and the electrode lines PL may be referred to as first electrode lines PLa. In the first stack structure ST1 described with reference to FIGS. 1 to 9B, the cell transistors CTR and the data storage structures DS may be disposed between the first bit lines BLa and the first electrode lines PLa.

In the second stack structure ST2 described with reference to FIGS. 1 to 9B, the gate electrodes 48 may include second word lines WL2, the bit lines BL may be referred to as second bit lines BLb, and the electrode lines PL may be referred to as second electrode lines PLb. In the second stack structure ST2 described with reference to FIGS. 1 to 9B, the cell transistors CTR and the data storage structures DS may be disposed between the second bit lines BLb and the second electrode lines PLb.

As described with reference to FIGS. 1 to 9B, the gate contact plugs 82*a* may be electrically connected to the gate pad regions PADa of the gate electrodes 48 of the first stack structure ST1 and the gate pad regions PADa of the gate electrodes 48 of the second stack structure ST2. Accordingly, the gate contact plugs 82*a* may be electrically connected to the gate pad regions PADa of the first word lines WL1 and the gate pad regions PADa of the second word lines WL2.

As described with reference to FIGS. 1 to 9B, the electrode contact plugs 82*b* may be electrically connected to the electrode pad regions PADb of the second electrodes 79 of the first stack structure ST1 and the electrode pad regions PADb of the second electrodes 79 of the second stack structure ST2. Accordingly, the electrode contact plugs 82*b* may be electrically connected to the electrode pad regions PADb of the first electrode lines PLa and the electrode pad regions PADb of the second electrode lines PLb.

Each of the wiring structures WLIC and PLIC may include a via 87*a* and a wiring 87*b*. The wiring structures WLIC and PLIC may include gate wiring structures WLIC electrically connected to the gate contact plugs 82*a* and electrode wiring structures PLIC electrically connected to the electrode contact plugs 82*b*.

The gate electrodes 48 of the first stack structure ST1 may be electrically connected to the gate electrodes 48 of the second stack structure ST2 by the gate wiring structures WLIC and the gate contact plugs 82*a*. Accordingly, the gate wiring structures WLIC may electrically connect the first word lines WL1 to the second word lines WL2 through the gate contact plugs 82*a*. Similarly, the electrode wiring structures PLIC may electrically connect the first electrode lines PLa to the second electrode lines PLb through the electrode contact plugs 82*b*.

Figure 22:
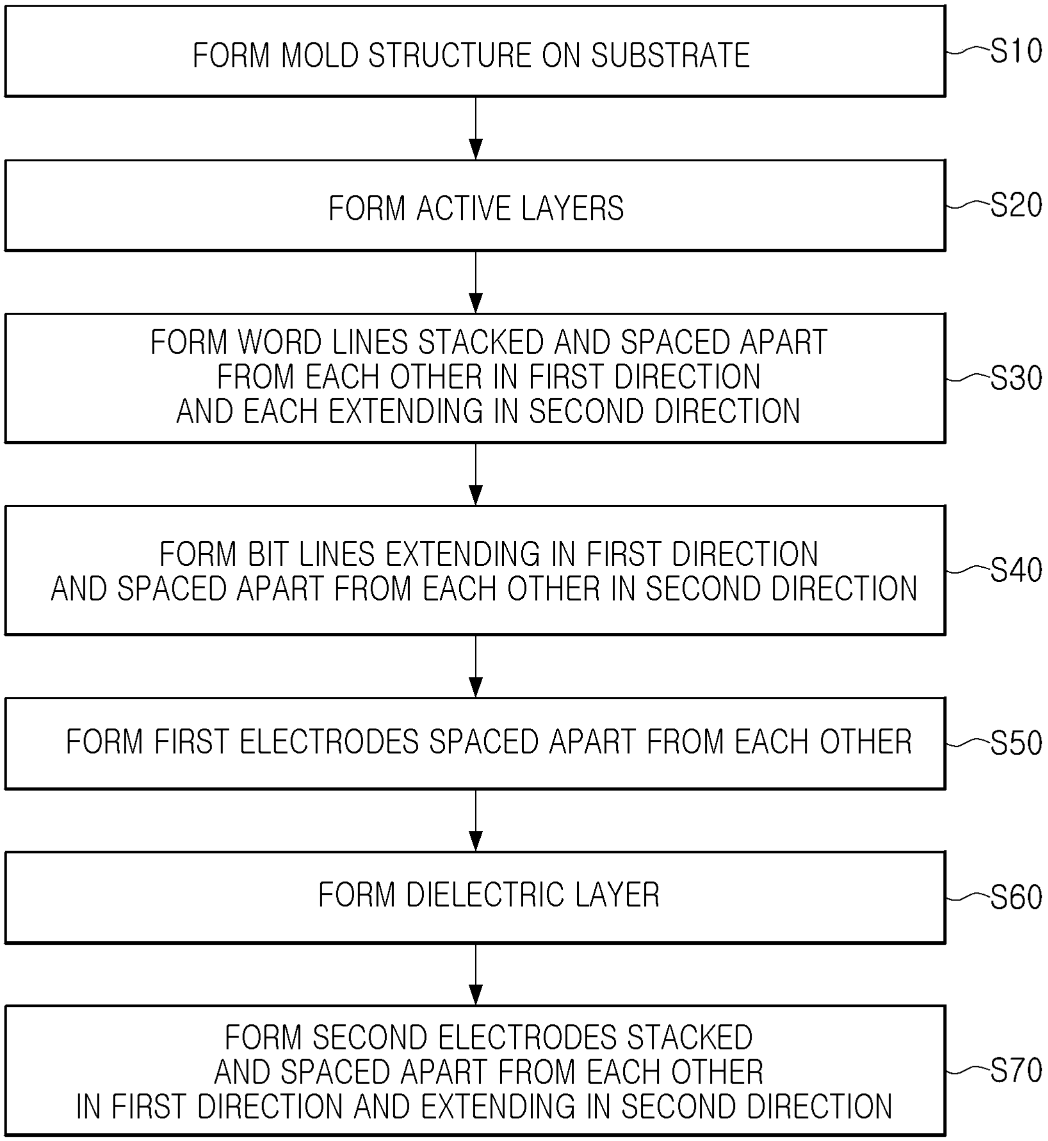
FIG. 22 is a diagram illustrating an example of a method of manufacturing a semiconductor device.
Figure 23:
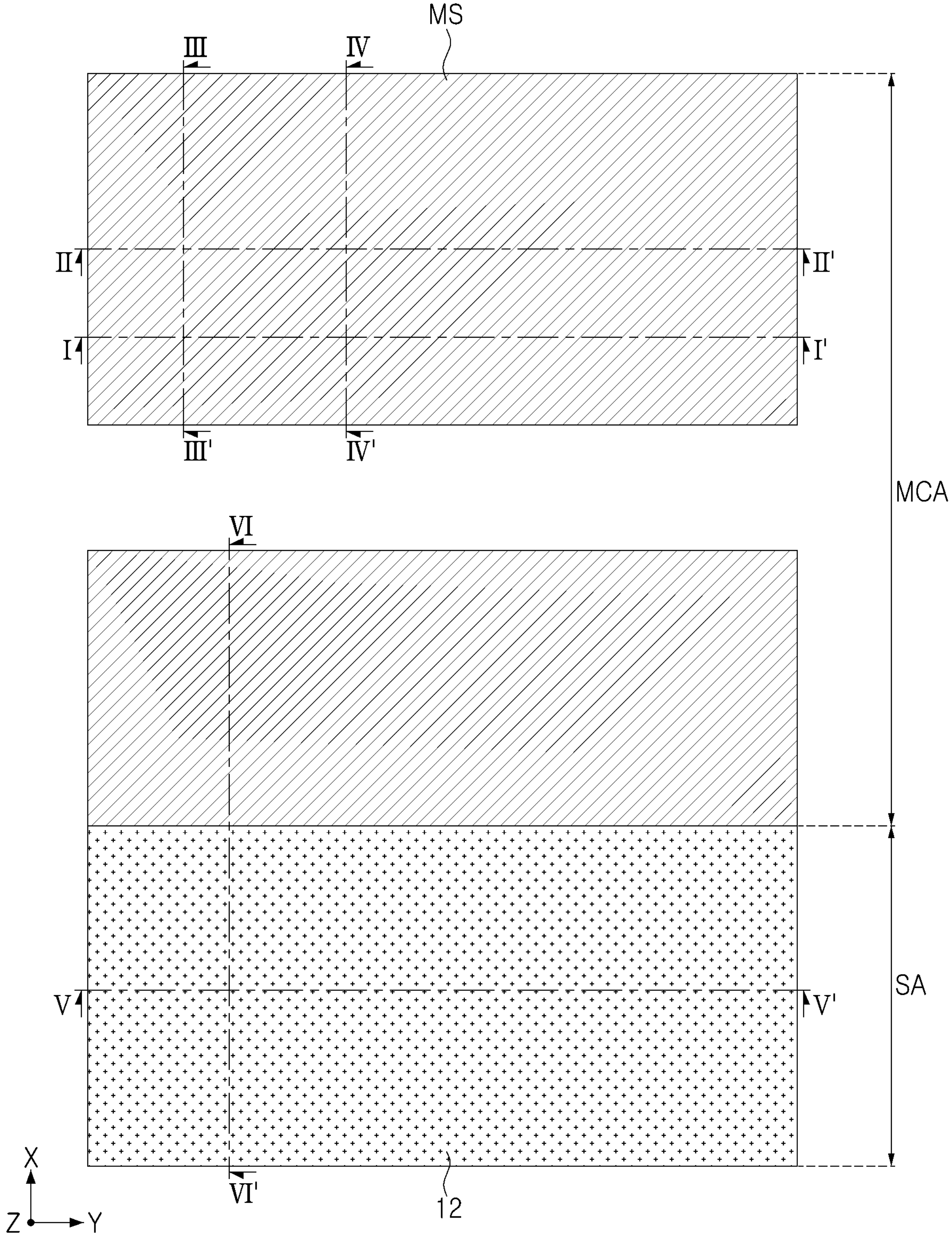
FIGS. 23 to 38D are diagrams illustrating an example of a method of manufacturing a semiconductor device.
Figure 24A:
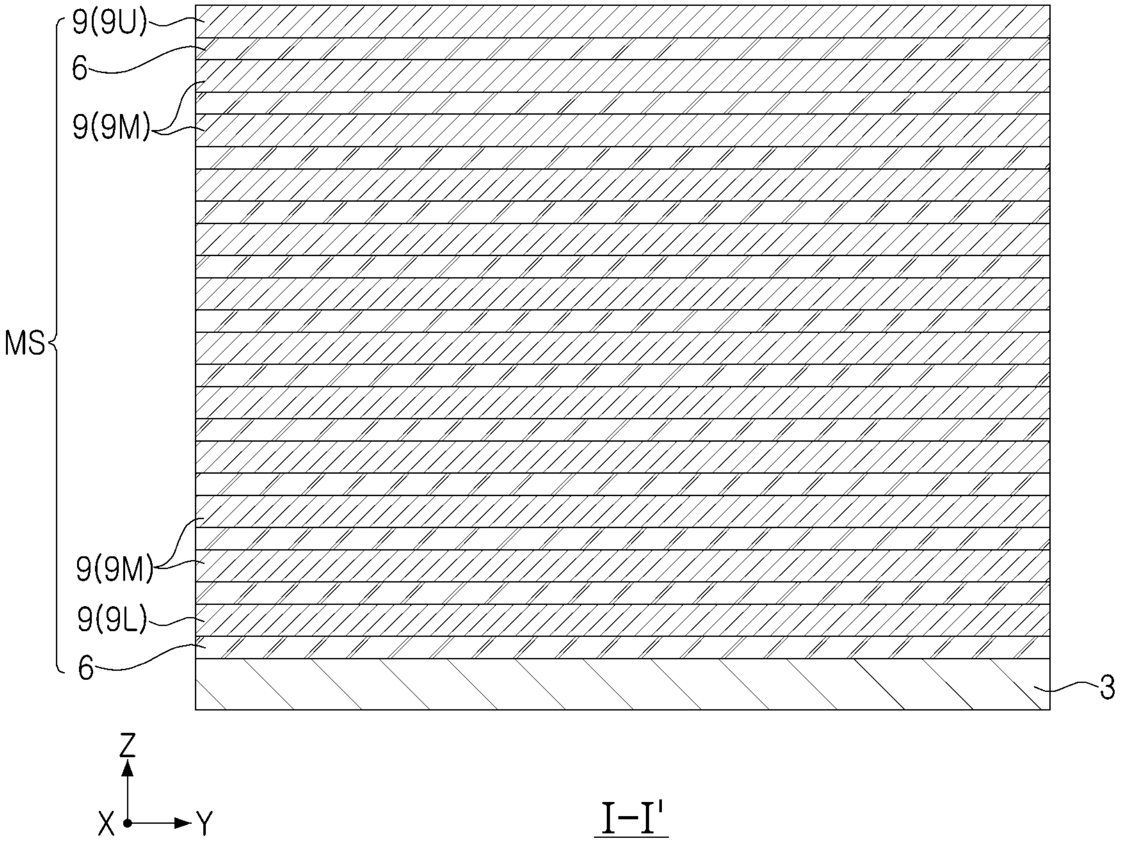
Figure 24B:
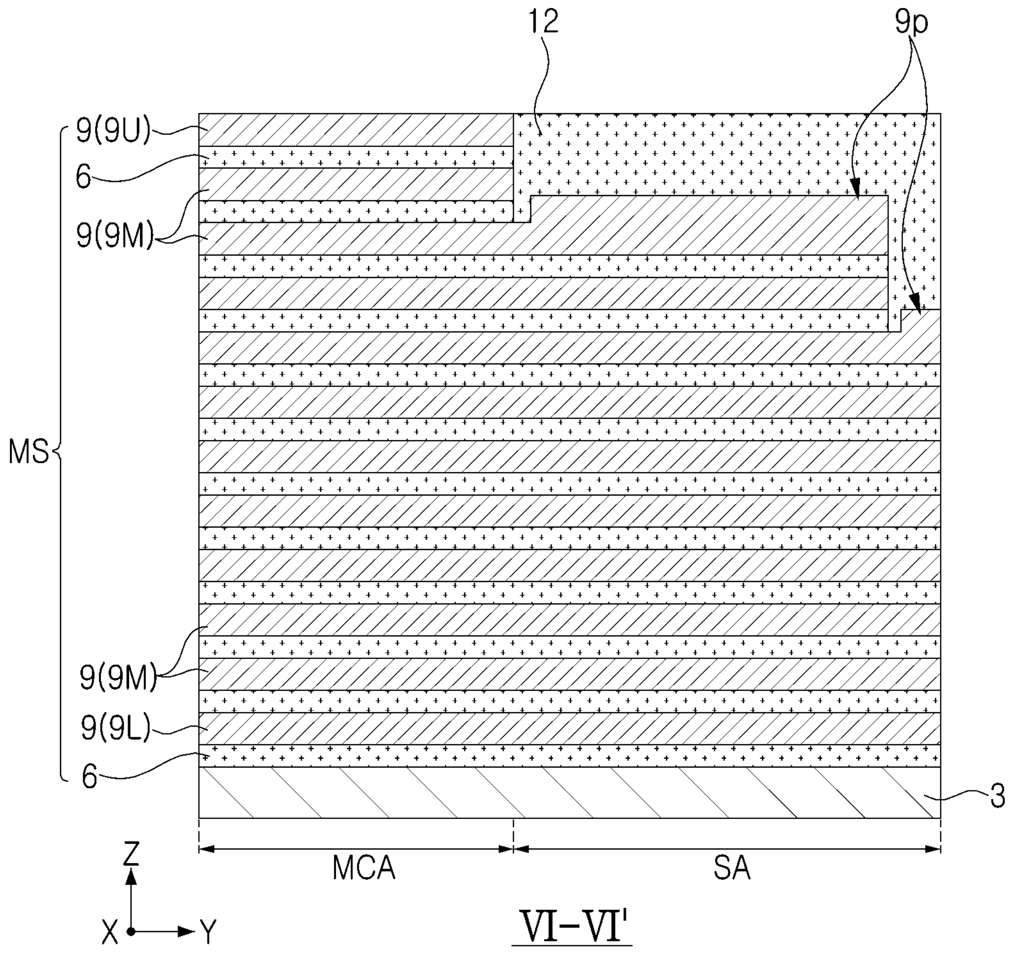
Figure 24C:
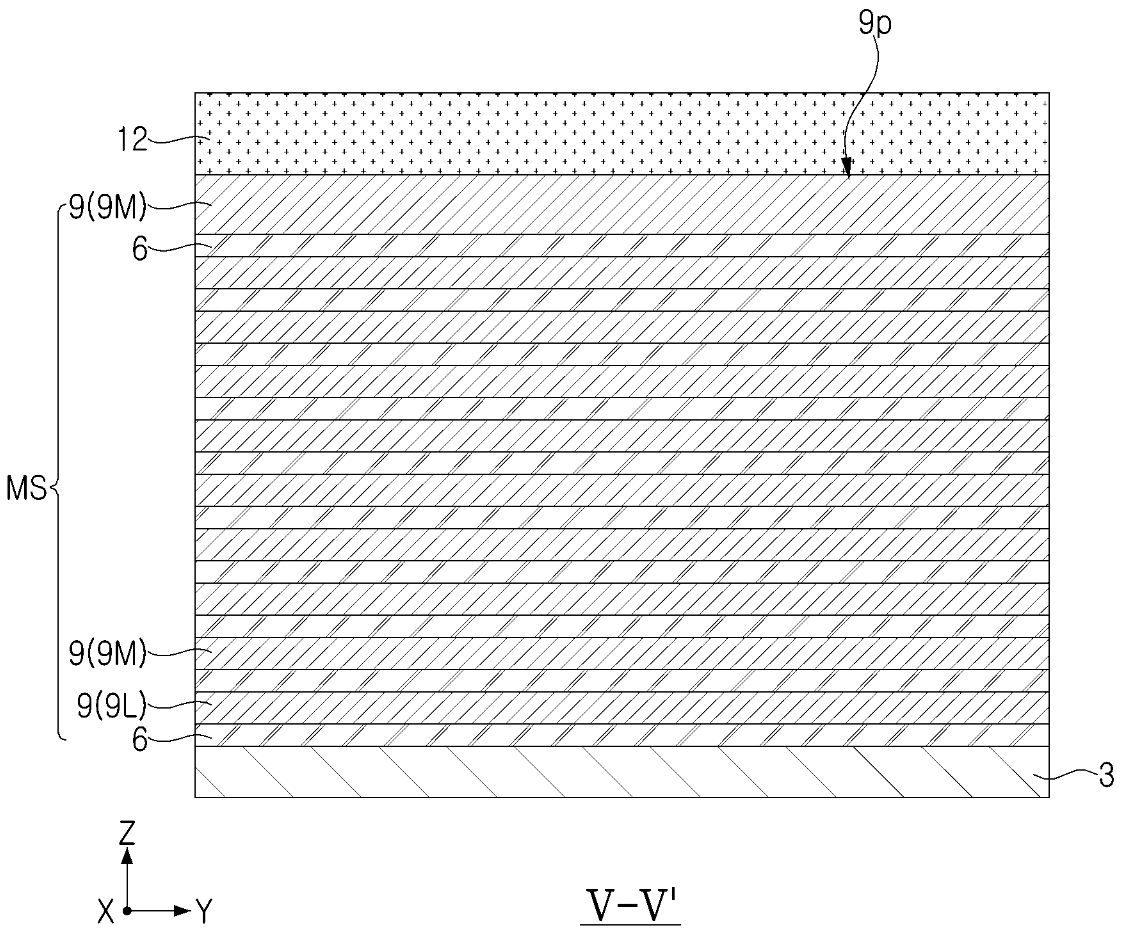
Figure 25:
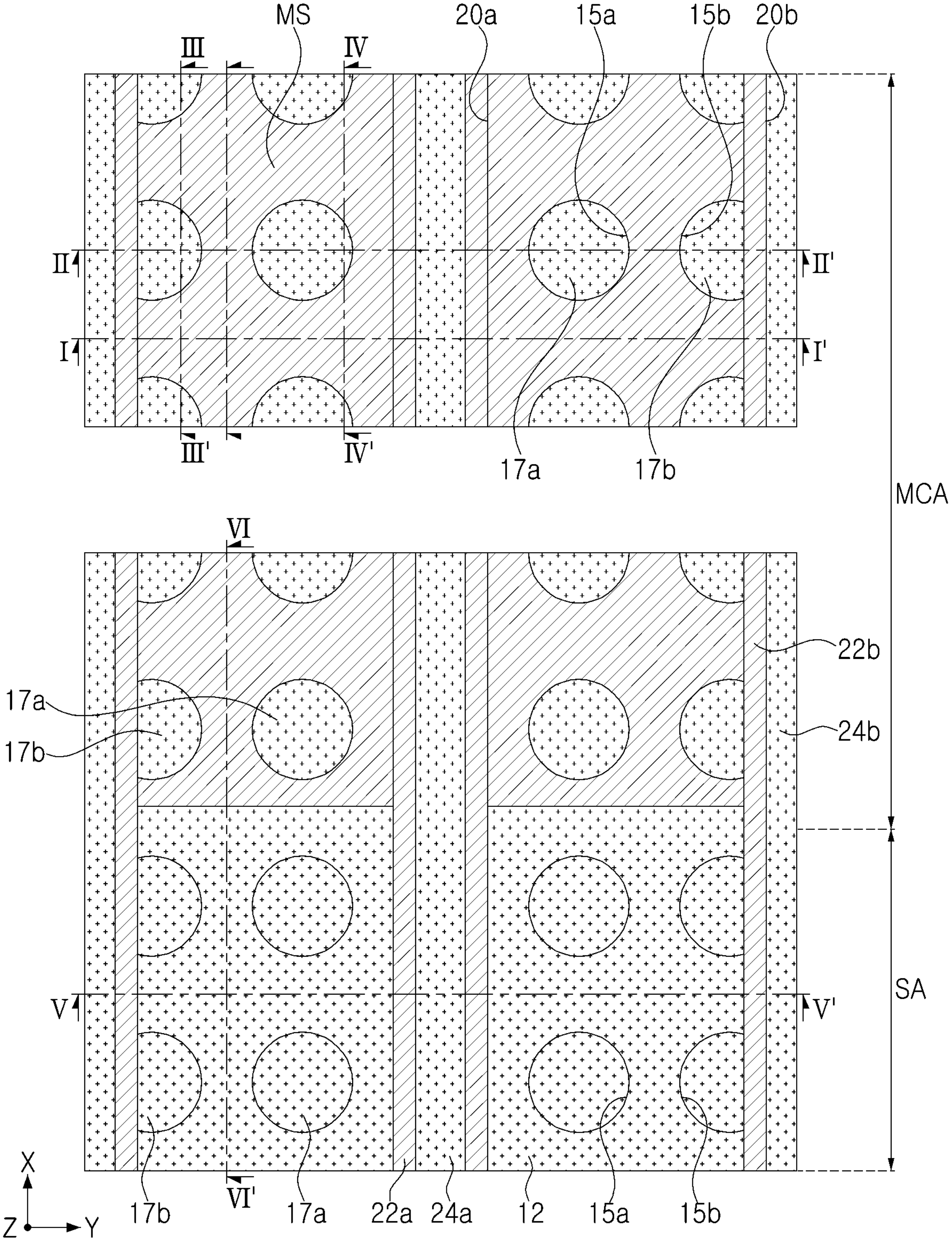
Figure 26A:
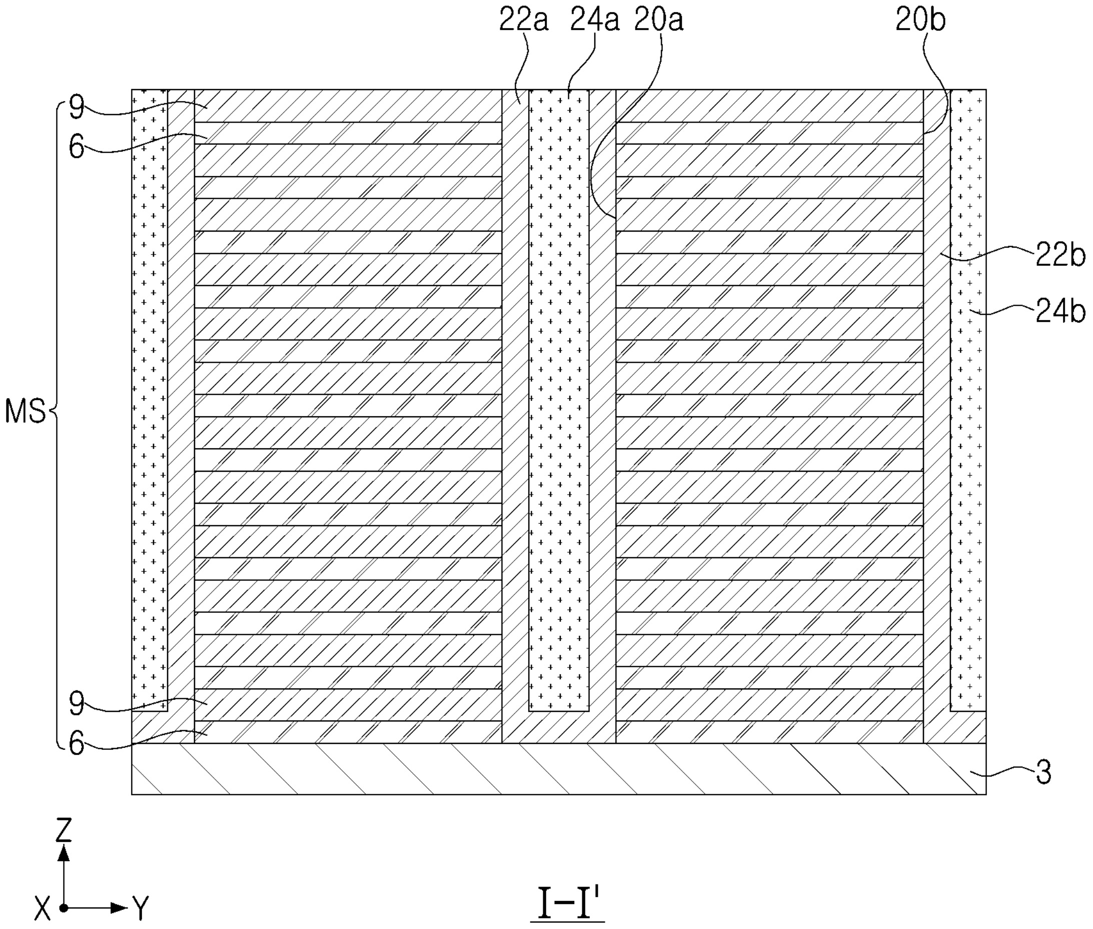
Figure 26B:
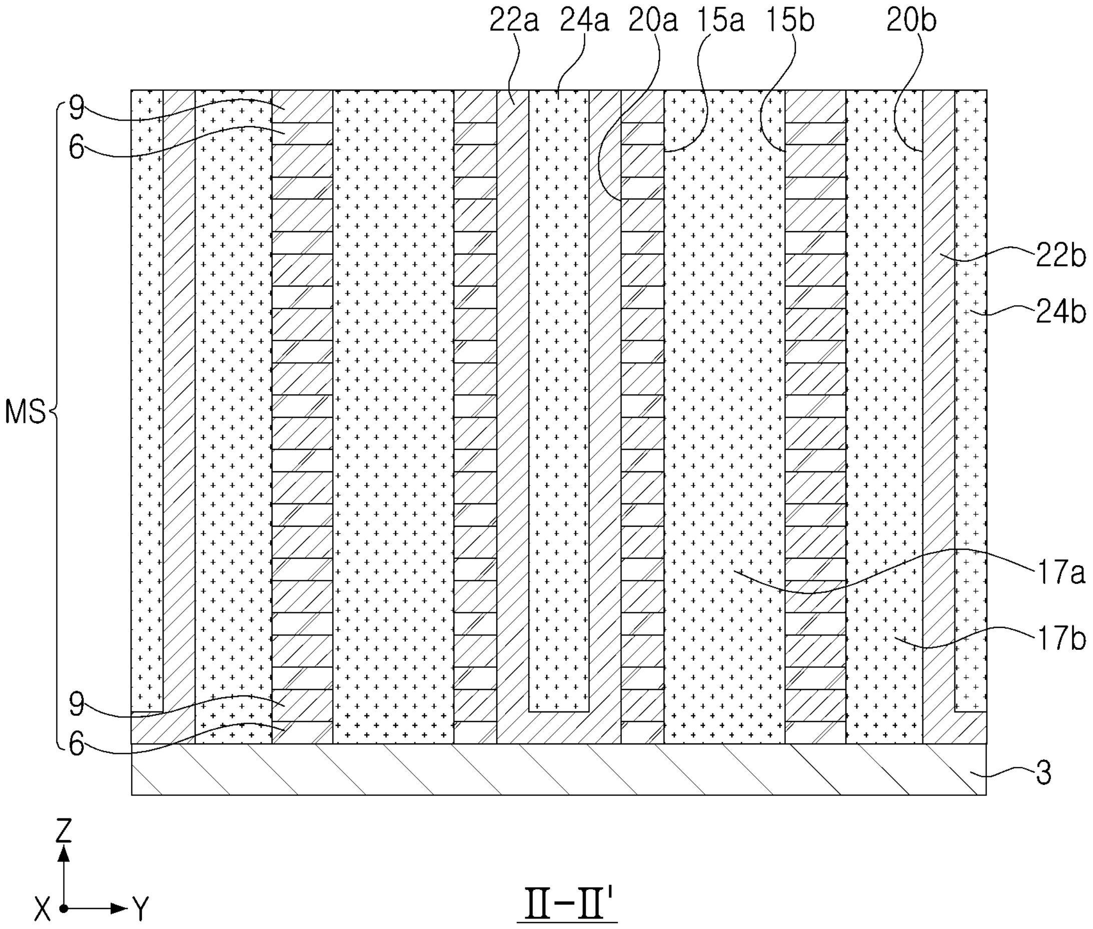
Figure 26C:
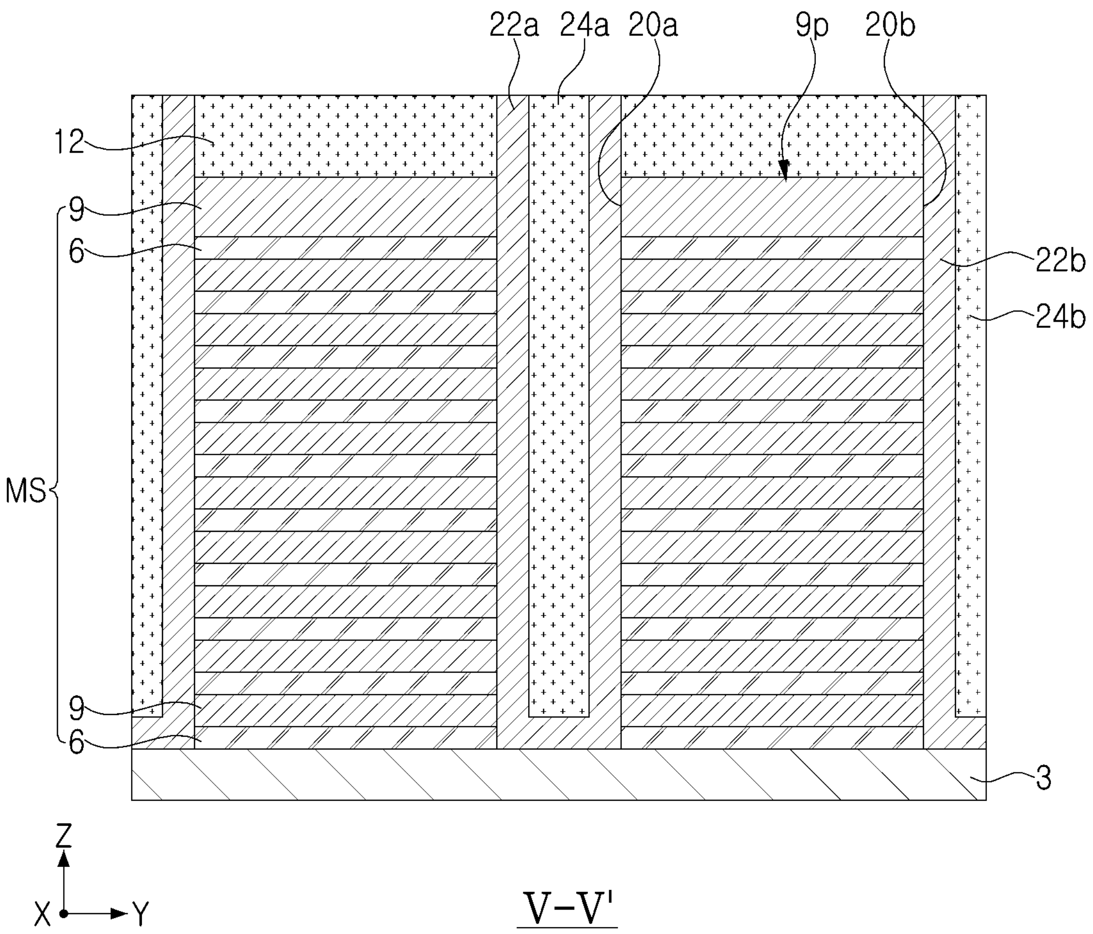
Figure 27:
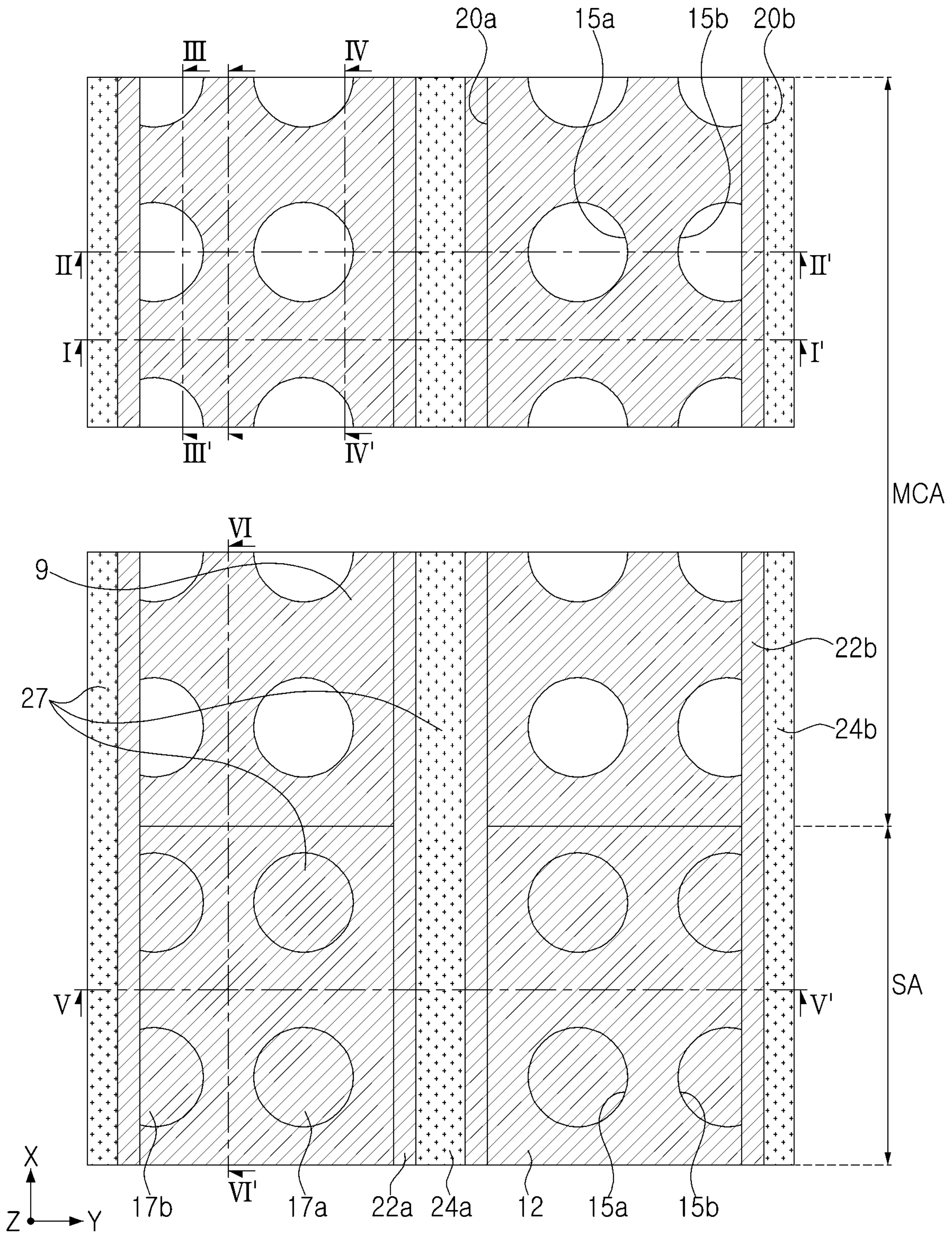
Figure 28A:
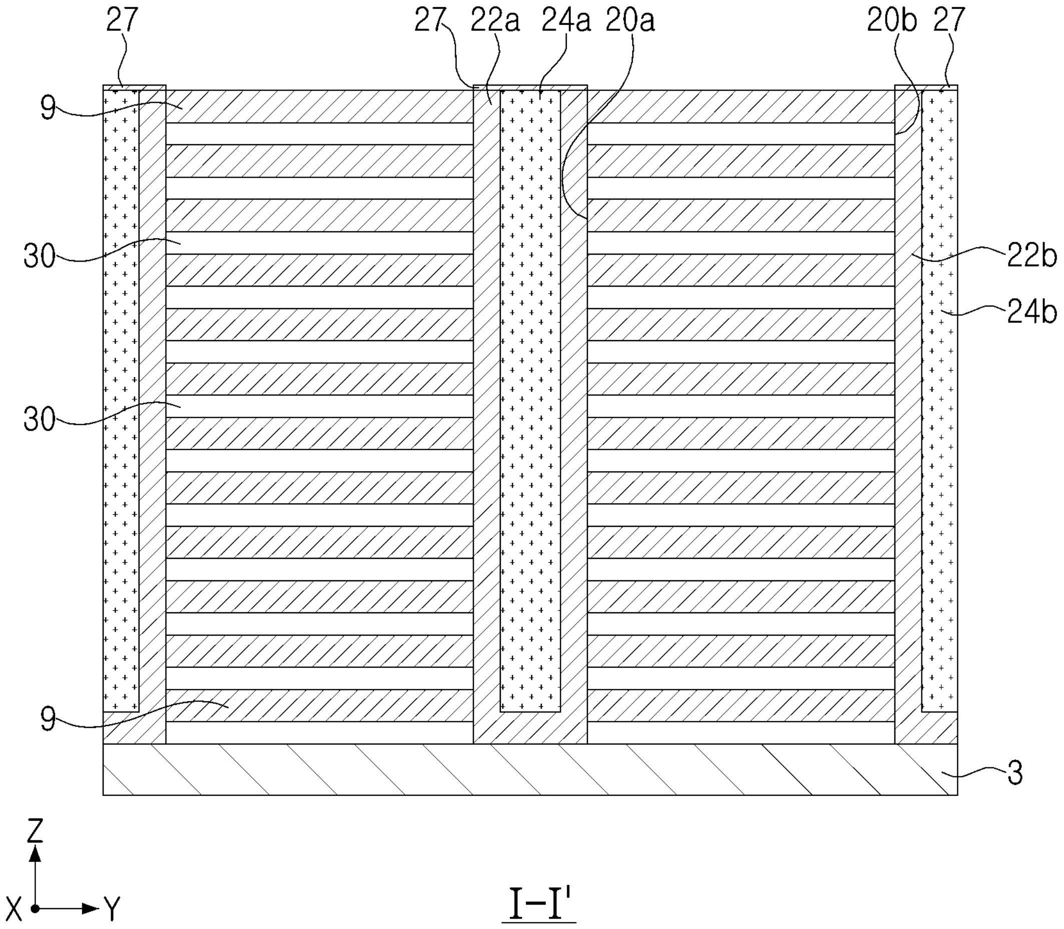
Figure 28B:
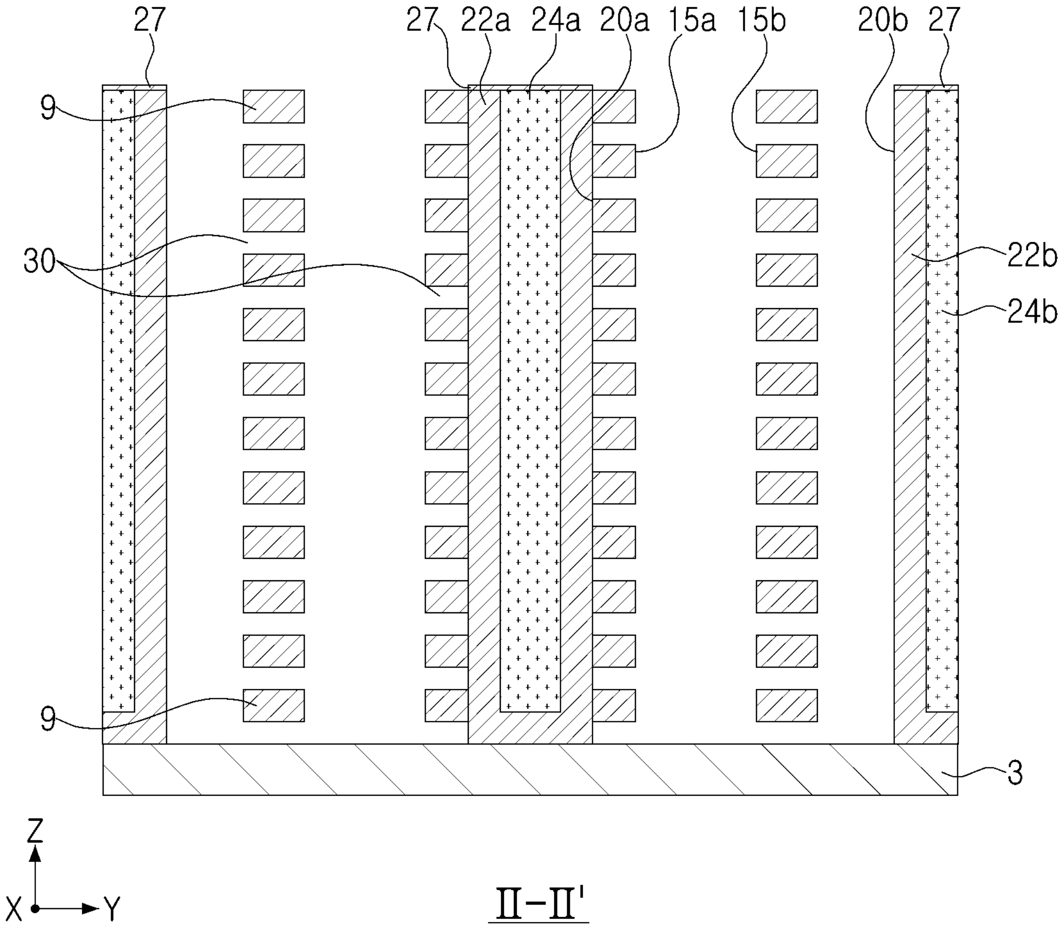
Figure 28C:
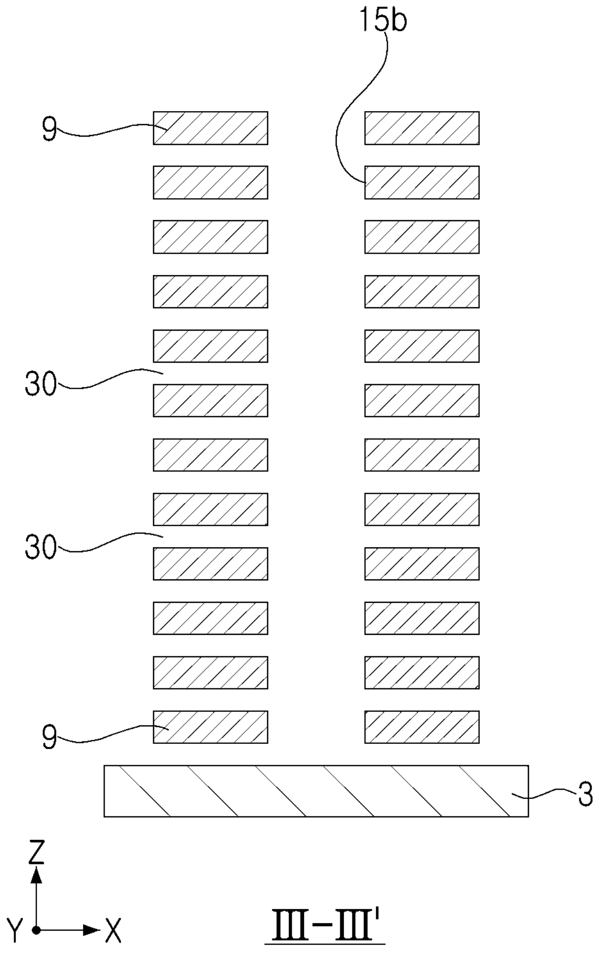
Figure 28D:
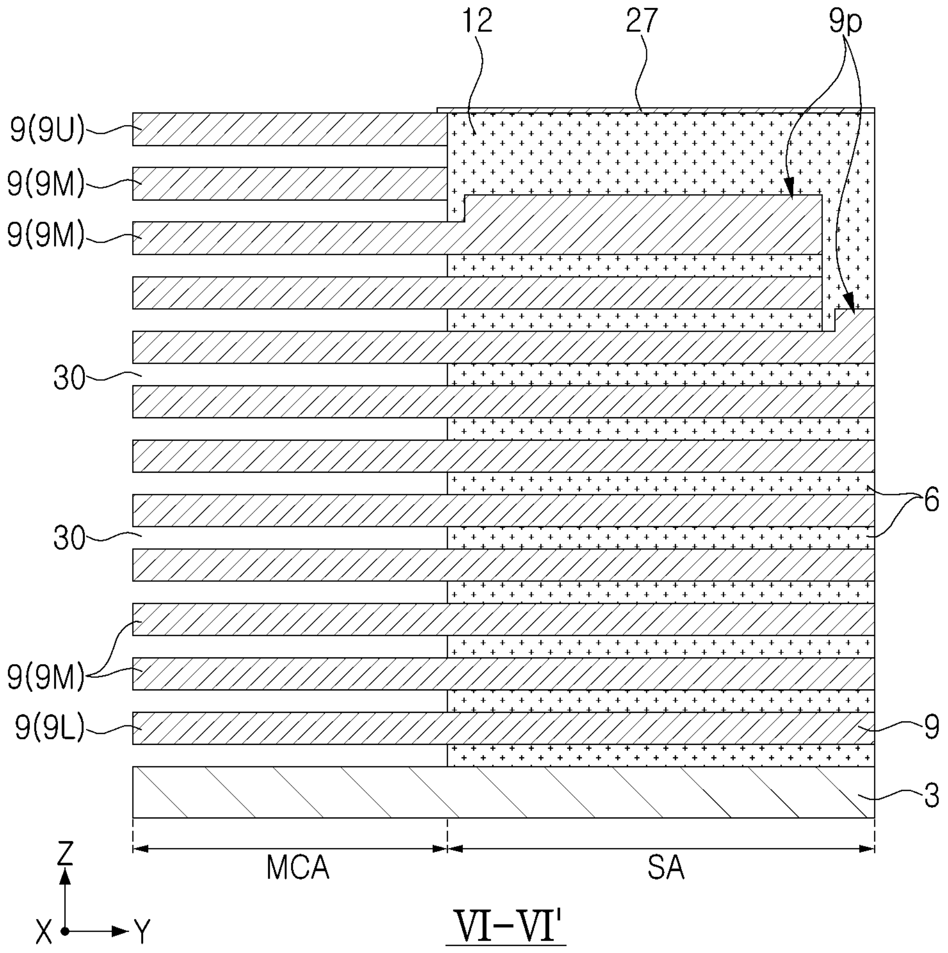
Figure 29:
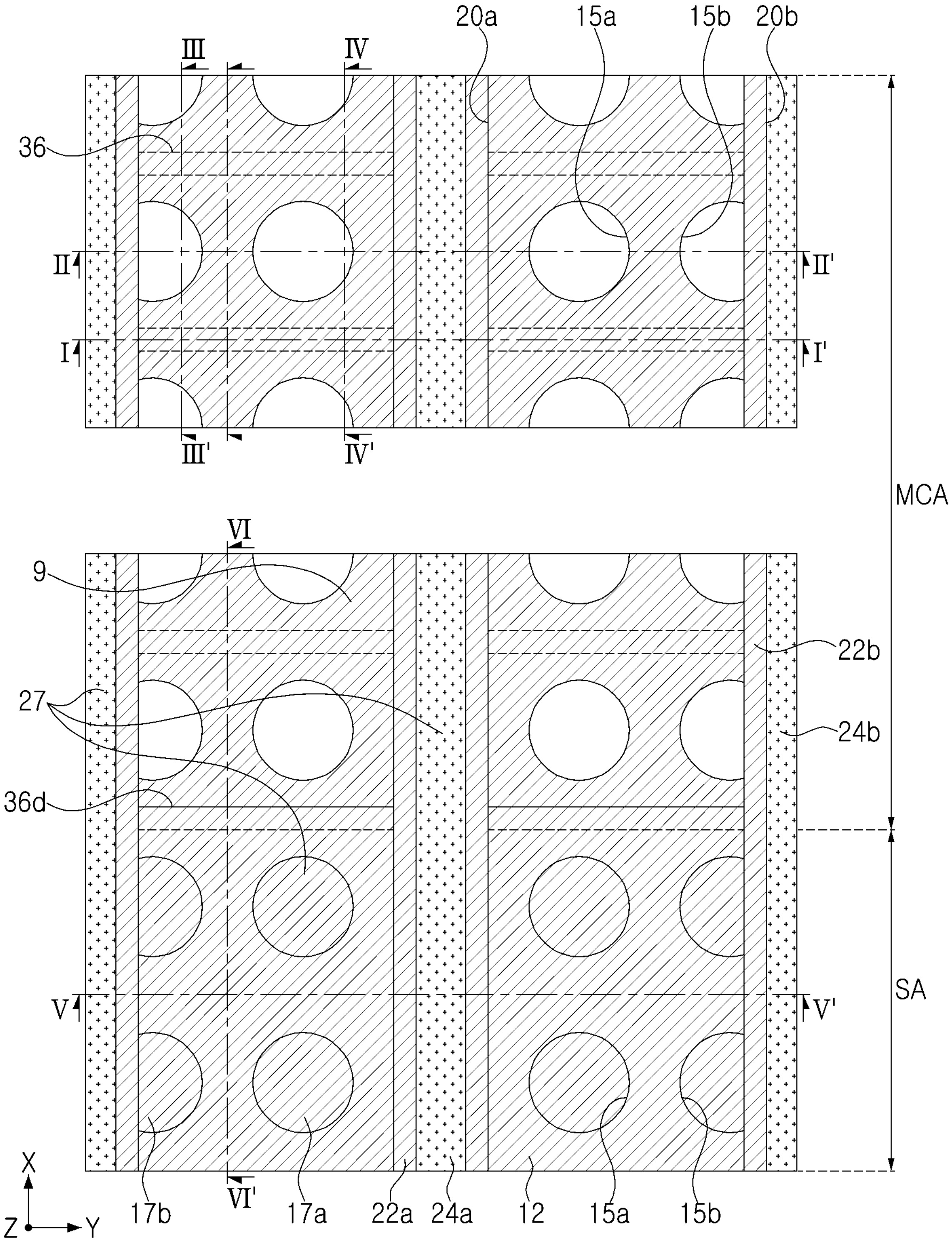

In the description below, an example of a method of manufacturing a semiconductor devices will be described with reference to FIGS. 22 to 38D. FIG. 22 is a flowchart illustrating a method of manufacturing a semiconductor devices. FIGS. 23, 25, 27, 29, 31, 33, 35, and 37 are plan diagram illustrating a method of manufacturing a semiconductor devices, FIGS. 24A, 26A, 28A, 30A, 32A, 34A, 36A, and 38A are diagrams illustrating a region taken along line I-I' in FIG. 2, FIGS. 26B, 28B, 30B, 32B, 34B, 36B, and 38B are diagrams illustrating a region taken along line II-II' in FIG. 2, FIGS. 28C, 30C, and 32C are diagrams illustrating a region taken along line III-III' in FIG. 2, FIGS. 32D, 36C and 38C are diagrams illustrating a region taken along line IV-IV' in FIG. 2. FIGS. 24C, 26C, 32E, 34C, 36D, and 38D are diagrams illustrating a regions taken along line V-V' in FIG. 2, and FIGS. 24B, 28D, 30D, and 32F are diagrams illustrating regions taken along line VI-VI' in FIG. 2.

Referring to FIGS. 22, 23, and 24A to 24C, a mold structure MS is formed on the substrate 3 (S10). The substrate 3 may have a memory cell array region MCA and a staircase region SA. Hereinafter, the substrate 3 will be referred to as "base."

The mold structure MS may include first material layers 6 and second material layers 9 alternately and repeatedly stacked. The second material layers 9 may include a lower second material layer 9L, an upper second material layer 9U on the lower second material layer 9L, and intermediate second material layers 9M between the lower second material layer 9L and the upper second material layer 9U. The first material layers 6 and the second material layers 9 may be formed of different materials. For example, the first material layers 6 may be formed of silicon oxide, and the second material layers 9 may be formed of silicon nitride.

On the staircase region SA, preliminary pad regions arranged in a staircase shape may be formed by patterning the mold structure MS, and pad regions 9*p* having an increased thickness may be formed by forming the same material as the material of the preliminary pad regions on the preliminary pad regions. The second material layers 9 may include the pad regions 9*p*.

A first capping insulating layer 12 covering the pad regions 9*p* may be formed on the staircase region SA. The first capping insulating layer 12 may be formed of an insulating material, such as silicon oxide.

Referring to FIGS. 25 and 26A to 26C, a plurality of holes 15*a* and 15*b* penetrating through a structure including the mold structure MS and the first capping insulating layer 12 are formed.

The plurality of holes 15*a* and 15*b* include first holes 15*a* arranged and spaced apart from each other in the X-direction and Y-direction and second holes 15*b* arranged and spaced apart from each other in the X-direction and Y-direction. The first holes 15*a* and the second holes 15*b* may be adjacent to each other in the X-direction.

In the X-direction, a pair of first holes 15*a* may be adjacent to each other, and a pair of first holes 15*a* may be disposed between the second holes 15*b*.

First pillars 17*a* in the first holes 15*a* and second pillars 17*b* in the second holes 15*b* may be formed. The first and second pillars 17*a* and 17*b* may be formed of an insulating material, such as silicon oxide.

A plurality of trenches 20*a* and 20*b* may be formed penetrating through a structure including the mold structure MS and the first capping insulating layer 12. Each of the plurality of trenches 20*a* and 20*b* may have a line shape extending in the Y-direction.

The plurality of trenches 20*a* and 20*b* may include first trenches 20*a* and second trenches 20*b* alternately arranged in the X-direction.

Hereinafter, the first trench 20*a* and a pair of second trenches 20*b* on both sides of the first trench 20*a* among the first trenches 20*a* and the second trenches 20*b* will be mainly described.

The first trench 20*a* may pass through a region between the first pillars 17*a* and may be spaced apart from the first and second pillars 17*a* and 17*b*. The second trenches 20*b* may penetrate through a portion of the second pillars 17*b* and may expose the second pillars 17*b*.

Liner layers 22*a* and 22*b* and gap-filling layers 24*a* and 24*b* may be formed in each of the plurality of trenches 20*a* and 20*b*. For example, a first liner layer 22*a* covering the internal wall of the first trench 20*a* and a first gap-filling layer 24*a* filling the first trench 20*a* on the first liner layer 22*a* may be formed, and a second liner layer 22*b* covering internal walls of the second trenches 20*b* and a second gap-filling layer 24*b* filling the second trenches 20*b* on the second liner layer 22*b* may be formed. The liner layers 22*a* and 22*b* may be formed of silicon nitride, and the gap-filling layers 24*a* and 24*b* may be formed of silicon oxide.

Referring to FIG. 27, and FIG. 28A to FIG. 28D, a first mask layer 27 covering first and second liner layers 22*a* and 22*b* and the first and second gap-filling layers 24*a* and 24*b* and covering the first and second pillars 17*a* and 17*b* disposed on the staircase region SA are formed. Accordingly, the first and second pillars 17*a* and 17*b* disposed on the memory cell array region MCA may be exposed by the first mask layer 27.

The first and second holes 15*a* and 15*b* may be formed by removing the first and second pillars 17*a* and 17*b* exposed by the first mask layer 27 from the memory cell array region MCA.

Void spaces 30 may be formed on the memory cell array region MCA by removing the material layers 6 exposed by the first and second holes 15*a* and 15*b*. The material layers 6 may be removed on the memory cell array region MCA and may remain on the staircase region SA.

Referring to FIGS. 22, 29, and 30A to 30D, active layers 36 are formed (S20). For example, the active layers 36 and the cell interlayer insulating layers 33 may be formed in the void spaces 30.

The forming the active layers 36 and the cell interlayer insulating layers 33 may include forming preliminary active layers covering internal walls of the void spaces 30, forming the cell interlayer insulating layers 33 filling the void spaces 30 covered by the preliminary active layers, and forming the active layers 36 by partially etching the preliminary active layers.

In a plan diagram, the active layers 36 may have a bar shape extending in the X-direction.

Figure 30A:
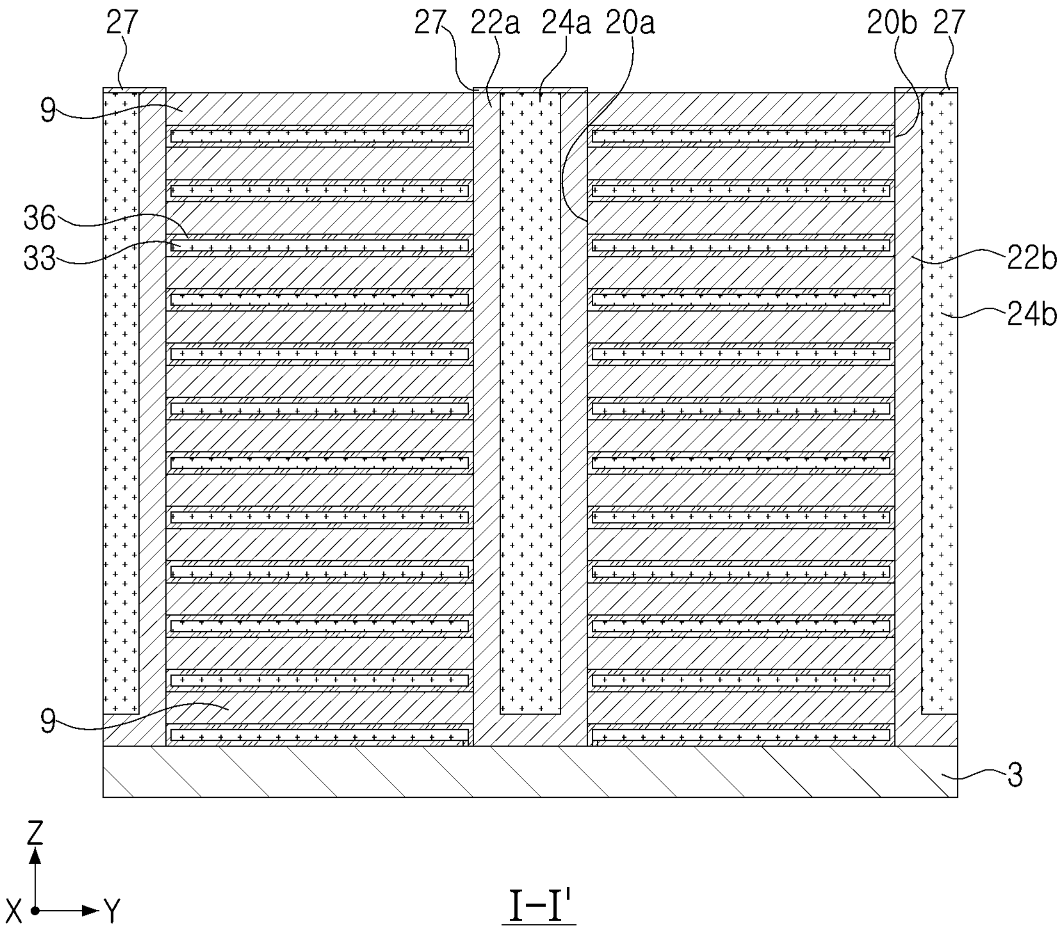
Figure 30B:
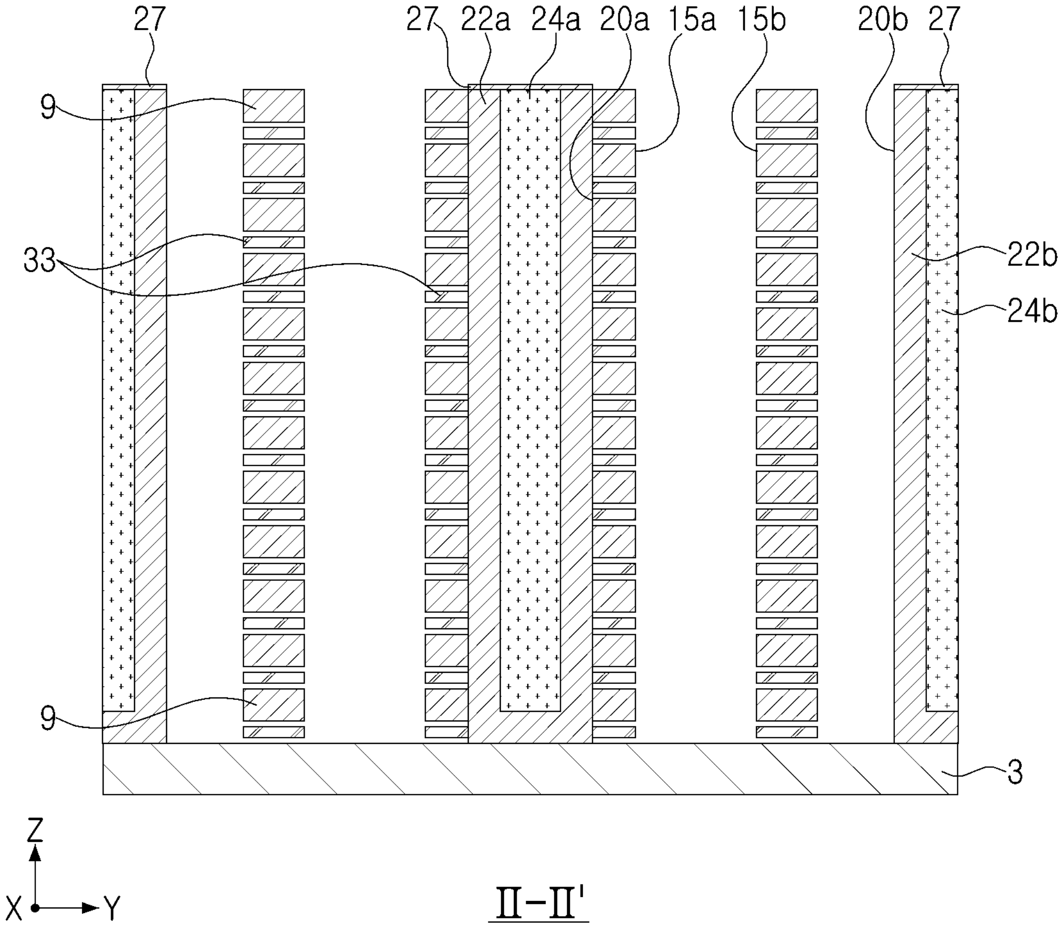
Figure 30C:
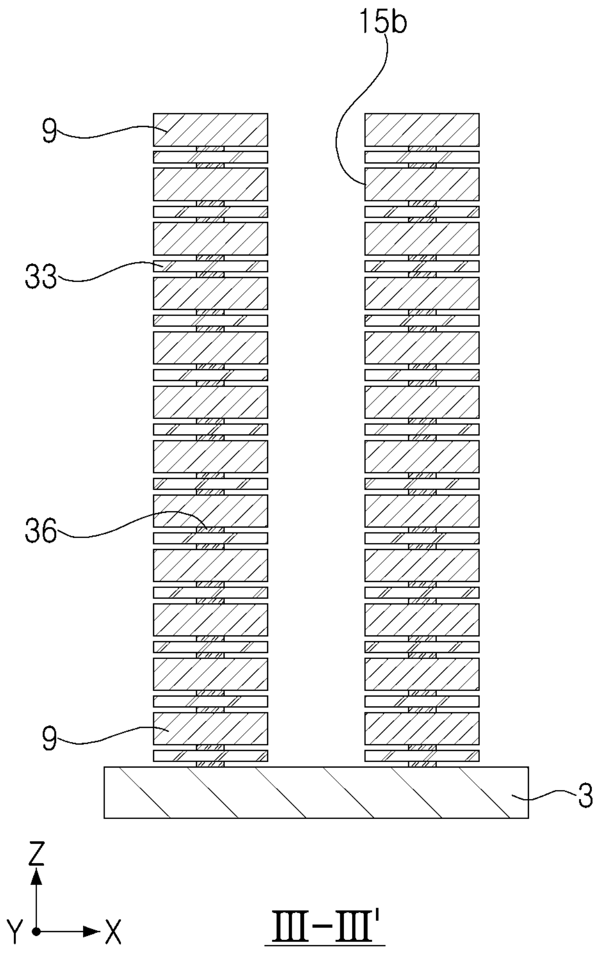

In the cross-sectional structure as illustrated in FIG. 30A, each of the active layers 36 has a shape surrounding each of the interlayer insulating layers 33.

Figure 30D:
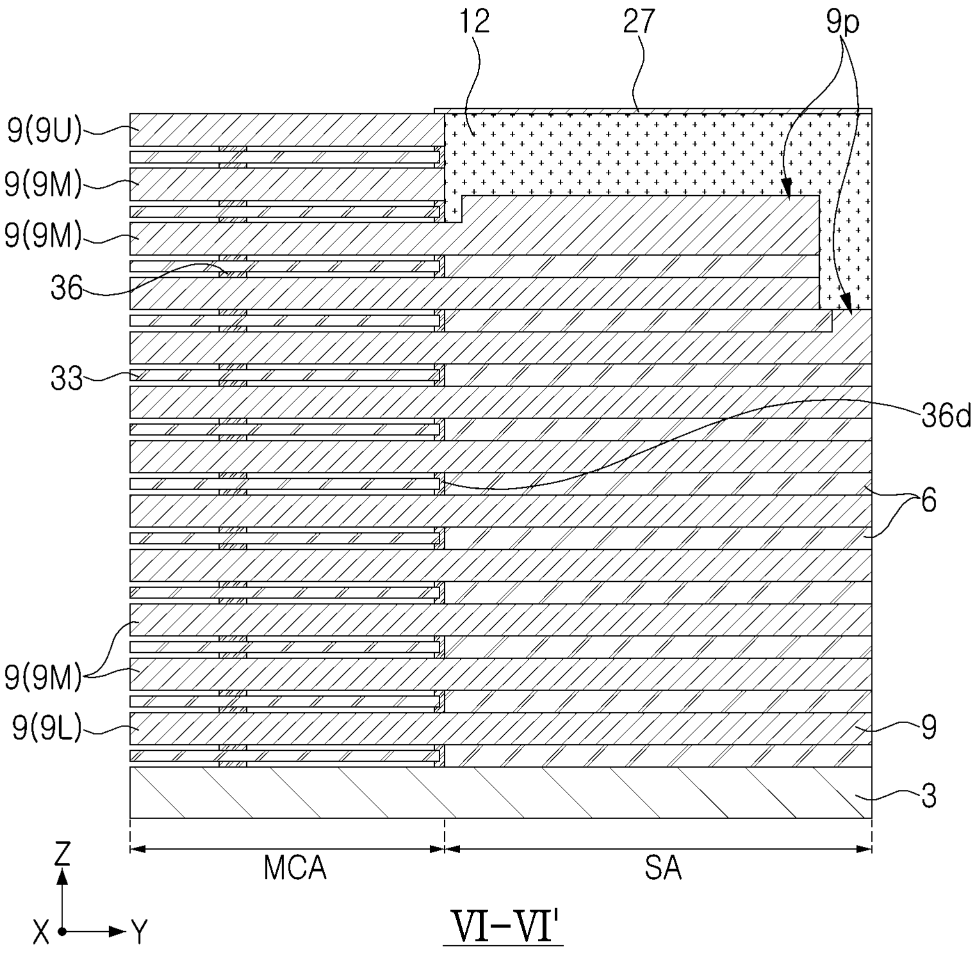
Figure 31:
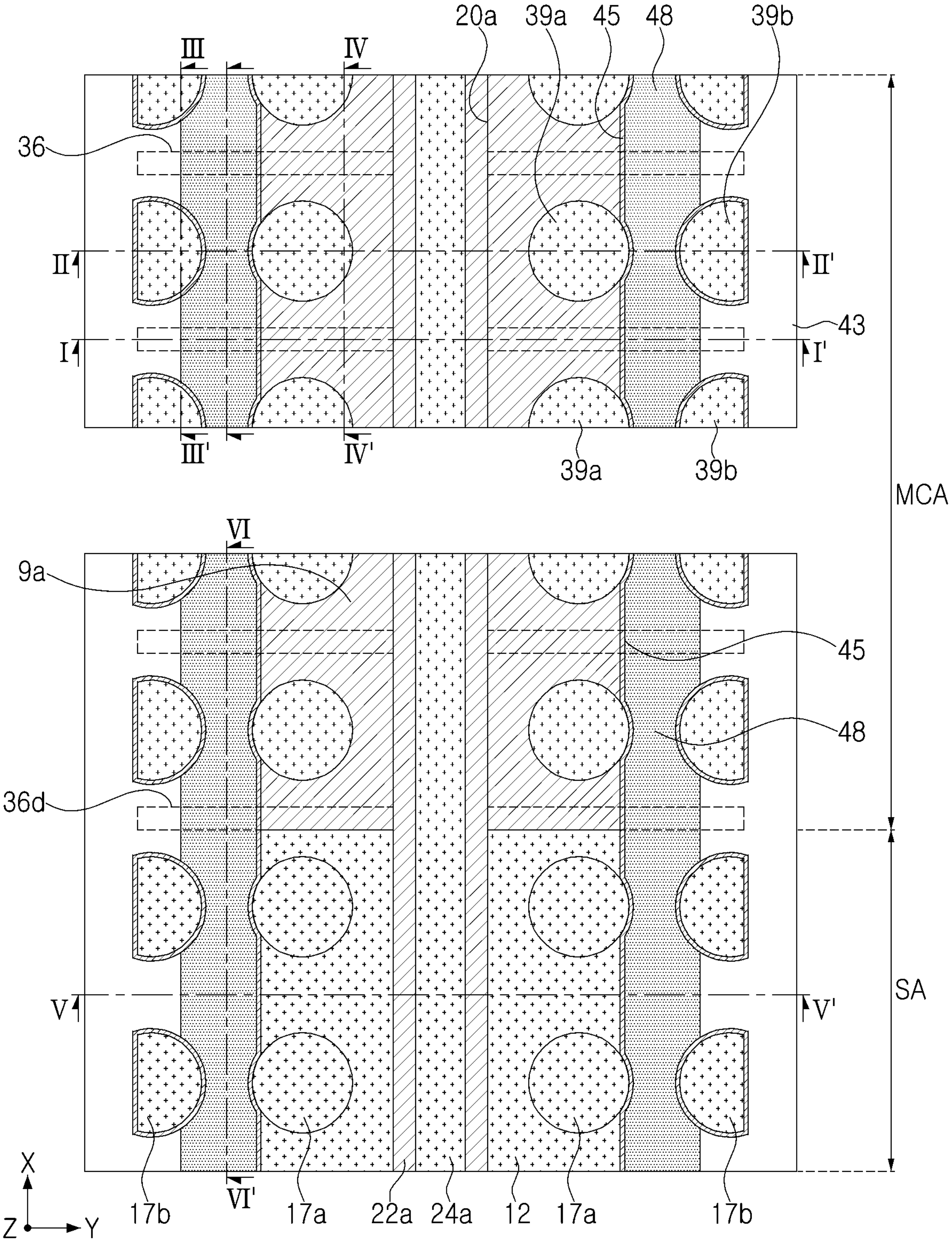

In the cross-sectional structure as illustrated in FIG. 30D, while forming the active layers 36 by partially etching the preliminary active layers, the preliminary active layers in contact with the side surfaces of the first material layers 6 may remain and dummy active patterns 36*d* may be formed.

Referring to FIGS. 22, 31, and 32A to 32F, third pillars 39*a* and fourth pillars 39*b* filling the first holes 15*a* and the second holes 15*b*, respectively, are formed on the memory cell array region MCA.

Figure 32A:
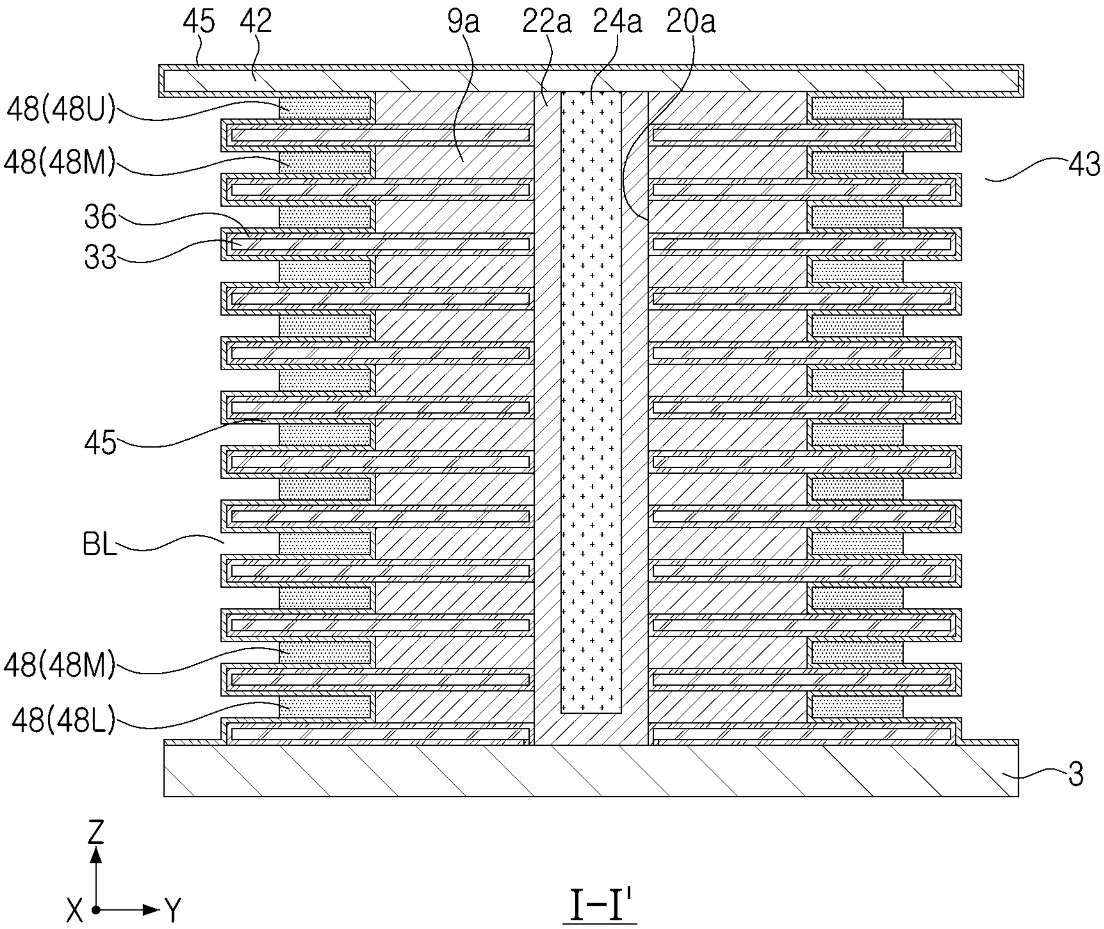
Figure 32B:
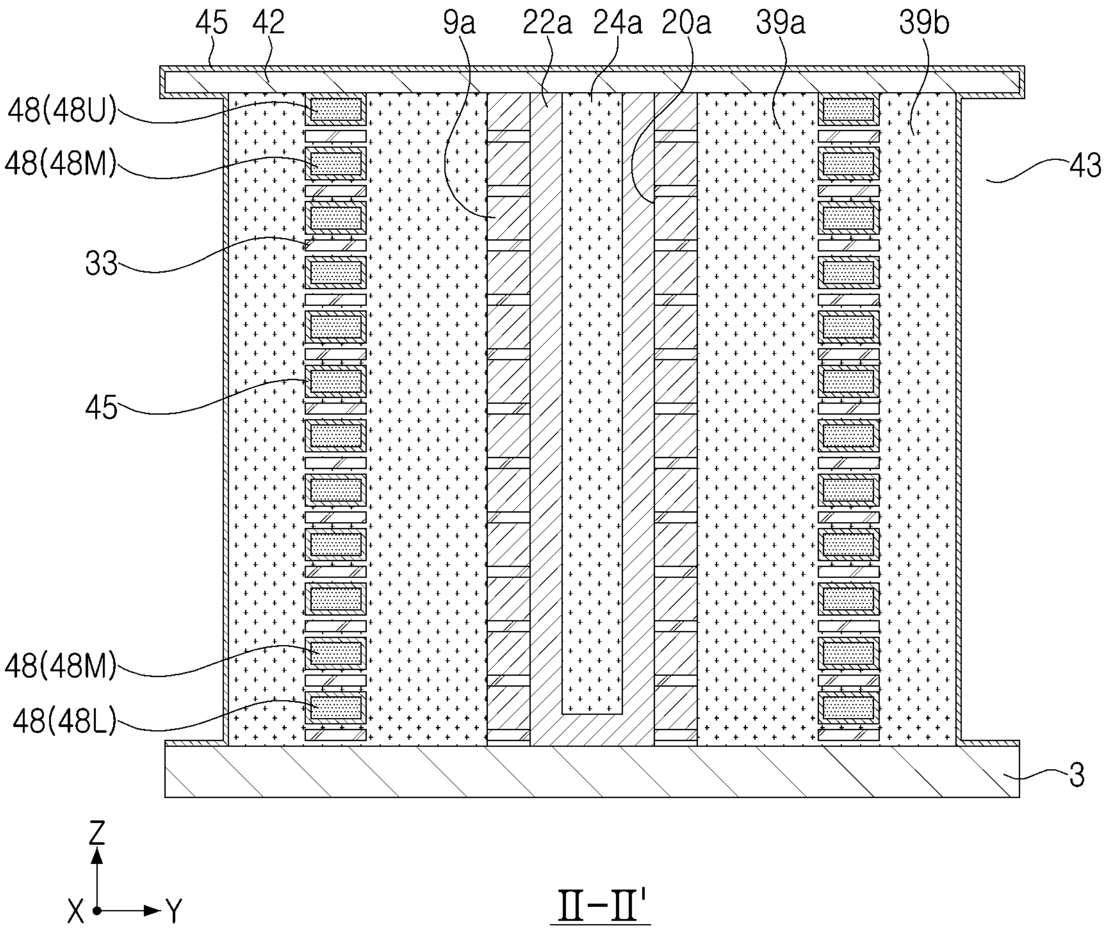
Figure 32C:
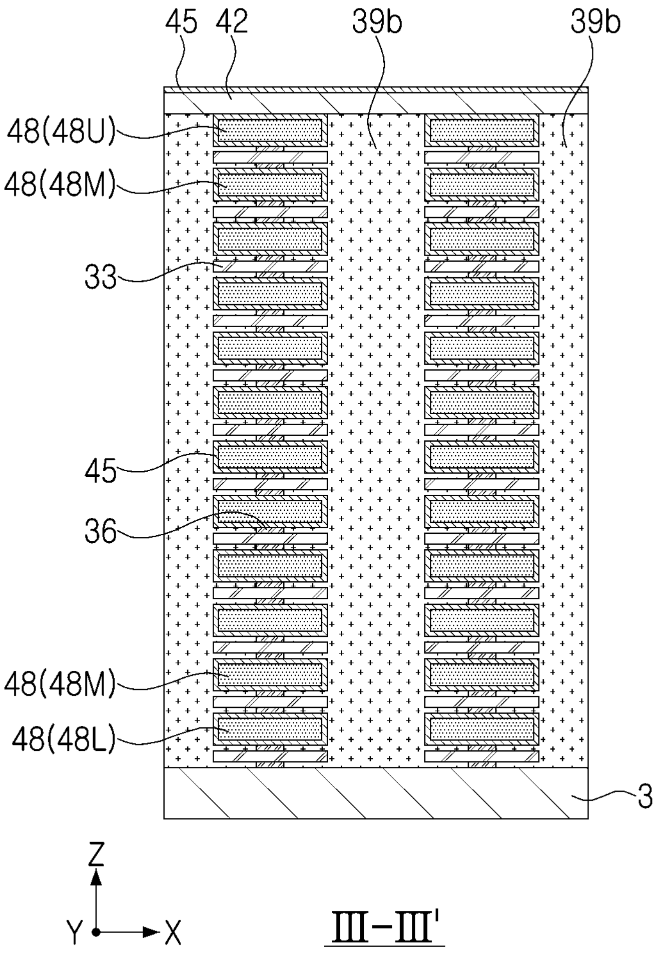
Figure 32D:
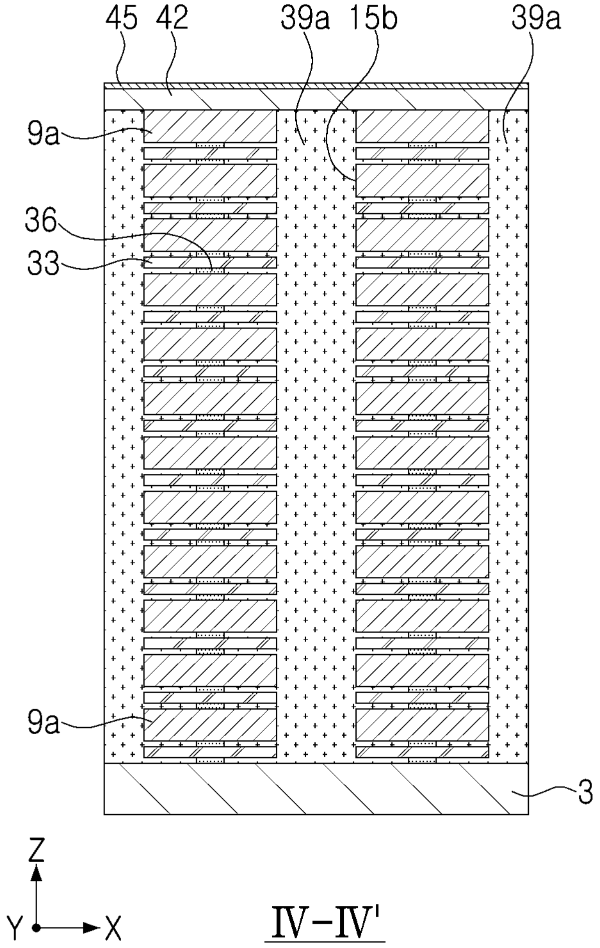
Figure 32E:
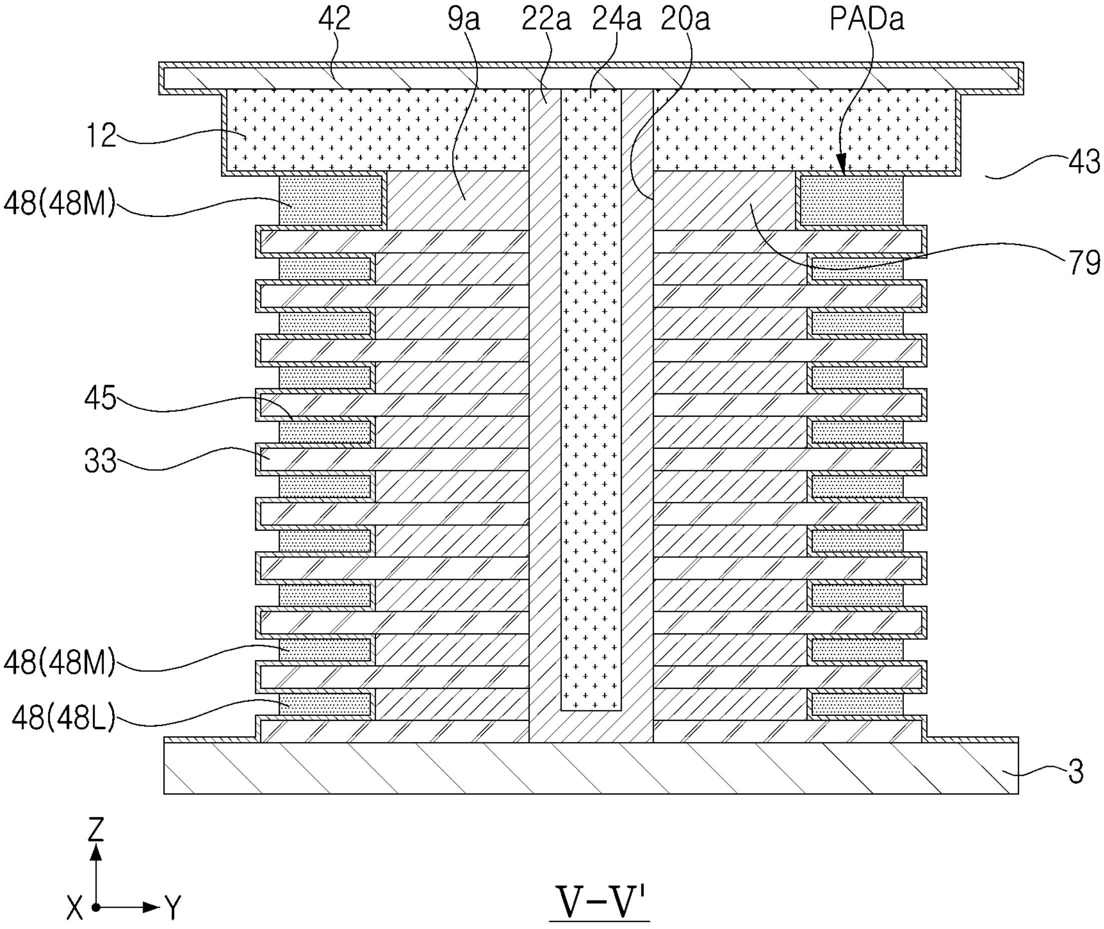
Figure 32F:
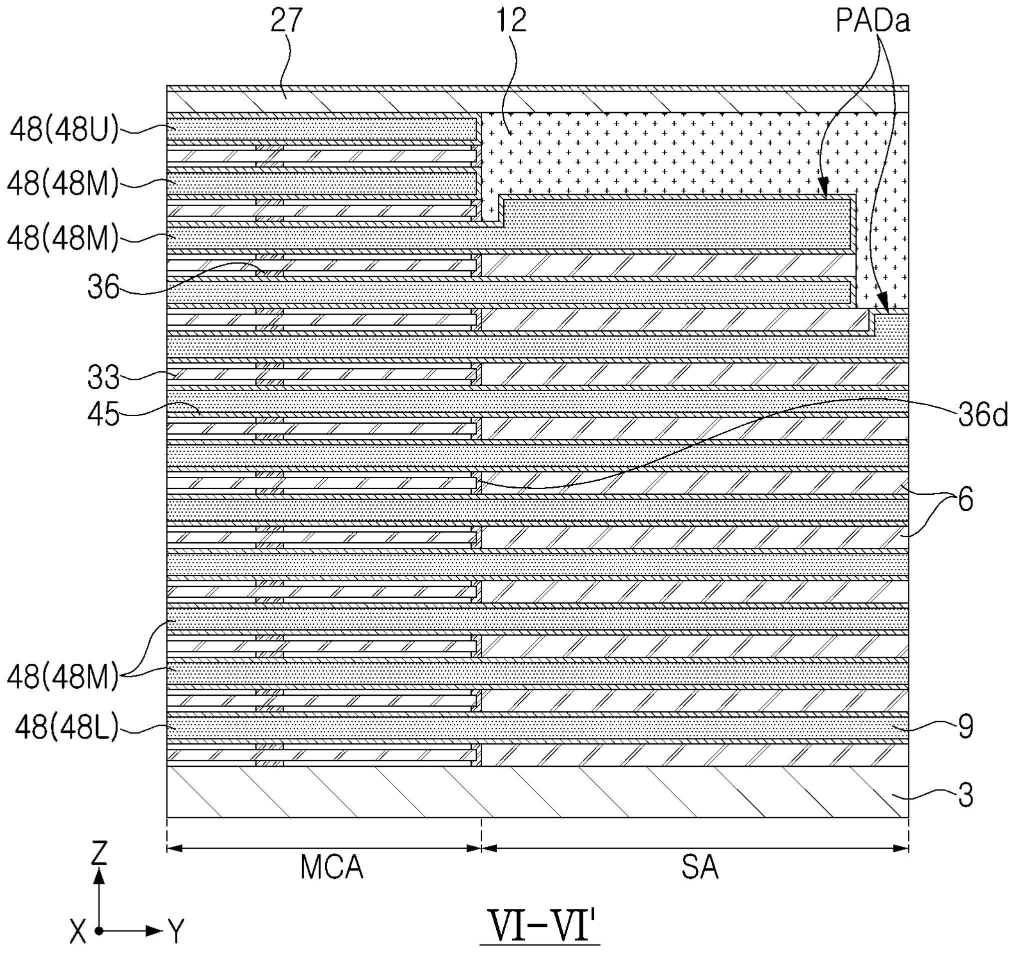
Figure 33:
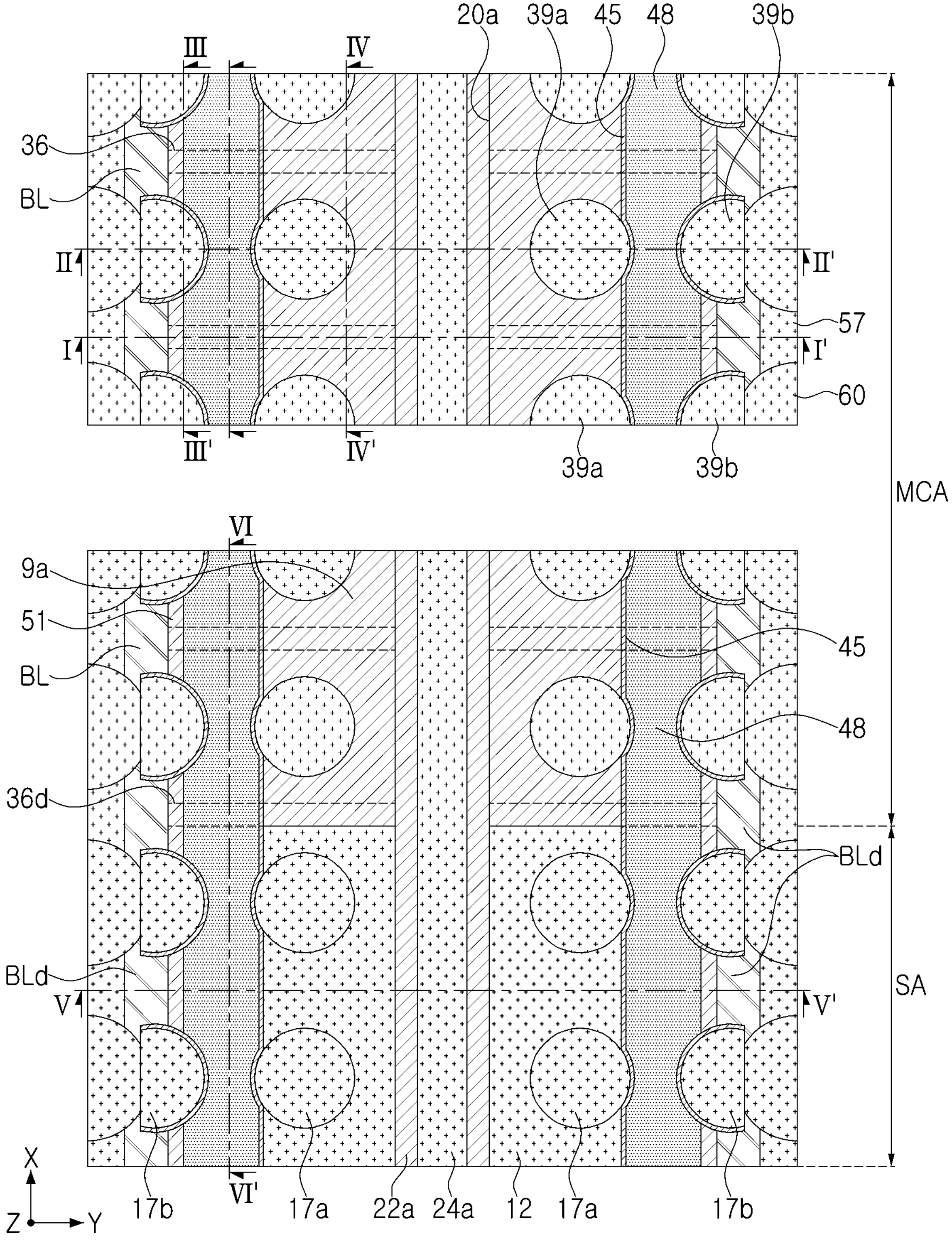
Figure 34A:
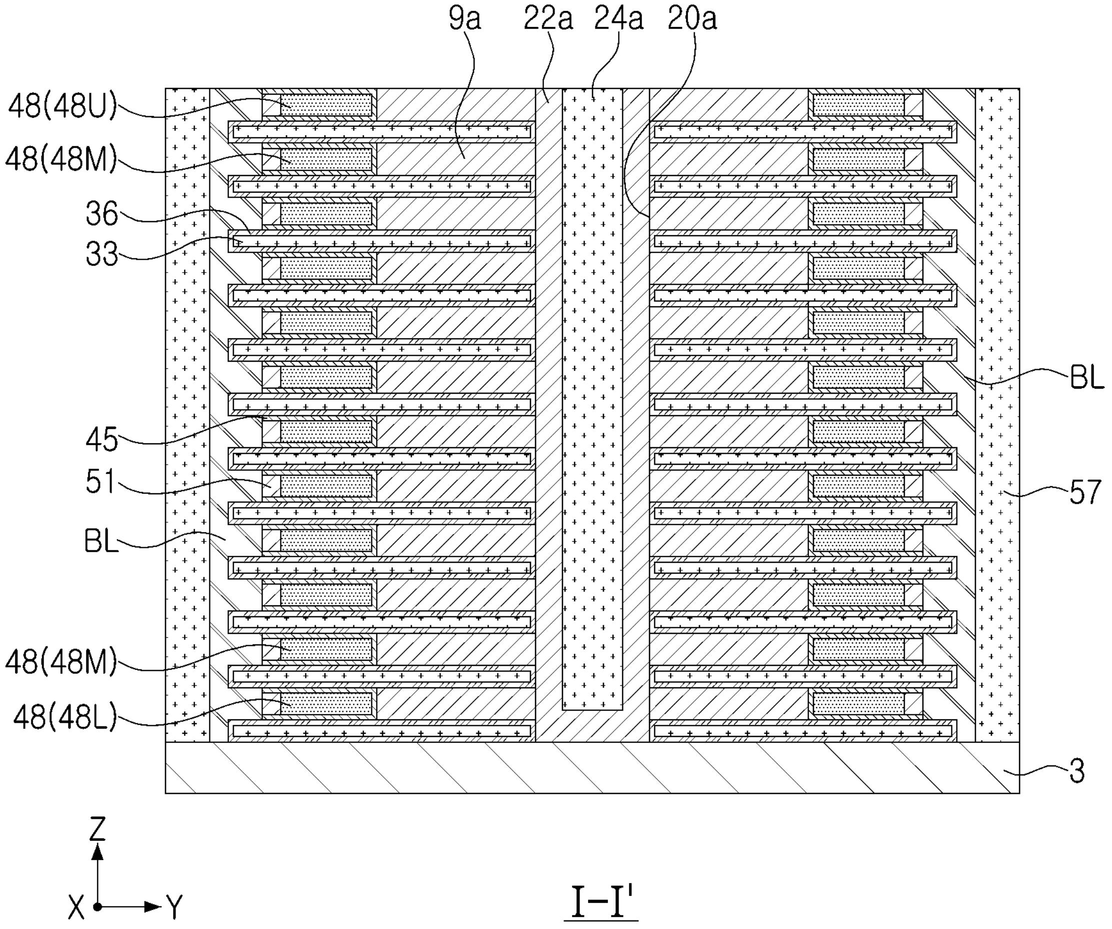
Figure 34B:
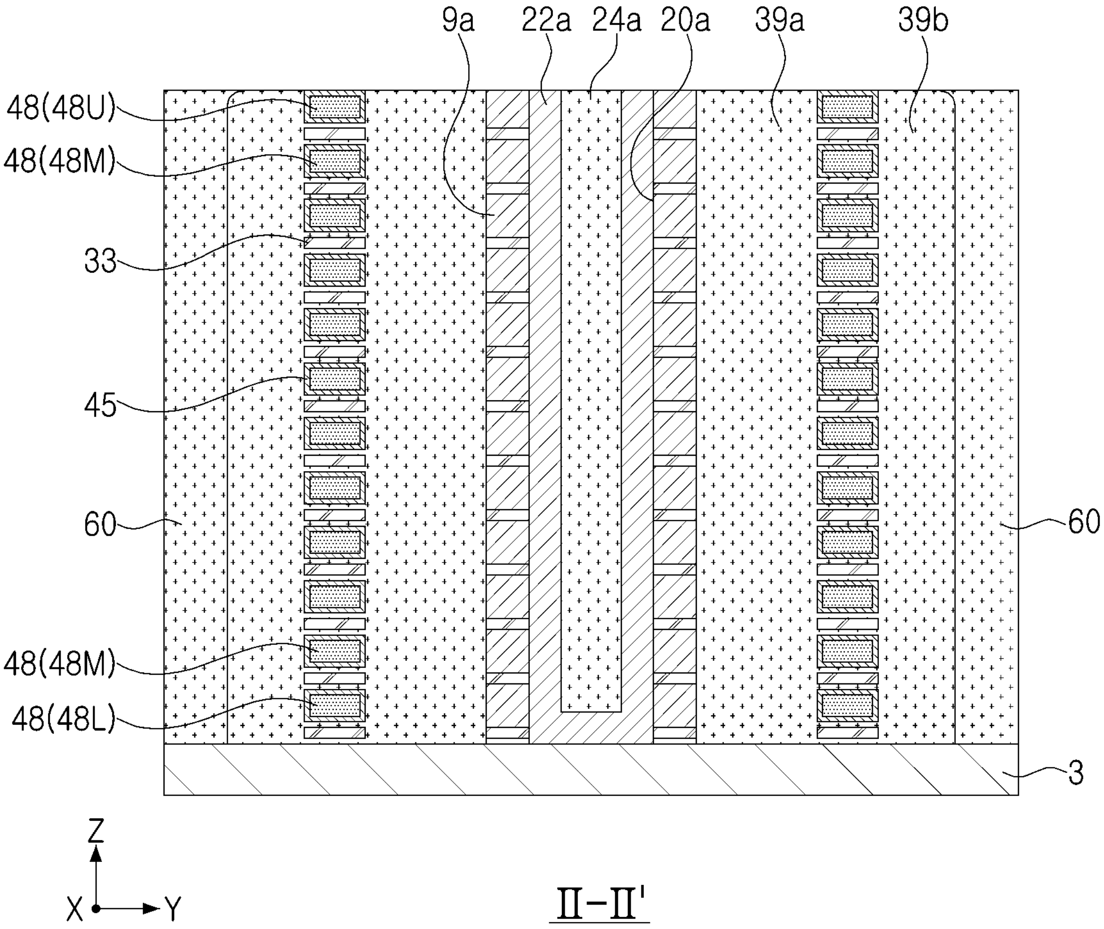
Figure 34C:
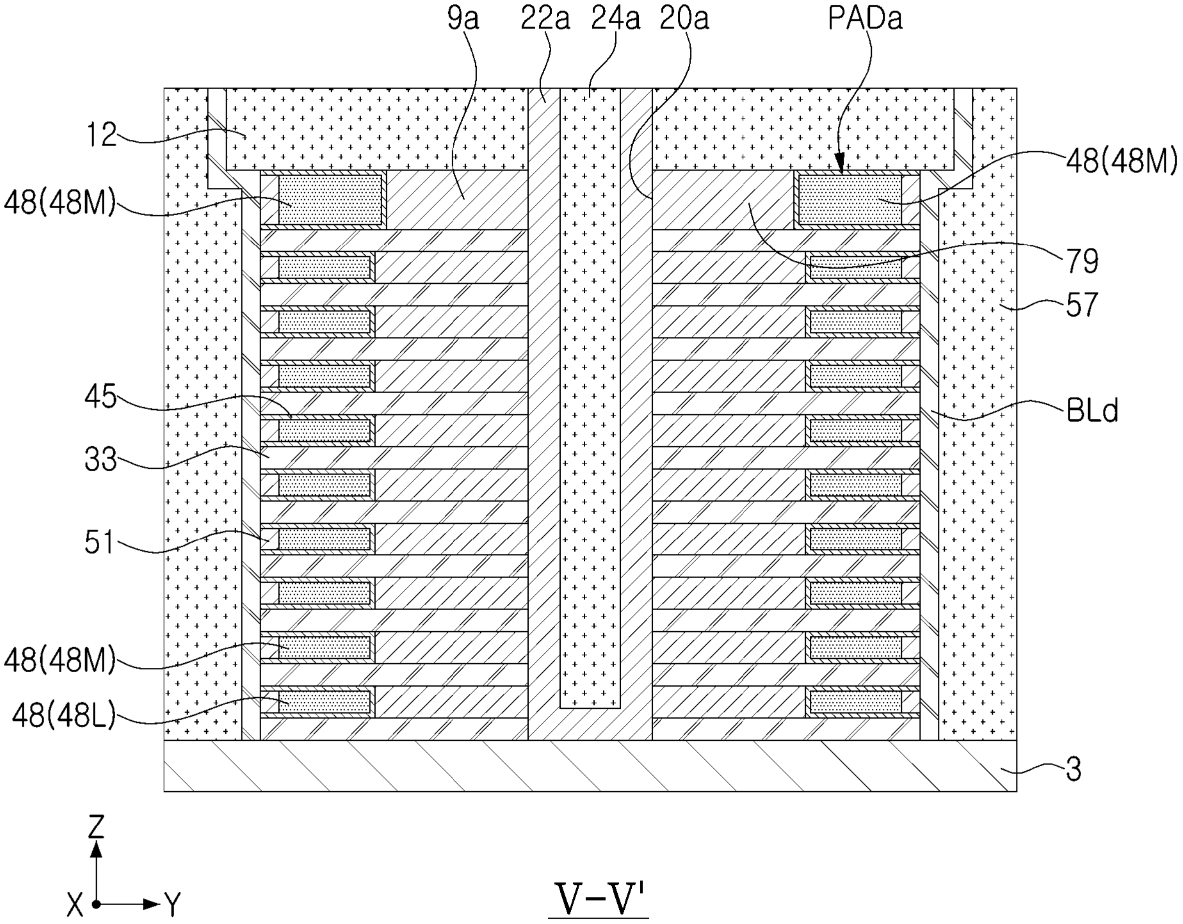
Figure 35:
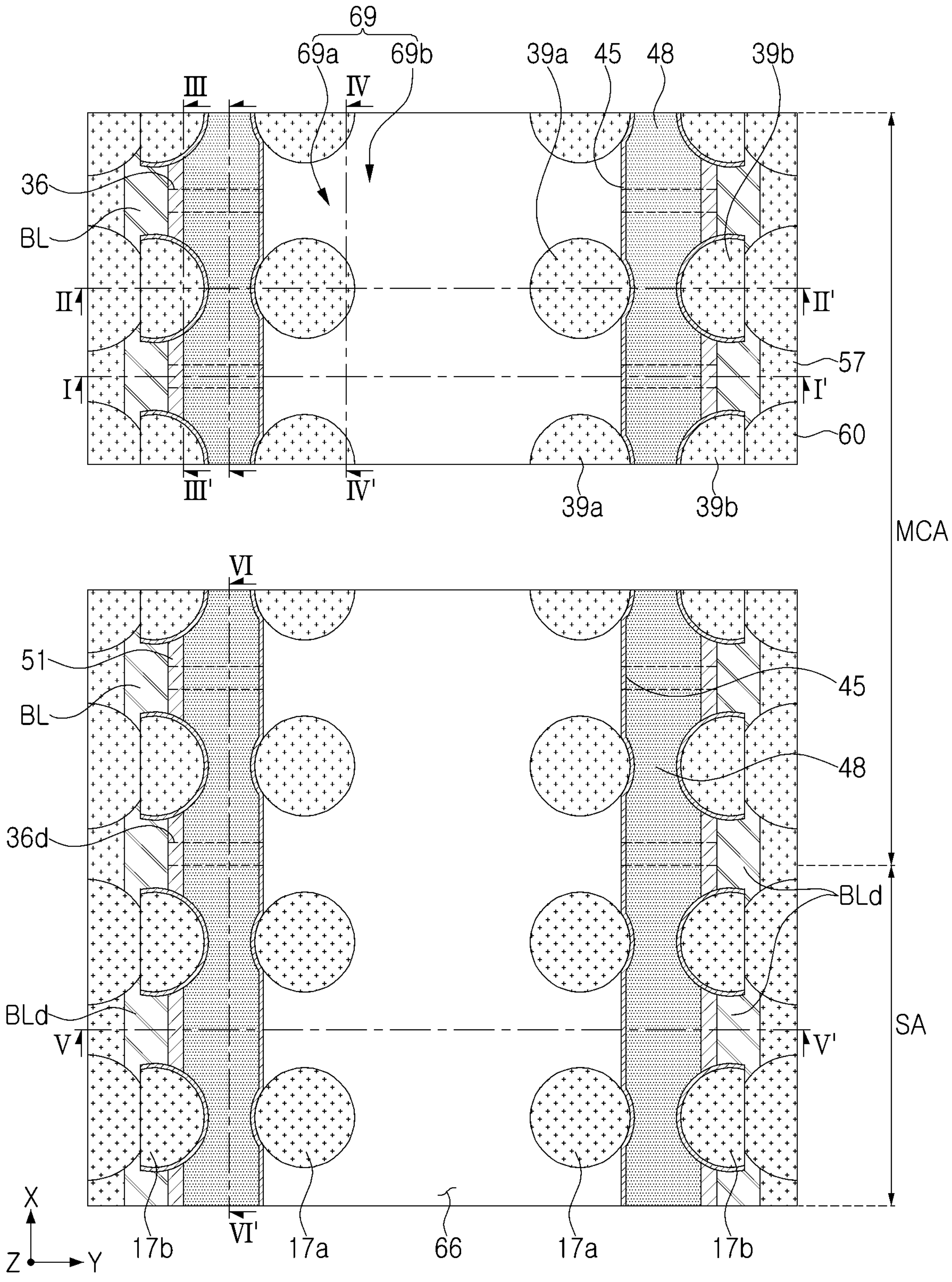

While forming the third pillars 39*a* and the fourth pillars 39*b*, a void space formed by partial etching of the preliminary active layers may be filled. Accordingly, in the cross-sectional structure as illustrated in FIG. 32B, extended layers (39*c* in FIG. 5B) extending from the third pillars 39*a* and the fourth pillars 39*b* are formed. The third pillars 39*a* and the fourth pillars 39*b* may be connected to each other by the extended layers 39*c*.

The third pillars 39*a*, the fourth pillars 39*b* and the extended layers 39*c* may be formed of an insulating material such as silicon oxide.

After forming the third pillars 39*a*, the fourth pillars 39*b* and the extended layers 39*c*, the first mask layer 27 may be removed.

A second mask layer 42 exposing the second gap-filling layers 24*b* of the second trenches 20*b* may be formed.

The second gap-filling layers 24*b* exposed by the second mask layer 42 may be removed, the second liner layers 22*b* may be removed, and the second material layers 9 exposed by removing the second liner layers 22*b* may be partially etched, thereby forming the void spaces 43. Subsequently, the gate dielectric layer 45 may be conformally formed.

After forming the gate dielectric layer 45, gate electrodes 48 partially filling spaces partially etched in the second material layers 9 may be formed. The second material layers 9 may be partially etched, and the insulating patterns 9*a* may remain. The insulating patterns 9*a* may be in contact with the first liner layer 22*a* formed in the first trench 20*a*.

The gate electrodes 48 may include a lower gate electrode 48L, an upper gate electrode 48U on the lower gate electrode 48L, and intermediate gate electrodes 48M between the lower gate electrode 48L and the upper gate electrode 48U.

The gate electrodes 48 may include word lines. Accordingly, word lines stacked and spaced apart from each other in the first direction may be formed, and word lines each extending in the second direction may be formed (S30). Here, the first direction may be a Z-direction, and the second direction may be an X-direction.

Referring to FIGS. 22, 33, and 34A to 34C, insulating buffer patterns 51 are formed on side surfaces of the gate electrodes 48. After forming the insulating buffer patterns 51, the exposed gate dielectric layer 45 may be etched to expose the active layers 36.

In an example, when the active layers 36 are a semiconductor material such as single crystal silicon or polysilicon, a source/drain formation process may be performed, thereby forming first source/drain regions in the exposed active layers 36.

In the void spaces 43, a bit line material layer in contact with the active layers 36 may be formed, an insulating layer filling the void spaces 43 may be formed, and second insulating patterns penetrating through the insulating layer and the bit line material layer may be formed.

The insulating layer may be formed of the first insulating patterns 57 spaced apart from each other by the second insulating patterns 60.

The bit line material layer may be formed of bit lines BL spaced apart from each other by the second insulating patterns 60 on the memory cell array region MCA. Accordingly, the bit lines BL extending in the first direction Z and spaced apart from each other in the second direction X may be formed (S40).

The bit line material layer may be formed as dummy bit lines BLd spaced apart from each other by the second insulating patterns 60 on the staircase region SA.

In a boundary region between the memory cell array region MCA and the staircase region SA, the bit line material layer may be formed as a dummy bit line BLd. The dummy bit lines BLd may be referred to as dummy conductive patterns. The second mask layer 27 may be removed.

Referring to FIGS. 35 and 36A to 36D, a second capping insulating layer 63 exposing the second gap-filling layer 24*a* is formed.

A first trench 66 may be formed by removing the second gap-filling layer 24*a* exposed by the second capping insulating layer 63 and removing the first liner layer 22*a*.

Figure 36A:
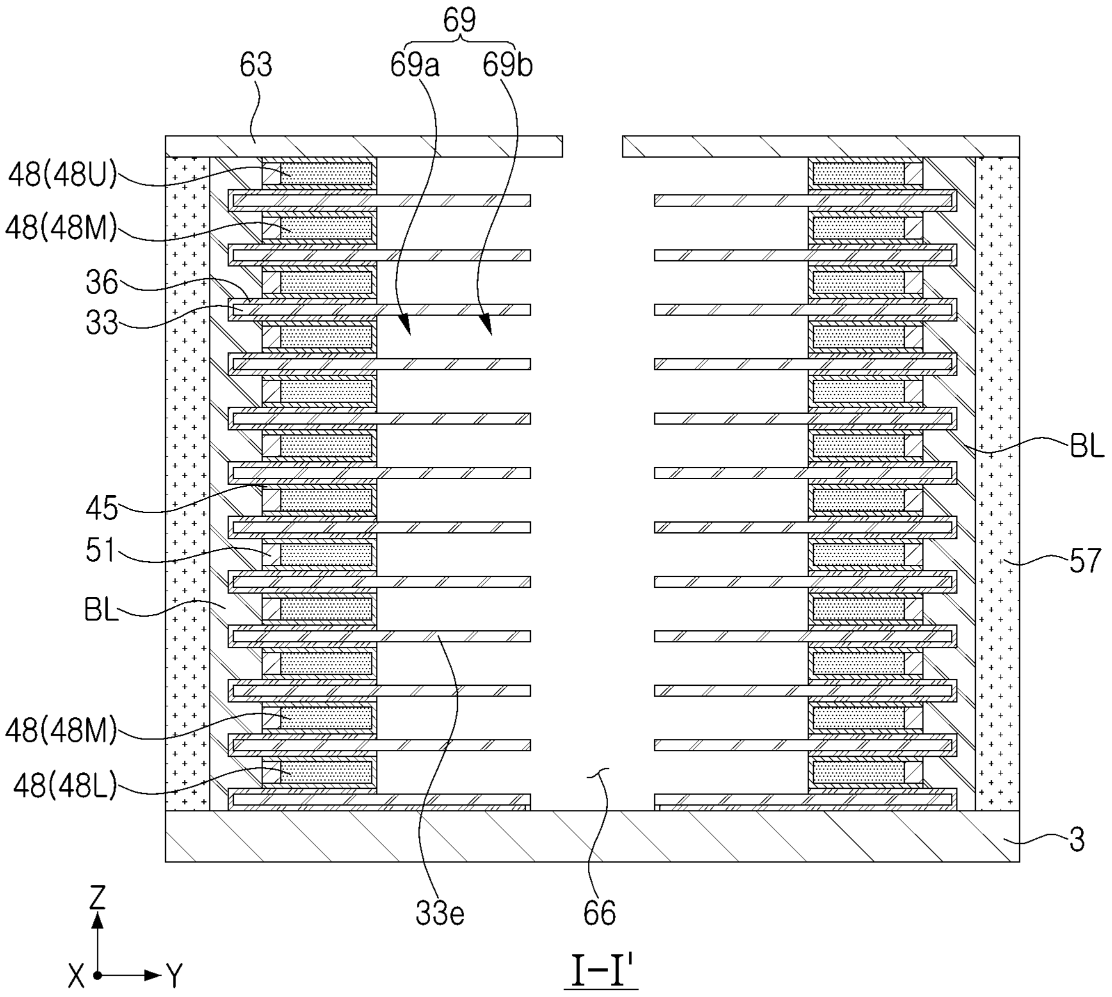
Figure 36B:
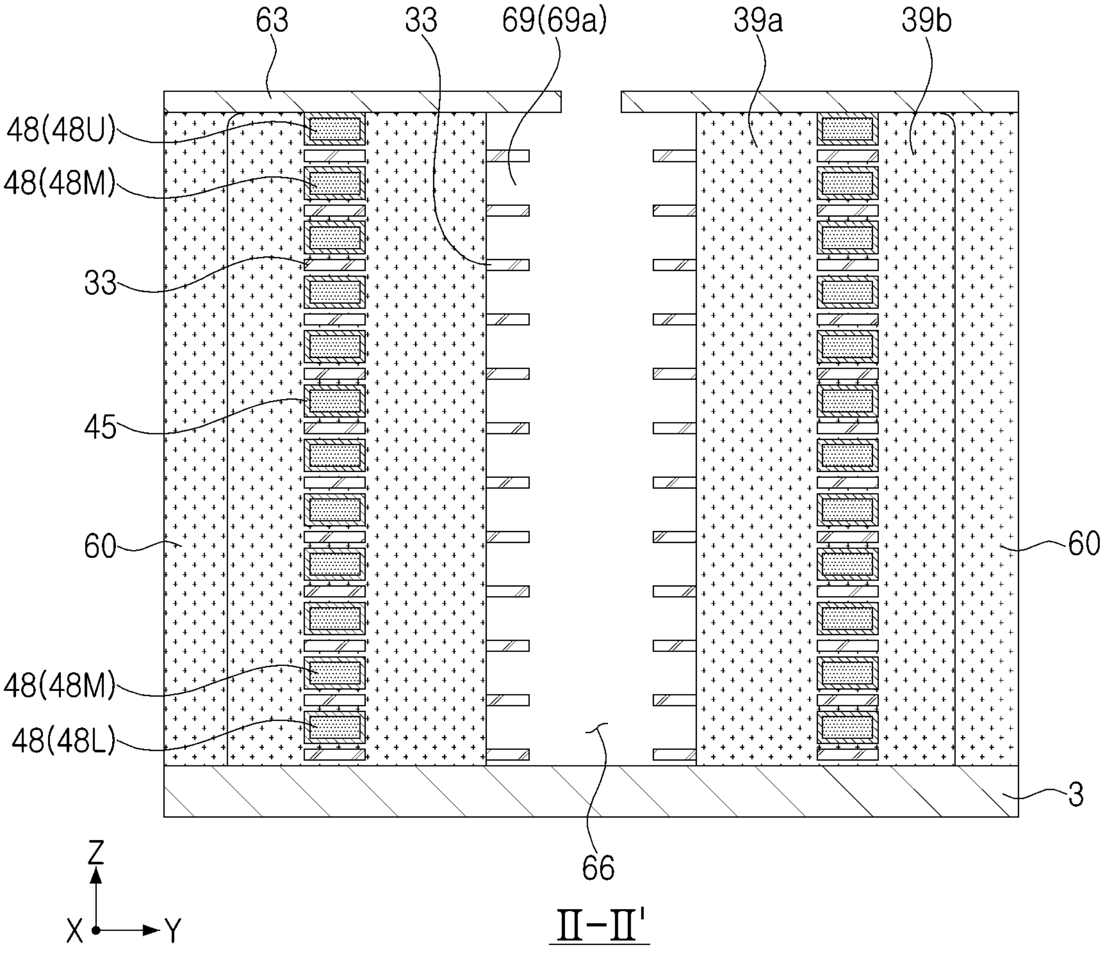
Figure 36C:
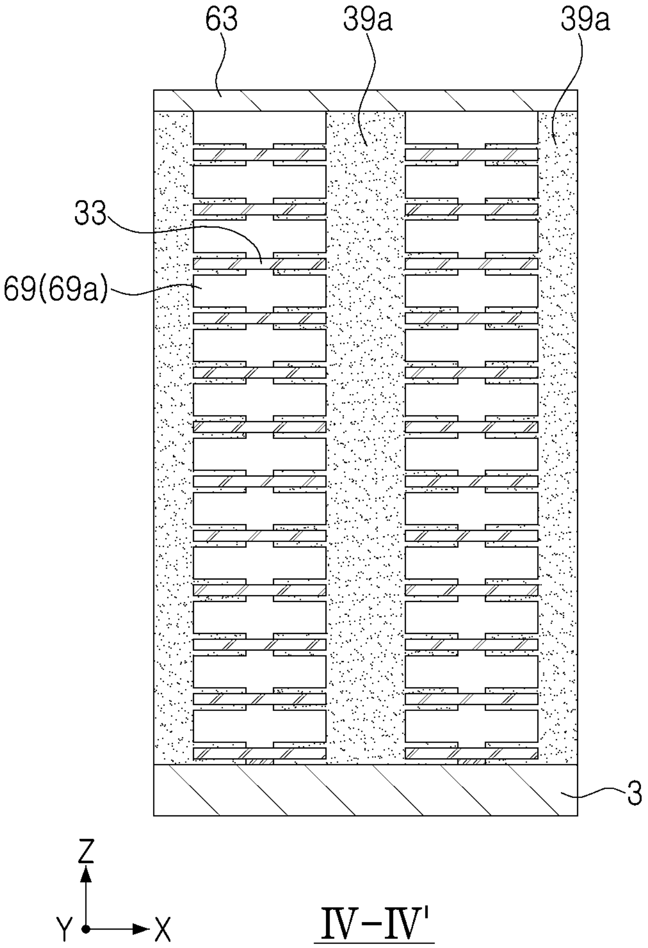
Figure 36D:
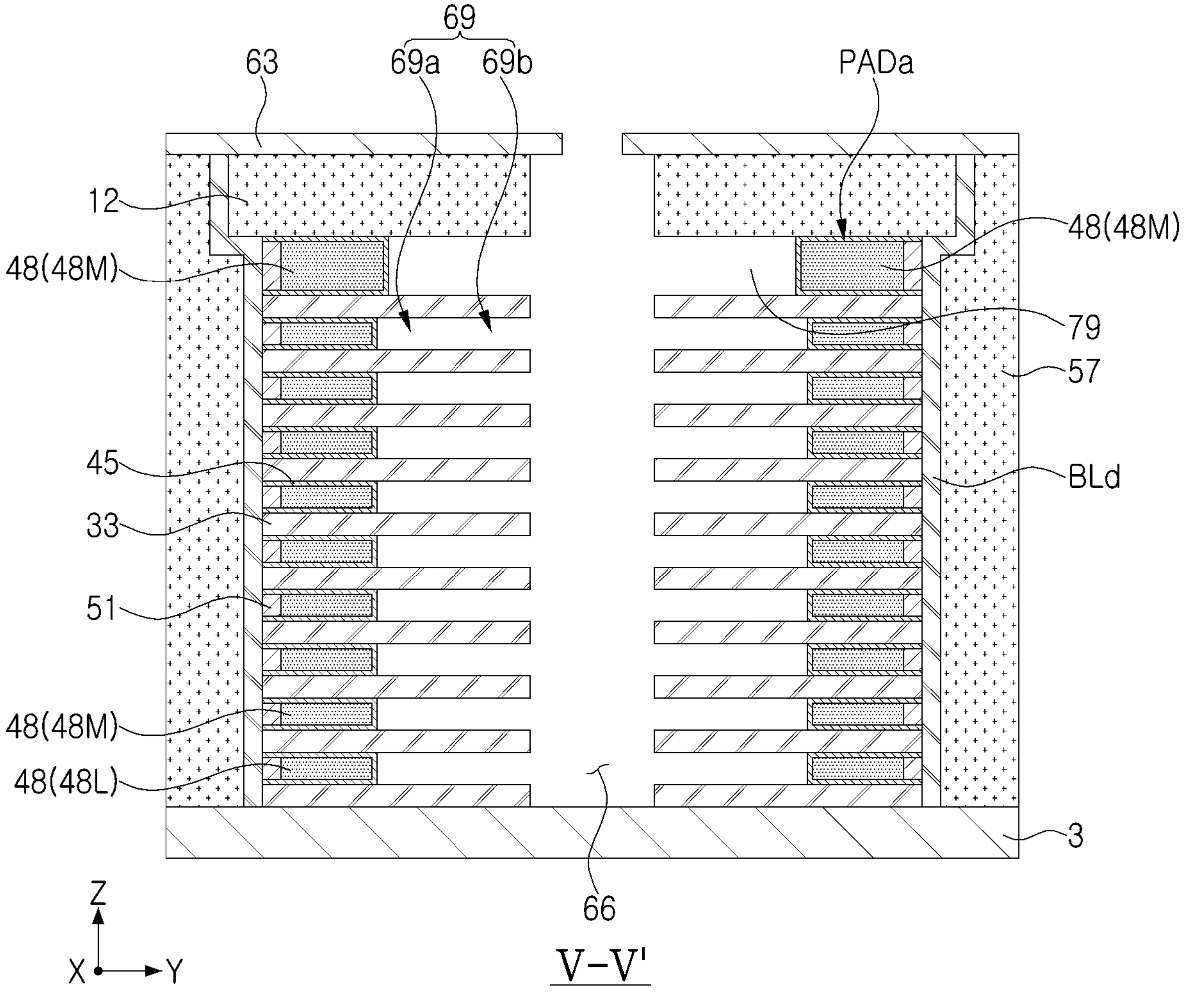
Figure 37:
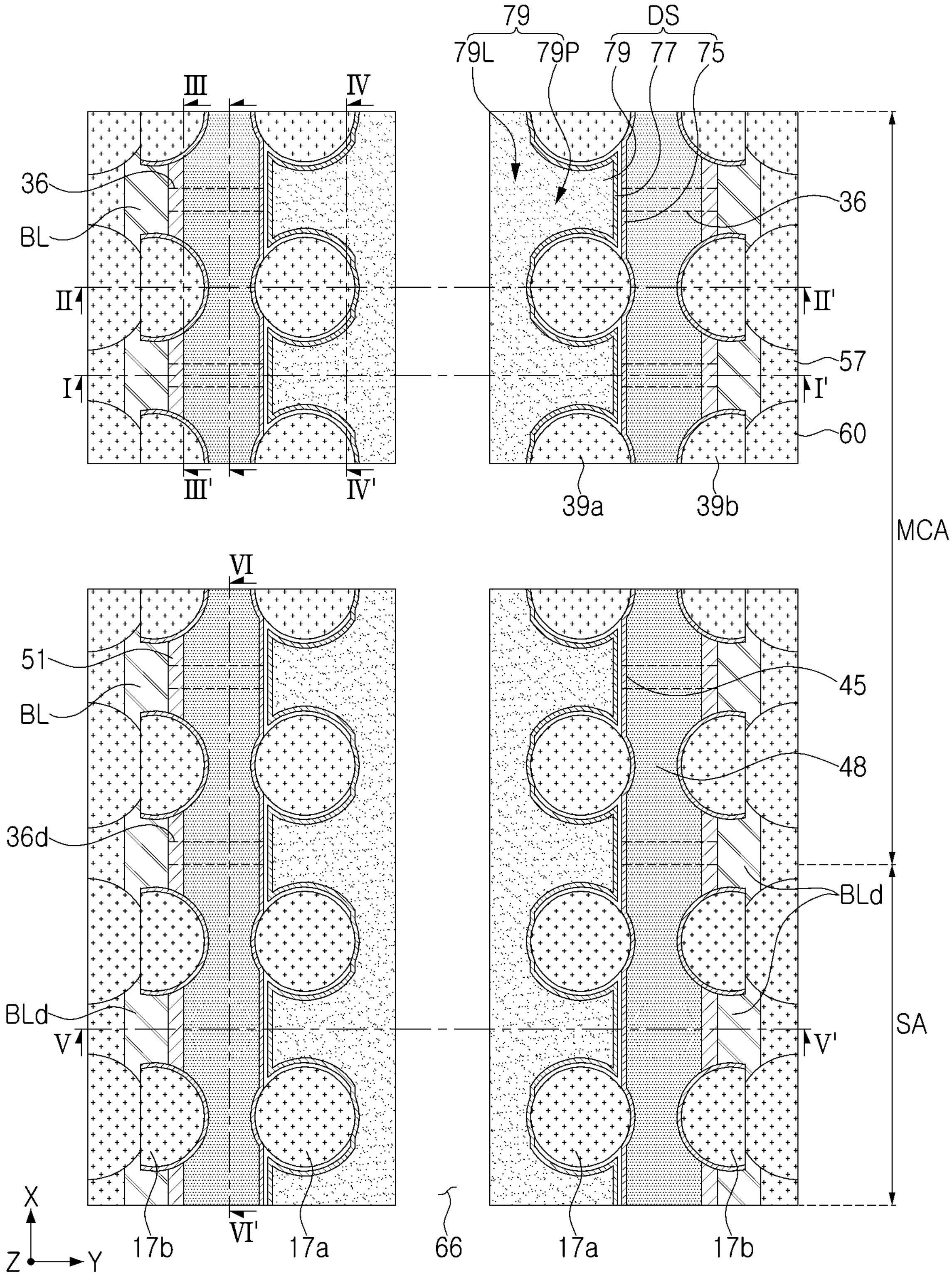
Figure 38A:
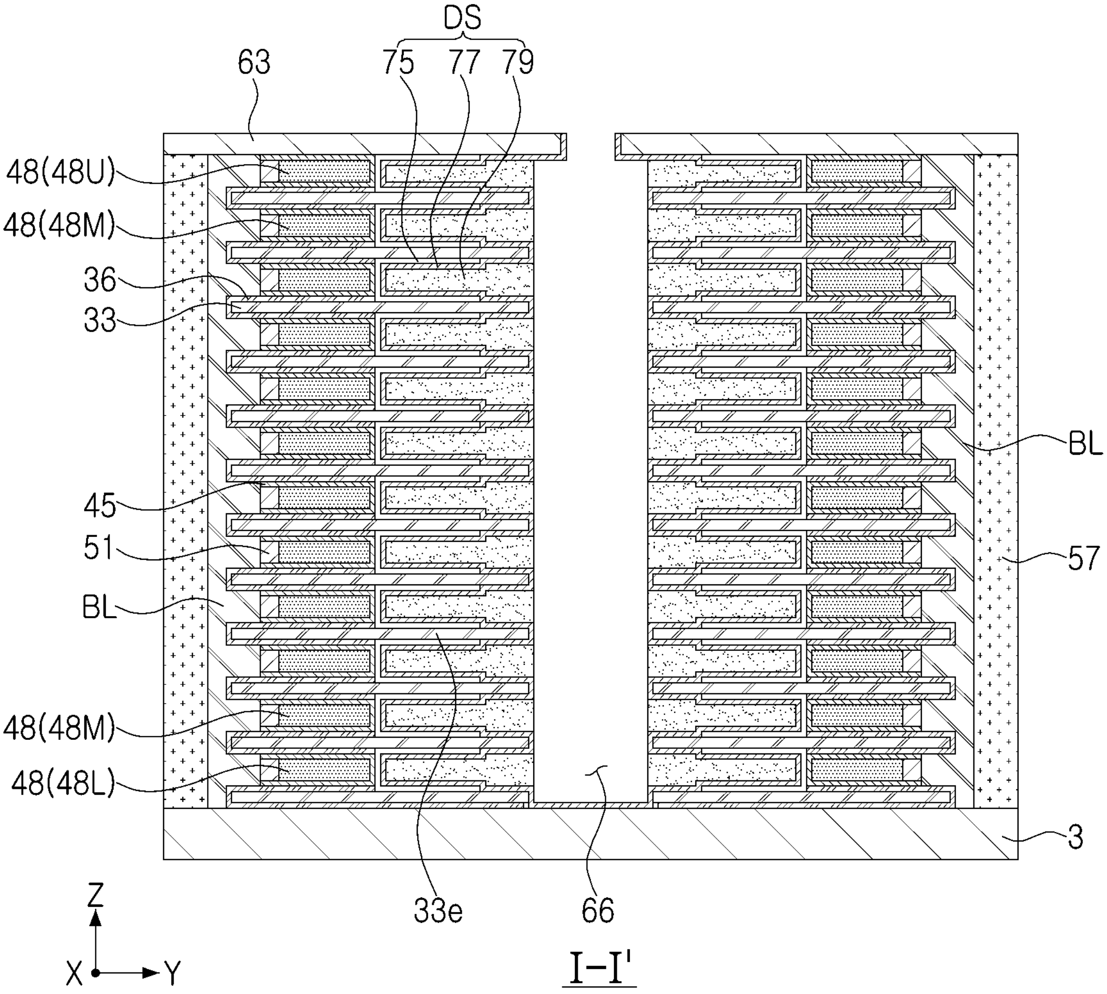
Figure 38B:
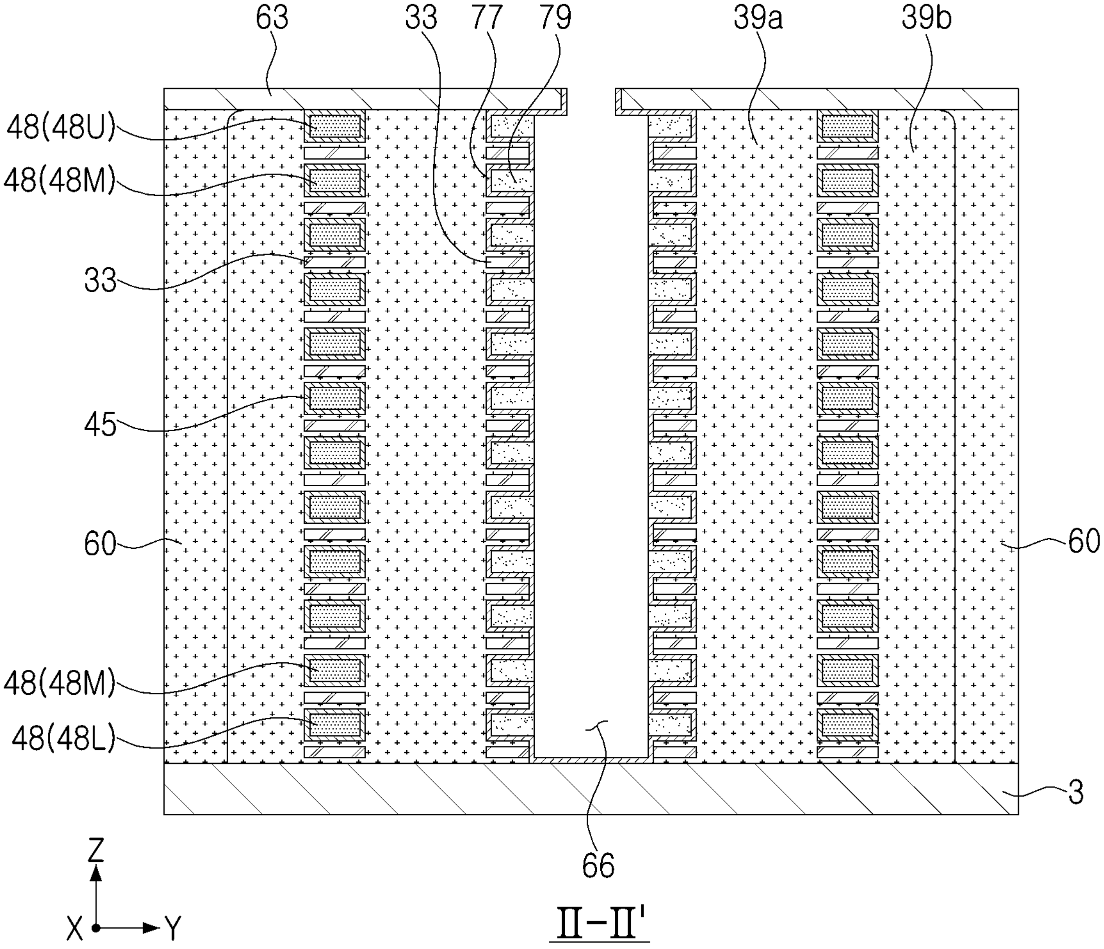
Figure 38C:
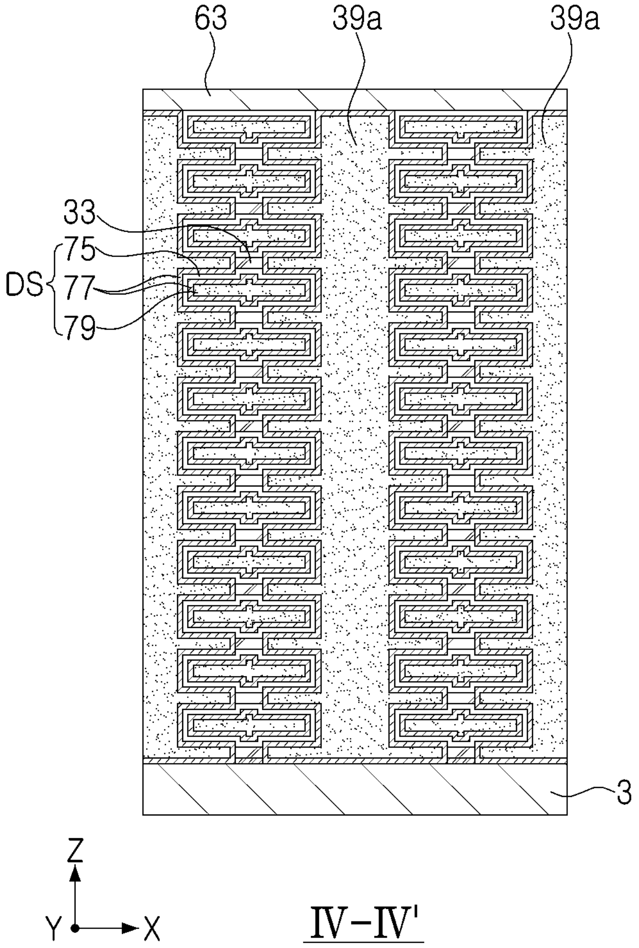
Figure 38D:
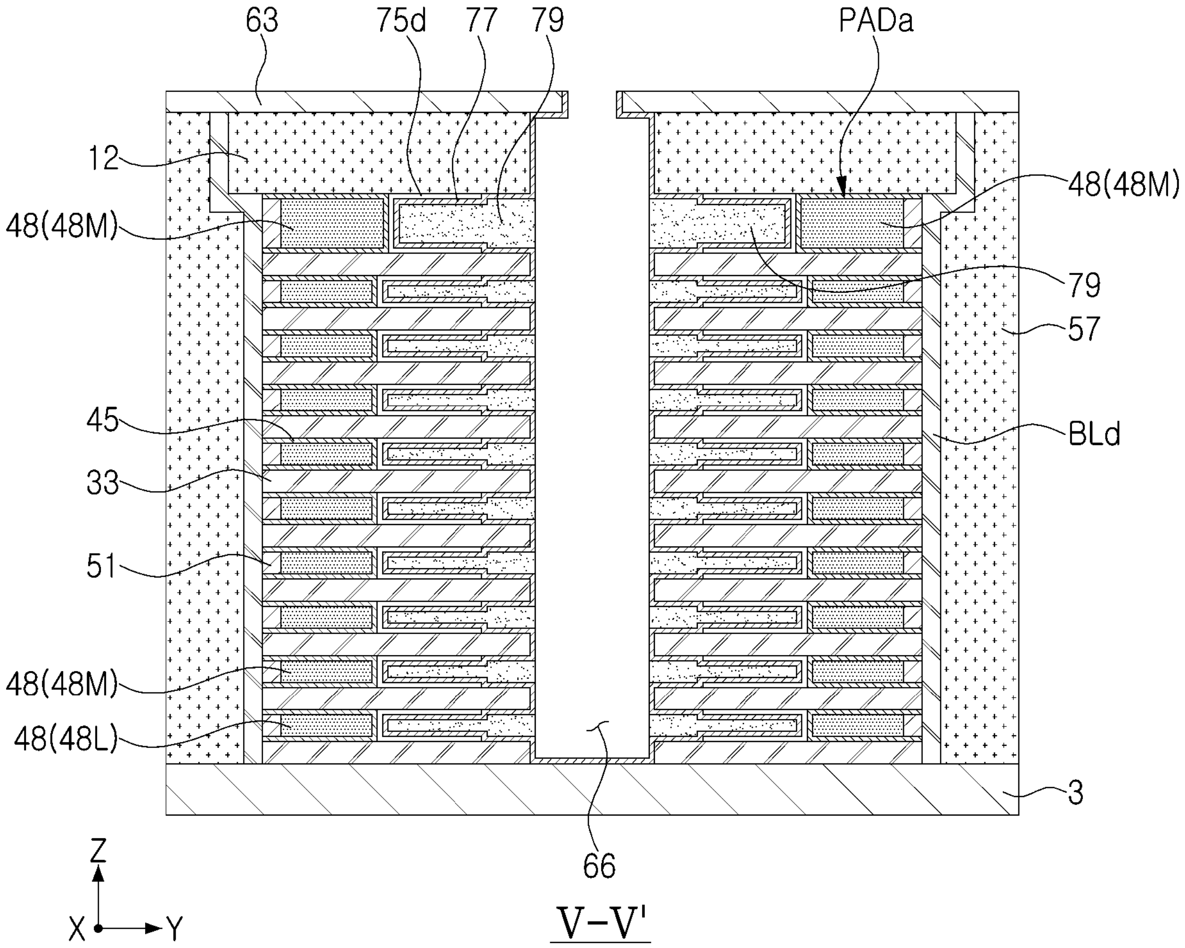

The insulating patterns 9*a* exposed by the first trench 66 may be removed to form the void spaces 69. In cross-sectional structures as illustrated in FIGS. 36A and 36D, the active layers 36 and the gate dielectric layers 45 are exposed by the void spaces 69.

The active layers 36 exposed by the void spaces 69 may be etched.

In an example, when the active layers 36 are a semiconductor material such as single crystal silicon or polysilicon, a source/drain formation process may be performed to etch the active layers 36 exposed by the void spaces 69, and the second source/drain regions may be formed in the remaining active layers 36.

The cell interlayer insulating layers 33 may include extension portions 33*e* extending from regions vertically overlapping the gate electrodes 48 toward the first trench 66.

The void spaces 69 may expose lower and upper surfaces of each of the extension portions 33*e* of the cell interlayer insulating layers 33.

The void spaces 69 may include first void spaces 69*a* disposed between the first and third pillars 17*a* and 39*a* arranged in the X-direction and second void spaces 69*b* adjacent to the first trench 66. The second void spaces 69*b* may have a line shape extending in the X-direction.

Referring to FIGS. 22, 37, and 38A to 38D, first electrodes 75 spaced apart from each other are formed (S50). The first electrodes 75 may cover internal walls of the first void spaces 69*a* among the void spaces 69. A dielectric layer 77 may be formed (S60). The dielectric layer 77 may conformally cover a substrate having the first electrodes 75. The second electrodes 79 stacked and spaced apart from each other in the first direction Z may be formed, each may form second electrodes 79 extending in the second direction X (S70). The second electrodes 79 may fill the remaining spaces of the first void spaces 69*a* and the second void spaces 69*b* on the dielectric layer 77. Each of the second electrodes 79 may include a line portion 79L disposed in the second void spaces 69*b* and a protrusion 79P extending from the line portion 79L into the first void space 69*a*. The first electrodes 75, the dielectric layer 77 and the second electrodes 79 may form a data storage structure DS.

Referring back to FIGS. 1 to 9B, an insulating layer filling the first trench 66 and covering the second capping insulating layer 63 is formed, and the insulating layer may be planarized, thereby forming an insulating separation pattern 81. The insulating separation pattern 81 may have a line shape extending in the X-direction. An upper surface of the insulating separation pattern 81 may be coplanar with an upper surface of the second capping insulating layer 63.

Gate contact plugs 82*a* and electrode contact plugs 82*b* may be formed on the staircase region SA. The gate contact plugs 82*a* may penetrate through the second capping insulating layer 63 and the first capping insulating layer 12 and may be in contact with and electrically connected to the gate pad regions PADa, and the electrode contact plugs 82*b* may penetrate through the second capping insulating layer 63 and the first capping insulating layer 12, and may be in contact with and electrically connect to the electrode pad regions PADb.

An upper insulating structure 85 and wiring structures 88*a* and 88*b* may be formed on the second capping insulating layer 63 and the insulating separation pattern 81. The wiring structures 88*a* and 88*b* may be formed in the upper insulating structure 85. Each of the wiring structures 88*a* and 88*b* may include a via 87*a* and a wiring 87*b*. The wiring structures 88*a* and 88*b* may include wiring structures 88*a* electrically connected to the gate contact plugs 82*a* and wiring structures 88*b* electrically connected to the electrode contact plugs 82*b*.

According to the aforementioned examples, a semiconductor device including cell transistors spaced apart from each other in the vertical direction and stacked, and data storage structures stacked and spaced apart from each other in the vertical direction may be provided. Accordingly, integration density of semiconductor devices may be improved.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While the example embodiments have been illustrated and described above, it will be configured as apparent to those skilled in the art that modifications and variations may be made without departing from the scope in the example embodiment as defined by the appended claims.

What is claimed is:

1. A semiconductor device, comprising:

a plurality of cell transistors on a base, wherein the cell transistors are stacked and spaced apart from each other in a first direction perpendicular to an upper surface of the base, wherein each cell transistor of the plurality of cell transistors comprises a first source/drain region, a second source/drain region, and a gate electrode;

a bit line on the base, extending in the first direction, and electrically connected to the first source/drain regions of the plurality of cell transistors; and a plurality of data storage structures on the base and electrically connected to the second source/drain region of each cell transistor of the plurality of cell transistors, wherein each gate electrode of the plurality of cell transistors has a line shape extending in a second direction parallel to the upper surface of the base, wherein each data storage structure of the plurality of data storage structures comprises a first electrode, a second electrode, and a dielectric layer between the first electrode and the second electrode, wherein the first electrodes of the plurality of data storage structures are electrically connected to the second source/drain regions of the plurality of cell transistors, wherein the second electrodes of the plurality of data storage structures are stacked and spaced apart from each other in the first direction, and wherein each second electrode of the plurality of data storage structures comprises a line portion having a line shape extending in the second direction.

2. The semiconductor device of claim 1, wherein, in each data storage structure of the plurality of data storage structures, the second electrode further comprises a protrusion extending from the line portion toward the bit line, and wherein, for each data storage structure of the plurality of data storage structures, the first electrode of the data storage structure covers a side surface, a lower surface and an upper surface of the protrusion of the second electrode of the data storage structure, and wherein the first electrode is adjacent to the second electrode.

3. The semiconductor device of claim 2, wherein a thickness of the line portion is greater than a thickness of the protrusion.

4. A semiconductor device, comprising:

a plurality of word lines stacked and spaced apart from each other in a first direction, wherein each word line of the plurality of word lines extends in a second direction perpendicular to the first direction;

a plurality of active layers stacked and spaced apart from each other in the first direction, wherein each active layer of the plurality of active layers comprises a channel region vertically overlapping the word lines;

a bit line extending in the first direction and connected to first sides of the plurality of active layers; and a plurality of data storage structures stacked and spaced apart from each other in the first direction and connected to second sides of the plurality of active layers, wherein the plurality of active layers are disposed between the bit line and the data storage structures, wherein each data storage structure of the plurality of data storage structures comprises a first electrode, a second electrode spaced apart from the first electrode, and a dielectric layer between the first electrode and the second electrode, wherein the first electrodes of the plurality of data storage structures are connected to the second sides of the plurality of active layers, and wherein the second electrodes of the plurality of data storage structures are stacked and spaced apart from each other in the first direction.

5. The semiconductor device of claim 4, wherein each of the second electrodes of the plurality of data storage structures comprises a line portion extending in the second direction and a protrusion extending in a direction from the line portion toward the bit line.

6. The semiconductor device of claim 5, wherein for each data storage structure of the plurality of data storage structures, the first electrode of the data storage structure covers a side surface, a lower surface and an upper surface of the protrusion of the second electrode of the data storage structure, and wherein the first electrode is adjacent to the second electrode.

7. The semiconductor device of claim 5, wherein a thickness of the line portion is greater than a thickness of the protrusion.

8. The semiconductor device of claim 4, wherein the plurality of word lines comprise a first word line, and wherein the plurality of active layers comprise a first active layer below a lower surface of the first word line and a second active layer spaced apart from the first active layer in the first direction and disposed on an upper surface of the first word line.

9. The semiconductor device of claim 8, wherein at least one of the first electrodes is connected to the first active layer and the second active layer.

10. The semiconductor device of claim 4, further comprising:

gate dielectric layers comprising first dielectric portions between the active layers and the word lines.

11. The semiconductor device of claim 10, wherein the gate dielectric layers further comprise second dielectric portions extending from the first dielectric portions to a region between the word lines and the first electrodes.

12. The semiconductor device of claim 4, further comprising:

gate contact plugs; and electrode contact plugs, wherein the plurality of word lines comprise gate pad regions arranged in a staircase shape, wherein the second electrodes of the plurality of data storage structures comprise electrode pad regions arranged in a staircase shape, wherein the gate contact plugs are electrically connected to the gate pad regions, and wherein the electrode contact plugs are electrically connected to the electrode pad regions.

13. The semiconductor device of claim 12, wherein, among the plurality of word lines, portions vertically overlapping with the plurality of active layers have a first thickness, and wherein the gate pad regions of the plurality of word lines have a second thickness greater than the first thickness.

14. The semiconductor device of claim 12, wherein the gate contact plugs penetrate through the gate pad regions and are in contact with the gate pad regions, and wherein the electrode contact plugs penetrate through the electrode pad regions and are in contact with the electrode pad regions.

15. The semiconductor device of claim 4, wherein, among the plurality of word lines, a first word line comprises a lower gate electrode and an upper gate electrode on the lower gate electrode, and wherein, among the plurality of active layers, a first active layer adjacent to the first word line is disposed between the lower gate electrode and the upper gate electrode.

16. The semiconductor device of claim 15, further comprising:

connection conductive lines connected to the plurality of word lines, respectively, wherein the connection conductive lines comprise a first connection conductive line connected to the first word line, wherein the first connection conductive line and the first word line comprise overlapping regions that vertically overlap each other, and wherein, in the overlapping regions, a lower surface of the first connection conductive line is in contact with an upper surface of the lower gate electrode, and an upper surface of the first connection conductive line is in contact with a lower surface of the upper gate electrode.

17. The semiconductor device of claim 4, further comprising:

a peripheral circuit structure comprising a peripheral circuit, wherein the peripheral circuit structure vertically overlaps the word lines and the plurality of active layers, wherein the first direction is perpendicular to an upper surface of the peripheral circuit structure, and wherein the second direction is parallel to the upper surface of the peripheral circuit structure.

18. A semiconductor device, comprising:

a peripheral circuit structure comprising a peripheral circuit;

a first stack structure and a second stack structure vertically overlapping the peripheral circuit structure and parallel to each other; and an insulating separation pattern between the first stack structure and the second stack structure, wherein each of the first and second stack structures comprises word lines, active layers, bit lines, and data storage structures, wherein, for each of the first stack structure and the second stack structure, the word lines are stacked and spaced apart from each other in a first direction perpendicular to an upper surface of the peripheral circuit structure, wherein, for each of the first stack structure and the second stack structure, the active layers are stacked and spaced apart from each other in the first direction, and comprise channel regions vertically overlapping the word lines, wherein, for each of the first stack structure and the second stack structure, each of the bit lines extends in the first direction and is connected to first sides of the active layers, wherein, for each of the first stack structure and the second stack structure, the data storage structures comprise first electrodes connected to second sides of the active layers, second electrodes spaced apart from the first electrodes, and a dielectric layer between the first electrodes and the second electrodes, wherein, for each of the first stack structure and the second stack structure, the second electrodes are stacked and spaced apart from each other in the first direction, and wherein, for each of the first stack structure and the second stack structure, the second electrodes of the first stack structure and the second electrodes of the second stack structure are in contact with the insulating separation pattern.

19. The semiconductor device of claim 18, wherein the dielectric layer comprises at least one of a ferroelectric material and an antiferroelectric material.

20. The semiconductor device of claim 18, further comprising:

gate wiring structures electrically connecting the word lines of the first stack structure to the word lines of the second stack structure; and electrode wiring structures electrically connecting the second electrodes of the first stack structure to the second electrodes of the second stack structure.

* * * * *